(12) United States Patent
Turner et al.

(10) Patent No.: US 8,035,322 B2
(45) Date of Patent: Oct. 11, 2011

(54) METHODS AND APPARATUSES FOR ESTIMATING TRANSIENT SLIP

(76) Inventors: Larry A. Turner, Chapel Hill, NC (US); Zhi Gao, Raleigh, NC (US); Roy S. Colby, Raleigh, NC (US)

( * ) Notice: Subject to any disclaimer, the term of this patent is extended or adjusted under 35 U.S.C. 154(b) by 424 days.

(21) Appl. No.: 12/268,771

(22) Filed: Nov. 11, 2008

(65) Prior Publication Data

US 2009/0284212 A1 Nov. 19, 2009

Related U.S. Application Data

(60) Provisional application No. 61/053,941, filed on May 16, 2008.

(51) Int. Cl.
*H02P 1/54* (2006.01)

(52) U.S. Cl. .......... 318/51; 318/254; 318/713; 318/727; 318/729

(58) Field of Classification Search .................. 318/254, 318/727, 729, 772, 799, 802, 51, 713; 324/765.01; 702/65

See application file for complete search history.

(56) References Cited

U.S. PATENT DOCUMENTS

| | | | |
|---|---|---|---|
| 4,114,077 A | 9/1978 | Oates et al. | |
| 4,441,065 A | 4/1984 | Bayer et al. | |
| 4,884,023 A | 11/1989 | Schmidt et al. | |
| 4,914,386 A | 4/1990 | Zocholl | |
| 5,232,285 A | 8/1993 | Mannik | |
| 5,257,863 A | 11/1993 | Chu et al. | |
| 5,436,784 A | 7/1995 | Schweitzer, III et al. | |
| 5,477,162 A | 12/1995 | Heikkilä | |
| 5,559,419 A | 9/1996 | Jansen et al. | |
| 5,565,752 A | 10/1996 | Jansen et al. | |
| 5,585,709 A | 12/1996 | Jansen et al. | |
| 5,689,169 A | 11/1997 | Kerkman et al. | |
| 5,729,113 A | 3/1998 | Jansen et al. | |
| 5,861,728 A | 1/1999 | Tazawa et al. | |
| 5,965,995 A | 10/1999 | Seibel et al. | |
| 6,042,265 A | 3/2000 | Kliman et al. | |
| 6,137,258 A * | 10/2000 | Jansen | 318/802 |
| 6,281,659 B1 | 8/2001 | Giuseppe | |
| 6,388,420 B1 | 5/2002 | Jansen et al. | |
| 6,452,360 B1 | 9/2002 | Colby | |
| 6,636,011 B2 * | 10/2003 | Sadasivam et al. | 318/727 |
| 6,636,012 B2 | 10/2003 | Royak et al. | |
| 6,774,664 B2 | 8/2004 | Godbersen | |
| 6,828,751 B2 * | 12/2004 | Sadasivam et al. | 318/729 |
| 6,862,538 B2 | 3/2005 | El-Ibiary | |
| 7,135,830 B2 | 11/2006 | El-Ibiary | |
| 7,184,902 B2 | 2/2007 | El-Ibiary | |
| 7,389,409 B2 | 6/2008 | Swanson et al. | |
| 7,570,074 B2 * | 8/2009 | Gao et al. | 324/765.01 |

(Continued)

OTHER PUBLICATIONS

C. Schauder, "Adaptive speed identification for vector control of induction motors without rotational transducers," *IEEE Trans. Ind. Appl.*, vol. 28, No. 5, pp. 1054-1061, Sep./Oct. 1992.

(Continued)

*Primary Examiner* — Paul Ip

(57) ABSTRACT

A method of determining a slip estimate associated with an induction motor through analysis of voltage and current signals. A fundamental frequency is calculated from a representation (e.g., complex representation) of the voltage signal, and a saliency frequency is calculated from a representation of the current signal. An estimation of slip quantity is calculated according to a slip estimation function that includes the saliency frequency, a saliency order, the fundamental frequency, a quantity of rotor slots, and a quantity of poles of the motor.

25 Claims, 22 Drawing Sheets

U.S. PATENT DOCUMENTS

| | | | | |
|---|---|---|---|---|
| 7,769,552 | B2* | 8/2010 | Colby et al. | 702/65 |
| 2003/0160583 | A1* | 8/2003 | Patel | 318/254 |
| 2004/0130287 | A1* | 7/2004 | Sadasivam et al. | 318/799 |
| 2006/0250154 | A1* | 11/2006 | Gao et al. | 324/772 |

OTHER PUBLICATIONS

A. Ferrah, K. J. Bradley, and G. M. Asher, "An FFT-based novel approach to noninvasive speed measurement in induction motor drives," *IEEE Trans. Instrum. Meas.*, vol. 41, No. 6, pp. 797-802, Dec. 1992.

P. L. Jansen and R. D. Lorenz, "Transducerless position and velocity estimation in induction and salient AC machines," *IEEE Trans. Ind. Appl.*, vol. 31, No. 2, pp. 240-247, Mar./Apr. 1995.

K. D. Hurst and T. G. Habetler, "Sensorless speed measurement using current harmonic spectral estimation in induction machine drives," *IEEE Trans. Power Electron.*, vol. 11, No. 1, pp. 66-73, Jan. 1996.

R. Blasco-Gimenez, G. M. Asher, M. Sumner, and K. J. Bradley, "Performance of FFT-rotor slot harmonic speed detector for sensorless induction motor drives," *IEE Proc. B, Electr. Power Appl.*, vol. 143, No. 3, pp. 258-268, May 1996.

R. Blasco-Gimenez, K. D. Hurst, and T. G. Habetler, "Comments on 'Sensorless speed measurement using current harmonic spectral estimation in induction machine drives' [and reply]," *IEEE Trans. Power Electron.*, vol. 12, No. 5, pp. 938-940, Sep. 1997.

K. D. Hurst and T. G. Habetler, "A comparison of spectrum estimation techniques for sensorless speed detection in induction machines," *IEEE Trans. Ind. Appl.*, vol. 33, No. 4, pp. 1-8, Jul./Aug. 1997.

K. D. Hurst, T. G. Habetler, G. Griva, F. Profumo, and P. L. Jansen, "A self-tuning closed-loop flux observer for sensorless torque control of standard induction machines," *IEEE Trans. Power Electron.*, vol. 12, No. 5, pp. 807-815, Sep. 1997.

J. Holtz, "Sensorless position control of induction motors—An emerging technology," *IEEE Trans. Ind. Electron.*, vol. 45, No. 6, pp. 840-851, Dec. 1998.

A. Bellini, G. Franceschini, E. Lorenzani, C. Tassoni, and F. Filippetti, "Sensorless speed detection in induction machines," in *Proc. Int. Conf. Electrical Machines (ICEM)*, Bruges, Belgium, Aug. 25-28, 2002.

A. M. Salamah, S. J. Finney, and B. W. Williams, "Three-phase phase-lock loop for distorted utilities," *IET Electr. Power Appl.*, vol. 1, No. 6, pp. 937-945, Nov. 2007.

Z. Gao, T. G. Habetler, R. G. Harley, and R. S. Colby, "A sensorless rotor temperature estimator for induction machines based on a current harmonic spectral estimation scheme," *IEEE Trans. Ind. Electron.*, vol. 55, No. 1, pp. 407-416, Jan. 2008.

M. Blodt, P. Granjon, B. Raison, and G. Rostaing, "Models for bearing damage detection in induction motors using stator current monitoring," *IEEE Trans. Ind. Electron.*, vol. 55, No. 4, pp. 1813-1822, Apr. 2008.

Guan-Chyun Hsieh and James C. Hung, "Phase-Locked Loop Techniques—A Survey", IEE Transactions on Industrial Electronics, vol. 43, No. 6, Dec. 1996.

A. V. Oppenheim, R. W. Schafer, and J. R. Buck, *Discrete-Time Signal Processing*, 2nd ed. Upper Saddle River, NJ: Prentice-Hall, 1999, pp. 482-485.

J. Stephan, M. Bodson, and J. Chiasson, "Real-time estimation of the parameters and fluxes of induction motors", *IEEE Trans. Ind. Appl.*, vol. 30, No. 3, May/Jun. 1994.

L. A. S. Ribeiro, C. R. Jacobina, A. M. N. Lima, and A. C. Oliveira, "Parameter sensitivity of MRAC models employed in IFO-controlled AC motor drive," *IEEE Trans. Ind. Electron.*, vol. 44, No. 4, pp. 536-545, Aug. 1997.

M. Cirrincione, M. Pucci, G. Cirrincione, and G.-A. Capolino, "A new experimental application of least-squares techniques for the estimation of the induction motor parameters," *IEEE Trans. Ind. Appl.*, vol. 39, No. 5, pp. 1247-1256, Sep./Oct. 2003.

*IEEE Standard Test Procedure for Polyphase Induction Motors and Generators*, IEEE Standard 112-2004, Nov. 2004.

\* cited by examiner

METHODS AND APPARATUSES FOR ESTIMATING TRANSIENT SLIP

CROSS-REFERENCE TO RELATED APPLICATION

This application claims the benefit of U.S. Provisional Application Ser. No. 61/053,941, filed May 16, 2008, entitled "Methods and Apparatuses for Estimating Transient Slip, Rotor Slots, Motor Parameters, and Induction Motor Temperature."

FIELD OF THE INVENTION

The present invention relates generally to the estimation of transient slip of a motor and, in particular, to methods for passive temporal estimation of the transient slip of a motor.

BACKGROUND

Robust accurate transient slip estimation is fundamental to achieving a significant measure of success in several types of motor analysis. Established techniques often explicitly or implicitly assume stationary or quasi-stationary motor operation. Practically, motor and load environments are dynamic, and dependent on myriad variables including internal and external temperature, and varying load dynamics, fundamental frequency and voltage. The cumulative effects of such variations can have significant detrimental effect on many types of motor analysis.

Model Referencing Adaptive System (MRAS) is a method of iteratively adapting an electrical model of a three-phase induction motor with significant performance advantages over competitive approaches assuming quasi-stationary motor operation, as the assumption of stationary operation is often violated, with detrimental effect on model accuracy. MRAS is highly dependent upon availability of robust transient slip estimation. Applications benefiting from accurate transient slip estimation include, but are not limited to, synthesis of high quality electrical and thermal motor models, precision electrical speed estimation, dynamic efficiency and output power estimation, and inverter-fed induction machines employing vector control.

Slip estimation can be performed by passive analysis of the voltage and current signals of a three-phase induction motor, and commonly available motor-specific parameters. In a stationary environment, slip estimation accuracy is optimized by increasing the resolution of the frequency, or degree of certainty of the frequency estimate. As motor operation is typically not stationary, robust slip estimation also depends upon retention of sufficient temporal resolution, such that the unbiased transient nature of the signal is observed.

Frequency estimation is commonly performed by Fourier analysis. Fourier analysis is frame-based, operating on a contiguous temporal signal sequence defined over a fixed period of observation. Frequency resolution, defined as the inverse of the period of observation, can be improved by extending the period of observation, and moderate improvement in effective frequency resolution can be realized through local frequency interpolation and other techniques that are generally dependent on a priori knowledge of the nature of the observed signal.

In Fourier analysis, it is implicit that source signals are stationary over the period of observation, or practically, that they are stationary over contiguous temporal sequences that commonly exceed the period of observation in some statistical sense. Fourier analysis can be inappropriate for application in environments where a signal of interest violates the stationary condition implicit in the definition of a specific period of observation, resulting in an aggregate frequency response and loss of transient information defined to be important to analysis.

Fourier analysis presents a temporal range versus frequency resolution dilemma. At periods of observation to resolve a saliency harmonic frequency with sufficient accuracy, the stationary condition is violated and important transient information is not observable.

An effective saliency harmonic frequency resolution of less than 0.1 Hz can be defined to be minimally sufficient, resulting in a requisite period of observation of 10 seconds, which can be reduced to no less than 1.0 second through application of local frequency interpolation. However, saliency harmonic frequency variations exceeding 10.0 Hz are not uncommon. The relative transient nature of such signals violates the stationary condition requirement implicit in the definition of the minimum period of observation. Fourier analysis is not suitable for employment in robust accurate slip estimation, in applications where preservation of significant transient temporal response is important.

Thus, there is a need for a method of transient slip estimation based on passive temporal analysis, which results in robust accurate slip estimation with superior temporal resolution relative to competitive methods.

BRIEF SUMMARY

A method for estimating the transient slip of a motor based on passive temporal analysis is described. The method results in a robust and accurate slip estimation with superior transient response relative to competitive methods, as important information defining the dynamic nature of the motor system is preserved, while retaining the accuracy to support advanced motor modeling and analysis applications.

Motor voltage and current signals are acquired in the form of sampled three-phase sequences, with one phase or dimension per source line. The sampled sequences are converted to complex representations through application of simple linear transformations. The complex conversion can be equivalent, reversible, lossless, mathematically convenient, and/or practically advantageous, relative to three-phase representations, in terms of subsequent definitions.

A single phase current signal has conventionally served as the basis for motor analysis, including slip estimation. Each phase in a motor voltage or current signal is unique and contains information not necessarily observable in analysis of any other specific single phase. Analysis of three-phase signals, or equivalent complex representations, is advantageous in this context. Complex conversion of a single phase signal is possible, though complex conjugate symmetry is implicit. Complex conjugate symmetry is not observable in an analysis of the complex motor voltage and current signals. Single phase analysis represents a loss of information due to the assumption of conjugate symmetry. A loss of such information is unrecoverable and can be significant.

According to some aspects, the transient slip estimation method performs all processing on complex signals extracted from acquired three-phase voltage and current signals. The complex analysis of the described method allows dominant saliency (speed-related) harmonic identification to consider positive and negative sequence saliency harmonics independently, resulting in the identification of the highest quality observable saliency harmonic, improving subsequent saliency frequency estimation accuracy.

The complex voltage and current signals can be decomposed into fundamental and residual components in a process of signal extraction. Complex adaptive filters such as, for example, Complex Single Frequency (CSF) filters, can be applied to extract complex exponential signal components proximate to the rated fundamental frequency, accurately matching magnitude and phase. The complex analysis is preferably utilized in static and adaptive filters employed in transient slip estimation algorithms because performance is degraded when processing complex signals in real systems due to loss of information resulting from projection onto a real axis, effectively reducing the dimension of the signals.

The complex fundamental voltage and current signals are combined to synthesize an instantaneous input power estimate, which enables robust saliency frequency and approximate slip estimation. The approximate slip is derived from a rated slip and a normalized input power, which is significantly more linear and accurate than normalized current-based methods.

The fundamental frequency is dynamic, due to variations in the supply voltage and load. Though a nominal rated fundamental frequency is available, an accurate instantaneous fundamental frequency estimate can be extracted, and can significantly improve the accuracy of transient slip estimation. The complex voltage is selected as a preferred source for analysis, as it has a relatively high signal to noise ratio, in terms of the complex fundamental and residual voltage components. Any suitable means for estimating the fundamental frequency can be employed. According to some aspects, the fundamental frequency is extracted through application of a Phase Locked Loop (PLL). Although the fundamental frequency is a transient signal, it generally varies slowly relative to the PLL bandwidth.

Thermal modeling can be employed to estimate the rotor temperature as a function of the rotor resistance, which is highly dependent upon the slip estimation. The rotor temperature estimates based on slip estimates extracted with the assumption of static fundamental frequency were found to have several degrees of error, which was directly and entirely correlated with the failure to account for dynamic fundamental frequency.

Saliency harmonics present in the complex residual current can be identified and evaluated to define the highest quality observable, or dominant, saliency harmonic. The saliency harmonic magnitude and relative proximate noise levels vary with motor geometry and load conditions. The bandwidth constraints imposed by limiting the sampling frequency to a minimally sufficient practical rate reduce the range of observable saliency harmonics. Of the set of observable saliency harmonics, the frequency and range corresponding to a dominant saliency harmonic is desirably estimated.

The dominant saliency harmonic is identified through application of a temporal analysis method, iterating over a limited subset of frequency bands of interest. The process consists of demodulating each potential saliency harmonic to extract a saliency frequency. The magnitude of each remaining identified saliency harmonic is compared to select the dominant saliency harmonic. Identification of the dominant saliency harmonic results in retention of a dominant saliency frequency and a dominant saliency order, and design and retention of saliency filter coefficients.

The saliency frequency is defined as the instantaneous frequency estimate of the highest quality observable saliency harmonic during motor operation in dynamic conditions. The saliency frequency is estimated from the saliency harmonic, and dependent upon the corresponding saliency order. Demodulation applies a Voltage Controlled Oscillator (VCO) to mix the dominant saliency frequency in the complex residual current to complex baseband, or zero frequency. A Finite Impulse Response (FIR) or an Infinite Impulse Response (IIR) filter is applied to band limit the mixed current, producing a complex baseband current. To complete the demodulation process, a residual frequency contained in the complex baseband current is extracted, resulting in an accurate saliency frequency estimate. Alternative methods of iterative frequency estimation described include Direct, Phase Discriminator (PD), and PLL analysis.

Demodulation initially removes the dominant saliency frequency, which is defined as the saliency frequency expected during motor operation in rated conditions, from the complex residual current, resulting in a complex baseband current. Demodulation is completed by estimating the residual frequency in the complex baseband current, resulting in an accurate estimate of the saliency frequency. The saliency frequency is defined as the sum of the dominant saliency frequency and the residual saliency frequency. Dynamic fundamental frequency and load conditions are reconciled entirely in the process of iterative frequency estimation.

The transient frequency estimation of a complex baseband current signal is analogous to FM demodulation. Definition of minimum frequency tracking rate and bandwidth, available resources including computational complexity and bandwidth, and precision called for by the application, can be employed to select an appropriate method of frequency estimation among myriad possibilities.

The Direct, PD, and PLL methods of estimating the saliency harmonic frequency are described. These diverse methods provide the flexibility to generally increase precision at the expense of computational complexity and frequency tracking rate, increasing the practical applicability of the transient slip estimation method.

Saliency harmonic and fundamental frequency estimation paths should be examined to reconcile differences in latency resulting from asymmetric processing paths. Latencies are principally contributed by filter operations, and can readily be estimated, though delays associated with adaptive elements are dependent upon adaptive parameters and call for additional analysis or experimental quantification.

The complex baseband processing is advantageous in several contexts, including simplicity of design, computational complexity, component reuse, and performance. The selection of the dominant saliency frequency to represent the center frequency in an isolated complex baseband current signal calibrates frequency estimation to the nominal rated conditions. Specific design of the saliency low-pass filter to support the bandwidth of the saliency harmonic in operating conditions corresponding to a specific range of interest, or expected use, results in optimal interference rejection from proximate signals which would otherwise introduce aggregate estimation error.

Slip estimation can be directly expressed though a reorganization of the saliency frequency equation, based on availability of accurate saliency frequency and fundamental frequency estimation. Thus, the slip is specified as a function of saliency frequency, fundamental frequency, and motor geometry.

Rotor slots are a static measure of motor geometry which is generally not known, but can be defined by manufacturer data, direct examination, or analysis of electrical signals and motor parameters. Electrical analysis provides the most practical solution for rotor slots estimation, as manufacturer data is not readily available for all motors, and direct observation is intrusive and time-consuming.

Methods are described for automatically estimating the rotor slots via electrical analysis. A practical range of rotor slots can be defined and slip can be iteratively estimated over this range.

Relative to a slip estimation based on the saliency harmonic analysis previously described, the approximate slip is less precise, though it is sufficiently accurate to provide a reference, independent of motor geometry. Approximate slip can be defined as a function of normalized power, and temperature compensated to improve accuracy.

A rotor slots performance surface defines the slip estimation error between approximate slip, and each instance of slip estimation, as a function of rotor slots. The rotor slots performance surface defines the relative proximity of accurate slip estimation, based on the assumption of a specific rotor slots solution, and independent approximate slip. The rotor slots performance surface is nonlinear, and a concise differentiable representation is unavailable, so the surface is revealed through an iterative process of assuming a specific rotor slots solution, extracting the dominant saliency harmonic and slip estimation based on this assumption, and quantifying the resulting slip estimation error.

The rotor slots performance surface has an abscissa of a contiguous sequence of integer rotor slots indices, and an ordinate specified by the L1 slip estimation error, or mean absolute difference between approximate slip and slip estimates. Rotor slots are estimated by determining the global minimum of the rotor slots performance surface, evaluated over a practical rotor slots index range. It is possible to reduce the range of rotor slots evaluated, if the identification of a local minimum is persistent over a sufficient rotor slots range to be considered a probable global minimum.

The rotor slots performance surfaces can vary based on the load and thermal conditions associated with the complex residual current, the fundamental frequency and the approximate slip sequences used to produce them. To ensure robust rotor slots estimation, several rotor slots estimates are produced from independent rotor slots performance surfaces formed under diverse load and thermal conditions.

A consensus rotor slots estimate can be extracted when the rotor slots set is sufficiently populated. If a consensus rotor slots estimate is not available, additional independent rotor slots estimates can be added to the set until a consensus is available.

The rotor slots are independently estimated from the complex residual current, the fundamental frequency and the approximate slip sequences corresponding to some diversity of load or thermal conditions before identifying rotor slots with sufficient confidence to decline further analysis. In the event that a consensus rotor slot estimate is not identified, an optional probabilistic method is described to select rotor slots from a conflicting rotor slots set, based upon relative conditional probability.

The probabilistic method extracts a specific conditional Probability Density Function (PDF) from a three-dimensional matrix of stored PDFs indexed by poles and normalized rated input power. The PDF, a discrete function of probability as a function of rotor slots index, is queried for members of the rotor slots set. The rotor slots estimate is equal to the rotor slots set member with the highest probability. The PDF matrix is synthesized offline from a motor database.

A method of rotor slots estimation based on frequency estimation of the eccentricity harmonic, proximate to the fundamental frequency, was proposed by Hurst, and others. The eccentricity method has several disadvantages, relative to saliency harmonic analysis, and the temporal methods and architectures proposed.

Eccentricity harmonics are observable in motor current signals near the fundamental frequency, at some frequency offset related to pole quantity. Line-related harmonics and load-related harmonics dominate the lower frequency range, resulting in significant sources of interference. Saliency harmonics are observable at higher frequencies, with less interference and generally higher signal quality. Saliency frequency estimation is enhanced by dynamic selection of the dominant, or highest quality, saliency harmonic observable, and selection of optimal band-limiting filters based on motor geometry, and temporal analysis method and architectures.

Practical motor environments commonly demonstrate quasi-stationary operation on the order of 20 milliseconds. Fourier methods of frequency estimation call for relatively long periods of observation to provide the frequency resolution to support rotor slots estimation, typically 30 to 100 seconds. The implicit assumption that motor operation is stationary over the period of observation is often violated, resulting in inaccurate aggregate frequency estimation. Temporal analysis methods extract accurate frequency estimation with superior transient response, and are well-suited for application in motor harmonic analysis.

The temporal saliency frequency estimation methods and architectures described are capable of having sufficient bandwidth to operate continuously in diverse practical motor environments, and providing accurate iterative instantaneous frequency estimates to support robust rotor slots and slip estimation.

The concept of specifying a rotor slots performance surface, derived from independent slip estimates, as a function of rotor slots, and defining the rotor slots solution at the global minimum of the surface is useful.

The means of providing both the approximate slip and transient slip estimates, and the accuracy of these estimates relative to competitive technologies improves the accuracy and utility of the rotor slots performance surface, and rotor slots estimation.

The method of defining a consensus rotor slots solution from a set of independent estimates, extracted by passive observation of diverse load and thermal conditions, supports robust rotor slots estimation.

The probabilistic method defines a rotor slots solution in the event that a consensus estimate is unavailable ensures increases utility and facilitates broader application of the rotor slots estimation algorithm.

According to alternative aspects, the slip estimation can be estimated by alternative means including, for example, Fourier analysis or application of a multi-rate method such as the zoom FFT. These alternative methods are inferior to the transient slip estimation method previously described, as they lack the temporal resolution to support dependent applications including Model Referencing Adaptive System (MRAS), or transient power factor estimation, they could be used to synthesize a rotor slots performance surface. The resulting surface would have less accuracy, due to the impractical dependence on stationary condition implicit in Fourier analysis, though in many specific motor environments, application of alternative slip estimation techniques can be sufficient to extract a rotor slots estimate.

The definition of alternative slip estimations for use in rotor slots performance surface synthesis should be carefully considered, as should the application of temporal methods and architectures to produce the high quality slip estimates similar to those described herein.

The described methods of transient slip and rotor slot estimation can involve an application of instantaneous frequency estimation based on novel Phase Discriminator (PD) and Phase Locked Loop (PLL) architectures and means of adaptation. For example, the transient slip methods involve estimations of instantaneous fundamental frequency and saliency harmonic frequencies. Additional applications benefiting from the employment of the complex PLL or PD are extensive and diverse, including control and communications topics such as motion control and FM demodulation.

The Phase Discriminator (PD) is an adaptive filter which estimates the instantaneous frequency of a primary signal through a process of source normalization to unity magnitude, evaluation of the difference between present and unity delayed and scaled normalized samples, and adaptation of the complex coefficient which forms the basis of the scale factor to minimize the difference, or error.

Normalization preserves phase, while diminishes the effect of magnitude variation in the primary signal. An optimum complex coefficient value can be found to minimize the resulting error signal, in a least squares sense, by encoding the phase difference between sequential normalized samples in the complex coefficient phase. Normalized magnitudes are unity, and the complex coefficient simply defines the phase shift to reconcile change in the sequence. The instantaneous frequency of the source can be directly estimated by examining the phase of the complex coefficient.

The error is minimized when the phase of the complex coefficient approximates the change in phase between adjacent samples in the primary signal. This change in phase is, by definition, equal to instantaneous frequency. As the primary signal frequency changes, the phase of the complex coefficient adapts to minimize estimation error. As the frequency generally changes slowly with respect to the bandwidth of the PD, estimation error can be minimized.

The Phase Locked Loop (PLL) is a closed loop adaptive filter optimally suited to accurately estimate frequency in a dynamic environment with significant in-band interference. The complex PLL supports the dynamic identification and instantaneous frequency estimation of a complex exponential component of a complex signal, in a flexible and computationally efficient form. The complex PLL architecture and means of adaptation have broad applicability in many application domains.

PLL architecture is defined to consist of a VCO, a mixer, an optional IIR filter, a PD, and a means of frequency adaptation. The PLL elements are combined to synthesize a phase-contiguous complex exponential at an adaptive instantaneous frequency, such that the mixed signal product of the synthesized signal and complex residual current is at complex baseband, an IIR filter band limits the resulting complex baseband signal, and a PD estimates the residual frequency, or frequency of the complex baseband signal. Complex baseband is a convenient representation of a complex signal whose carrier frequency, or significant complex exponential component of interest, is mixed to nominal zero frequency, as a matter of convenience.

The VCO frequency is iteratively adapted to improve on the estimate of the instantaneous frequency to force the complex exponential component of interest in the complex baseband signal to move to and remain at complex baseband, an operation analogous to demodulation of an FM signal. PD estimates the residual frequency, due to frequency estimation error or frequency drift, of the signal at complex baseband. PD residual frequency is employed as an error metric, to modify the VCO frequency.

The convergence of a Least Mean Squared (LMS) means of adaptation is proportional to the rate of adaptation, and inversely proportional to misadjustment, or noise introduced by the adaptive process. Through judicious selection of adaptive parameters, convergence time can be reduced and bandwidth increased, at the expense of increased estimation noise. To ensure stability and minimize misadjustment, instantaneous frequency estimation should change slowly, relative to magnitude and phase adaptation in the PD.

PLL filter bandwidth can be defined according to the nature of the complex baseband current environment. Bandwidth can be increased, in return for significant reduction in latency and improved frequency tracking rate, at the cost of increased aggregate frequency estimation error. Unity bandwidth selection, which can be appropriate in environments with limited in-band interference, effectively excises the IIR filter, eliminating latency contributions by the filter and maximizing frequency tracking rate Model Referencing Adaptive System (MRAS) is a method of iteratively adapting an electrical model of a three-phase induction motor with significant performance advantages over competitive approaches assuming quasi-stationary motor operation, as the assumption of stationary operation is often violated, with detrimental effect on model accuracy. MRAS is highly dependent upon availability of robust transient slip estimation, which is most effective when employing PD and PLL frequency estimation methods.

Applications benefiting from accurate transient slip estimation include, but are not limited to, synthesis of high quality electrical and thermal motor models, precision electrical speed estimation, dynamic efficiency and output power estimation, and inverter-fed induction machines employing vector control.

Applications benefiting from employment of the complex PLL or PD are extensive and diverse, including accurate transient frequency estimation, and control and communications topics, including motion control and FM demodulation.

BRIEF DESCRIPTION OF THE DRAWINGS

The foregoing and other advantages of the invention will become apparent upon reading the following detailed description and upon reference to the drawings.

Figure 1:
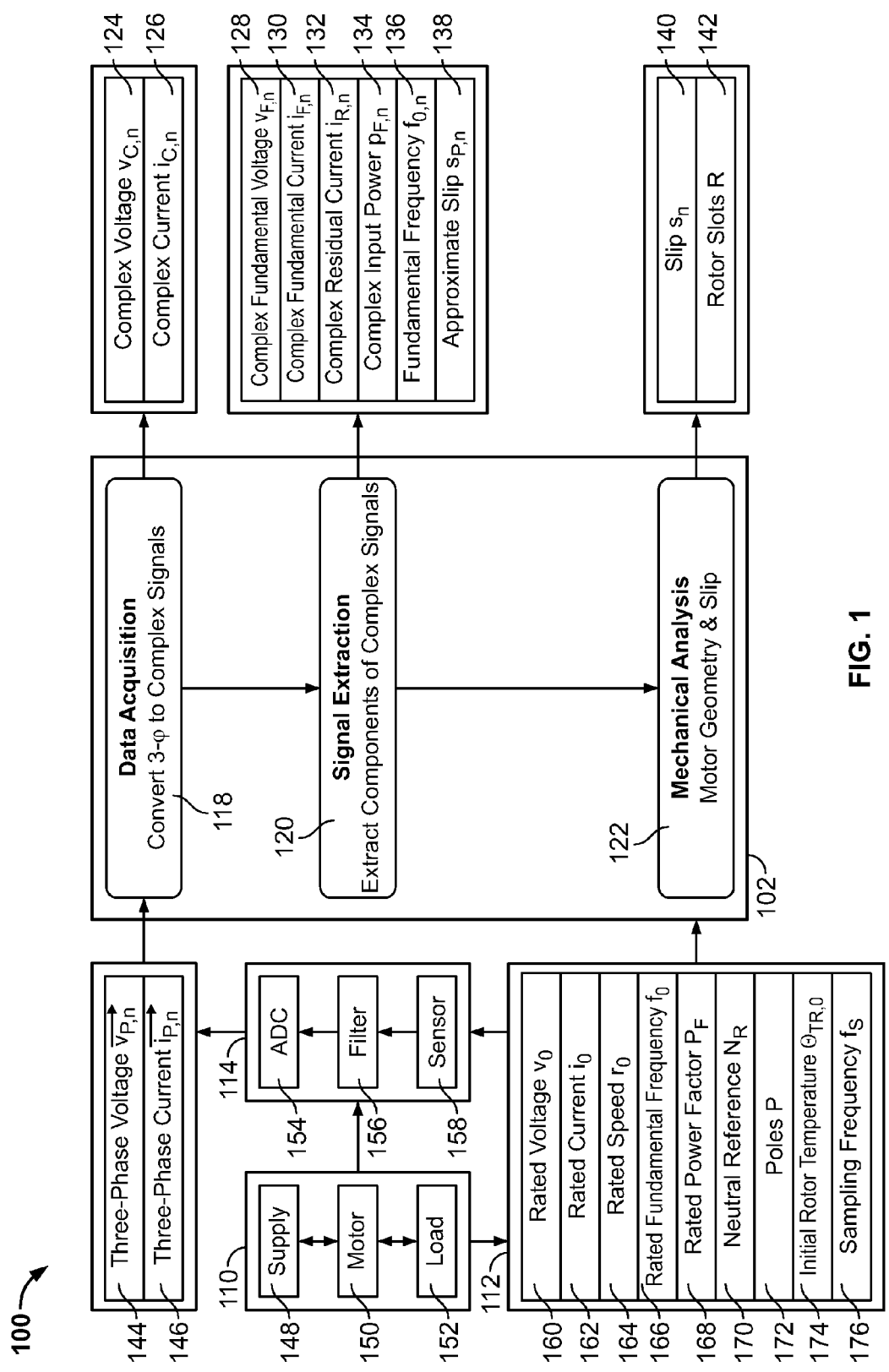
FIG. 1 is a data flow diagram for estimating the transient slip of a motor.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

A method of estimating the transient slip of a motor based on application of communication and adaptive systems theory and novel architectures to identify and iteratively estimate saliency harmonic frequency in dynamic motor environments is described. The performance of the transient slip estimation methods disclosed are superior to that of competitive slip estimation methods, as important information defining the dynamic nature of a motor system is preserved, while retaining the accuracy desired to support advanced motor modeling and analysis applications.

The fundamental design problem overcome was to identify and accurately, and iteratively, estimate the instantaneous frequency of a high quality saliency harmonic, with sufficient bandwidth to preserve the important temporal response of the motor system. A saliency harmonic is defined as a speed-related harmonic signal as opposed to line-related or load-related harmonic signal. Similarly, a saliency frequency is defined as a speed-related frequency.

Saliency harmonics are not stationary, though at a single observable instance multiple saliency harmonics can be found through analysis of stator current at a common offset, or modulation, relative to proximate odd fundamental frequency harmonics. This common instantaneous saliency harmonic modulation can be exploited to discriminate and identify saliency harmonics with respect to line and load-related harmonics. Dynamically, saliency harmonic modulation increases approximately linearly with input power, and slip. Secondary effects on saliency modulation include temperature, as in the absence of thermodynamic equilibrium, slip increases with temperature.

The saliency harmonic equation relates various motor characteristics or quantities such as slip, fundamental frequency, saliency harmonic frequency, odd-phase harmonic order, rotor slot quantity and pole quantity, in a linear relationship. The slip can be approximated by applying knowledge of the normalized power, the rated power factor and the rated speed, and additional motor parameters directly extracted from the motor name plate, or through analysis derived from commonly available information, supporting prediction of a set of possible saliency harmonic frequencies. Motor geometry and design considerations generally conspire to define one saliency harmonic with higher quality, or signal to noise ratio, and to render other potential saliency harmonics to be either lower quality or unobservable. A priori knowledge may not be exploited to predefine the most useful saliency harmonic frequency range for a specific motor. It is determined experimentally.

Saliency harmonics observable in complex residual stator current can be viewed as a set of Frequency Modulated (FM) signals about carrier frequencies which can be nominally defined as a function of motor geometry and rated operation conditions. Carrier drift due to dynamic fundamental frequency and temperature, significant in-band interference due to line and load-related harmonics, motor-specific dependence of the modulation index, or rate of frequency shift as a function of load, and selection of the optimum carrier frequency are potential problems specific to motor analysis which are resolved by the transient slip estimation methods described below.

A useful representation of the interactions in a complex system involves decomposing the system into collections defined by logical partitions, and describing the data elements produced and consumed by various entities across partition boundaries.

Data flow diagrams share a common graphical vocabulary. Collections are delimited by encapsulating rectangles, containing actors consisting of external observable entities, processes or internal observable entities defined by rounded rectangles, or dynamic or constant data elements. All components are labeled, and data elements are enumerated with unique symbols used consistently in subsequent descriptions. Data flow is explicitly defined by arrows, indicating the production source, actors, processes, or collections thereof, and the data element or collection available for subsequent consumption.

Control flow specification is desired to define conditional or state-dependent process sequences, if decision-based definitions are required. Absent explicit control flow specification, it is implicit that control flow is based on data dependencies. Valid implementations can represent myriad disparate architectures, which are functionally equivalent.

1.0 Overview of the Transient Slip Estimation Data Flow

Referring to FIG. 1, a transient slip estimation data flow 100, according to some aspects of the implementations, consists of an Environment collection 110, an Analog collection 114 and a Digital collection 102.

The Environment collection 110 consists of a Supply component 148, a Motor component 150 and a Load component 152. These components are external actors, in the context of transient slip estimation, and are accessible strictly in the sense of passive observation.

The Analog collection 114 consists of a Filter component 156, an Analog to Digital Conversion (ADC) component 154, and a Sensor component 158. These components are precisely internal, though the requirement to control the Analog components is limited, based on information that is generally statically defined, and independent of the Environment collection 110. It is convenient to consider the components of the Analog collection to consist of external actors.

The Digital collection 102 consists of a set of internal components defined at the highest level of abstraction, with functional decomposition, as a Data Acquisition process 118, a Signal Extraction process 120, and a Mechanical Analysis process 122. The term process is not strictly intended to define a reference design, but rather to describe a convenient partition of the dynamic consumption and production of related data elements.

The Data Acquisition process 118 converts a three-phase voltage signal 144 and a three-phase current signal 146 produced by the Analog collection 114 into a complex voltage representation 124 and a complex current representation 126. The Data Acquisition process 118 will be described in further detail with respect to FIG. 2.

The Signal Extraction process 120 filters the complex voltage 124 and the complex current 126 signals and extracts a data collection including frequency-dependent components such as, a complex input power 134, a fundamental frequency 136, and an approximate slip 138. The Signal Extraction process 120 will be described in further detail with respect to FIGS. 3-7.

The Mechanical Analysis process 122 defines a rotor slots quantity 142 of the motor 150, and extracts robust, accurate, transient estimates of slip 140. The Mechanical Analysis will be described in further detail with respect to FIGS. 8-20.

The transient slip estimation data flow 100 is a function of the three-phase voltage 144 and the three-phase current 146, and a set of system scalar data 112, generally consisting of motor-specific parameters available from the motor name plate, with the exceptions of a neutral reference 170, an initial rotor temperature 174, and a sampling frequency 176.

2.0 The Environment Collection

The Environment collection 110 consists of the Supply 148, the Motor 150 and the Load 152 components. Direct interaction with the Analog collection 114 is represented as an unspecified data flow, consisting of the raw three-phase voltage 144 and three-phase current 146 signals, prior to quantization. The Environment is concisely described through a relevant collection of static constant data elements 112 with external visibility.

The Supply 148 produces the voltage source consumed by the Motor 150. The voltage source includes AC three-phase mains sources rated at, for example, 208-230, 380, or 460 Volts. The rated fundamental frequency 166 of the Motor 150 is, for example, 60 or 50 Hz. The actual fundamental frequency 136 is not strictly stationary, and normal fluctuation due to changes in the Supply 148 or the Load 152 is acceptable.

The Motor 150 represents a three-phase induction motor compatible with defined Supply 148 requirements, with a rated output power in the range of up to 500 HP, or approximately 375 kW.

The Load 152 represents the apparatus driven by the Motor 150. Non-limiting examples of diverse Load classes include conveyors, crushers, cutters, compressors, desiccants, generators, pumps, rotational drives, and the like.

The Supply 148, the Motor 150 and the Load 152 determine the transient and harmonic characteristics of the motor current and power.

The Constants collection 112 includes the information for successful operation of the transient slip estimation system 100. The Constant data 112 is available at the epoch of system operation, and is extracted directly or indirectly from information provided by the motor manufacturer on the name plate of a specific motor 150, or otherwise readily obtained.

As used herein, rated operation refers to a state of motor operation explicitly defined by a specified rated voltage 160, rated current 162, and rated fundamental frequency 166. The stator current, the rotor speed, and the motor power factor are implicitly affected by ambient rotor temperature, and the rated values for these parameters assume stationary operation at a temperature which may not be explicitly specified by the motor manufacturer. Analysis of experimental data, motivated by the need to define temperature compensation to calibrate certain motor parameters, supports the assertion that rated temperature operation is approximately 55° C. above the ambient temperature.

The Rated Voltage 160, $v_0$, is the root mean square ("RMS") Supply voltage necessary for motor operation in rated conditions, in units of Volts.

The Rated Current 162, $i_0$, is the RMS stator current resulting from motor operation in rated conditions, in units of Amps.

The Rated Speed 164, $r_0$, is the rotor speed resulting from motor operation in rated conditions, in units of revolutions per minute ("RPM").

The Rated Fundamental Frequency 166, $f_0$, is the Supply frequency necessary for motor operation in rated conditions, in units of Hz.

The Rated Power Factor 168, $P_F$, is the power factor for motor operation in rated conditions, in (Equation 1). Some motor name plate definitions may not explicitly define the rated power factor 168, though an estimate can be extracted from available information, including efficiency, $P_E$, rated power, $P_H$, in units of horsepower, the rated voltage 160 and the rated current 162.

$$P_F = P_E^{-1} \cdot \left( \frac{P_H \cdot 746}{v_0 \cdot i_0} \right) \quad \text{(Equation 1)}$$

The Neutral Reference 170, $N_R$, describes a configuration of voltage sensors used in the application, in the form of a Boolean variable. The voltage sensor topologies can be either line-neutral or line-line reference, resulting in a neutral reference state of true or false, respectively.

The Poles Quantity (Poles) 172, P, for a specific motor 150 are generally not specified on the motor name plate, but can be trivially inferred as a function of the rated speed 164 and the rated fundamental frequency 166, in (Equation 2).

$$P = \text{FLOOR} \left( \frac{f_0 \cdot 120}{r_0} \right) \quad \text{(Equation 2)}$$

The Initial Rotor Temperature 174, $\Theta_{TR,0}$, is the ambient temperature of a motor 150 that is in thermal equilibrium with its surroundings, prior to operation. The initial rotor temperature 174 is used to calibrate the offset of rotor and stator temperature estimation, as estimated changes in rotor resistance correspond to relative, not absolute, changes in temperature. To determine absolute rotor temperature, the epoch of operation, or first start, should occur under known ambient thermal conditions.

A Sampling Frequency 176, $f_S$, is the rate at which the analog voltage signal and the analog current signal are converted to discrete sampled representations 144 and 146, in units of Hz.

The rated fundamental frequency 166 and the sampling frequency 176 defined in the Environment collection 110 are specified in units of Hz, a measure of absolute frequency. Unless otherwise explicitly stated, all other frequency definitions are specified in terms of normalized frequency. The normalized frequency, f, is a convenient unitless representation equal to the ratio of absolute frequency, $f_A$, and the Nyquist frequency, $f_N$, or ½ the sampling frequency 176, in (Equation 3). Normalized frequency has a range in [−1, 1).

$$f = \frac{f_A}{F_N} = \frac{2 \cdot f_A}{f_S} \quad \text{(Equation 3)}$$

3.0 The Analog Collection

As previously discussed, the Analog collection 114 consists of the Sensor 158, the Filter 156 and the ADC 154 components. The Analog collection 114 filters the analog three-phase voltage signal and the analog three-phase current signal, ensuring that they meet physical interface, interference, noise, bandwidth, dynamic range and group delay requirements established by the Digital collection 102.

The Sensor 158 represents the analog voltage and analog current sensors. The sensor reference, gain, frequency response and group delay may not be entirely neglected, and can be included in any analysis. Further, the sensors 158 and the filters 156 can call for experimental characterization when information is not available from the manufacturer.

The Filter 156 represents the analog signal paths including the voltage sensors and the current sensors, and anti-aliasing and gain stage filters, which combine to meet ADC physical interface requirements, and preserve dynamic range, bandwidth, and linearity of analog signals prior to quantization.

Aliasing occurs when analog signal content above the Nyquist frequency is mapped to observable spectral content after quantization. The aliased signal content is only significant if it is observable, or of sufficient amplitude to effect a change in the discrete signal. Aliasing may not be completely avoided, though it can be effectively eliminated by application of anti-aliasing filters. The anti-aliasing filters reduce aliased spectral content to unobservable levels after sampling. The anti-aliasing filters preferably demonstrate relatively constant magnitude response, and linear phase, or constant group delay, over the pass band of operation.

The analog signal bandwidth, $f_{B,A}$, is greater than or equal to 31 times the rated fundamental frequency, in (Equation 4).

$$f_N \gg f_{B,A} > 31 \cdot f_0 \quad \text{(Equation 4)}$$

The Filter 156 design constraints can be electively relaxed, in consideration of available a priori knowledge. The supply voltage and stator current are inherently low bandwidth signals. Harmonic attenuation increases with frequency, due to motor geometry and design, and can provide at least 30 dB of attenuation at or above the Nyquist frequency.

The Filter 156 includes a gain stage to ensure preservation of a dynamic range of the analog signals, and to meet input signal interface requirements specified by the ADC 154. Transient periods of significant inrush occur immediately after the epoch of induction motor operation, and sustained operation above rated conditions is not uncommon.

A portion of the dynamic range of the system is reserved to accommodate observation of at least 1.5 times the rated voltage 160 and the rated current 162 signal magnitudes, and discrimination of inrush conditions. The voltage and current signal gains are preferably independently specified to a level where approximately ½ of the ADC input voltage range is consumed during motor operation in rated conditions.

The Filter 156 architecture and order are not explicitly defined, and any suitable alternative designs which meet the Analog collection 114 requirements are contemplated.

The ADC 154 converts the filtered analog voltage and current signals into quantized representations. Synchronous sampling can be assumed for convenience if the inter-channel latency is negligible. Any significant latency or asymmetric path delays are preferably reconciled in the Signal Extraction process 120, described in detail with respect to FIG. 3.

Sampling frequency 176 is defined in terms of filter bandwidth, in (Equation 5). For example, a sampling frequency 176 of approximately 5 kHz can be typical, in association with practical commercial filter designs.

$$f_S = 2 \cdot f_N \gg 2 \cdot f_{B,A} \quad \text{(Equation 5)}$$

A dynamic range, $D_R$, describes the magnitude of a minimally observable quantized signal, relative to the specific ADC input voltage range, in units of effective bits or decibels, in (Equation 6).

The effective dynamic range of the Analog collection 114 is greater than or equal to 72 dB, or approximately 12 bits. An Automatic Gain Control (AGC) can be desirable in some systems to preserve sufficient effective dynamic range.

$$D_R \geq 72 \text{dB} \quad \text{(Equation 6)}$$

The ADC 154 produces the three-phase voltage 144, $\vec{v}_{P,n}$, and the three-phase current 146, $\vec{i}_{P,n}$.

4.0.0 The Digital Collection

The Digital collection 102 contains the data and process collections and interactions to estimate slip 140 from the discrete three-phase voltage 144 and the current 146 signals.

4.1.0 The Data Acquisition Process

Figure 2:
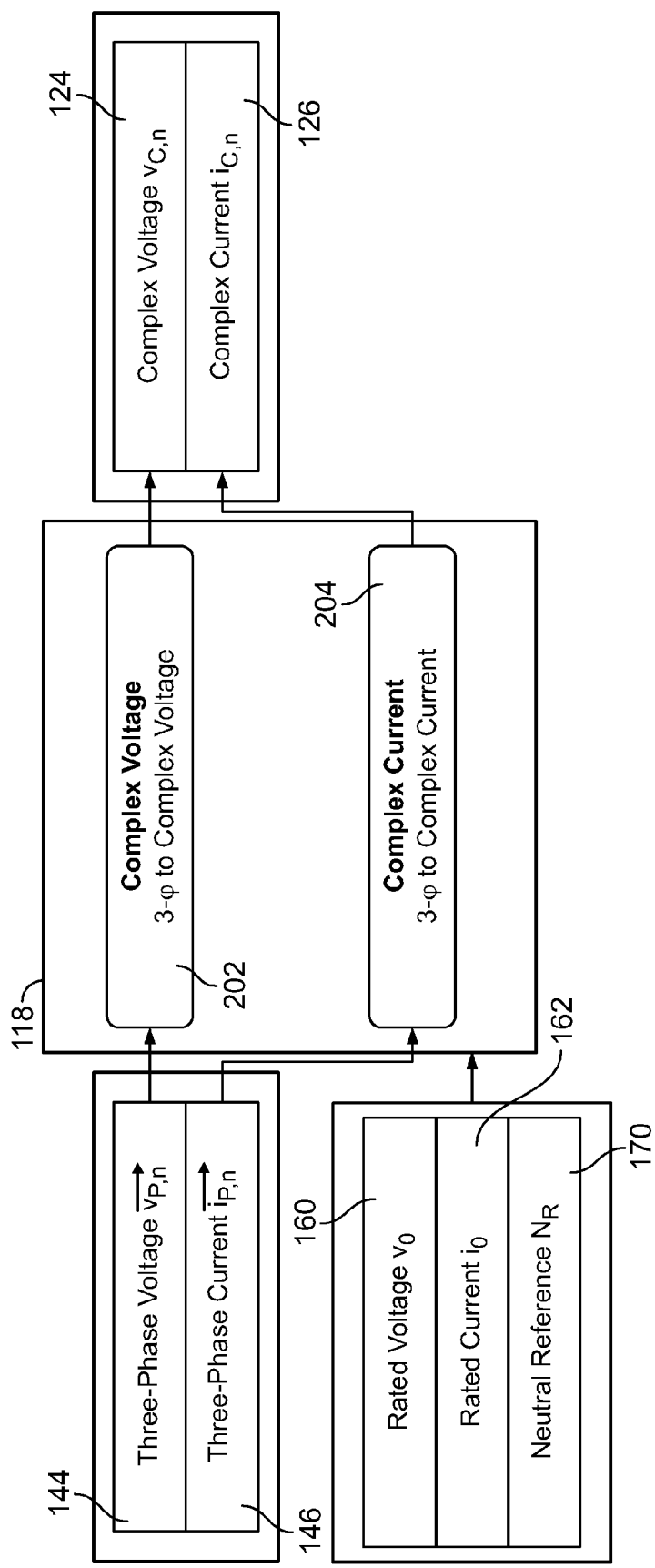
FIG. 2 is a data flow diagram of a Data Acquisition Process of FIG. 1.

Referring to FIG. 2, the Data Acquisition process 118 converts the three-phase voltage 144 and the three-phase current 146 signals produced by the Analog collection 114 into complex representations 124 and 126, in a Complex Voltage process 202 and a Complex Current process 204.

4.1.1 The Complex Voltage Process

The Complex Voltage process 202, COMPLEX VOLTAGE, converts the three-phase voltage 144 to an unbiased complex representation 124 as a function of the rated voltage 160 and the neutral reference 170, in (Equation 7).

$$v_{C,n} = \text{COMPLEX VOLTAGE}(\vec{v}_{P,n}, v_0, N_R) \quad \text{(Equation 7)}$$

$v_{C,n}$ Complex Voltage 124.
$\vec{v}_{P,n}$ Three-Phase Voltage 144.
$v_0$ Rated Voltage 160.
$N_R$ Neutral Reference 170.

The voltage signals are acquired in the form of sampled three-phase sequences, with one phase or dimension per source line. The complex representations are synthesized through application of simple linear transformations. Complex conversion is equivalent, reversible, lossless, mathematically convenient, and/or practically advantageous, relative to three-phase representations.

Voltage definition is relative, and the three-phase voltage 144 is described in terms of a line-neutral or a line-line source reference. The voltage sensor topologies are supported without preference, and synthesis produces data with equivalent complex representations. Synthesis differences are limited to scale and rotation of the resulting complex data.

It is contemplated that any suitable matrices or vectors can be used to perform the linear transformations. For example, a complex synthesis matrix, $\vec{X}_C$, is a constant matrix that can be used in the linear transformation which supports complex conversion, in (Equation 8).

$$\vec{X}_C = \left(\frac{2}{3}\right) \cdot \begin{bmatrix} 1.0 & -0.5 & -0.5 \\ 0.0 & 0.5 \cdot 3^{0.5} & -0.5 \cdot 3^{0.5} \\ 1.0 & 1.0 & 1.0 \end{bmatrix} \quad \text{(Equation 8)}$$

Similarly, a complex synthesis vector, $\vec{u}_C$, is a constant vector that can be used to extract real and imaginary components from an intermediate complex conversion vector, in (Equation 9).

$$\vec{u}_C = [1.0j0.0] \quad \text{(Equation 9)}$$

A biased complex voltage, $v_{B,n}$, is synthesized through linear transformation using the complex synthesis matrix and complex synthesis vector, as a function of neutral reference 170, $N_R$, in (Equation 10).

The complex voltage 124 is normalized with respect to rated voltage 160, $v_0$.

Line-line voltage sensor topologies call for additional application of a scale factor and a coordinate rotation, achieved by multiplication with a complex constant.

$$v_{B,n} = \begin{cases} \frac{\vec{u}_C}{v_0} \cdot (\vec{X}_C \cdot \vec{v}_{P,n}) \cdot 3^{-0.5} \cdot e^{-j\frac{\pi}{6}} = \\ \frac{\vec{u}_C}{v_0} \cdot \left(\vec{X}_C \cdot \begin{bmatrix} v_{P,0-1,n} \\ v_{P,1-2,n} \\ v_{P,2-0,n} \end{bmatrix}\right) \cdot 3^{-0.5} \cdot e^{-j\frac{\pi}{6}} & NOT(N_R) \\ \frac{\vec{u}_C}{v_0} \cdot (\vec{X}_C \cdot \vec{v}_{P,n}) = \frac{\vec{u}_C}{v_0} \cdot \left(\vec{X}_C \cdot \begin{bmatrix} v_{P,0,n} \\ v_{P,1,n} \\ v_{P,2,n} \end{bmatrix}\right) & N_R \end{cases} \quad \text{(Equation 10)}$$

It is implicit that the three-phase voltage samples are sequential in phase, signed, and approximately zero mean after quantization by the ADC 154, and prior to complex conversion. Signed conversion consisting of simple subtraction can be utilized with some ADC architectures, though residual bias present, due to imprecise ADC reference voltages, noise, or actual DC signal content, is preferably removed.

An exponential decay filter is a $1^{st}$ order Infinite Impulse Response (IIR) filter with coefficients directly specified from the bias filter bandwidth, $f_{B,B}$, in (Equation 11). The IIR Filter architecture is described in detail below with respect to FIG. 21.

$$f_{B,B} \approx \frac{0.01}{f_N} \quad \text{(Equation 11)}$$

A biased complex voltage mean, $\bar{v}_{B,n}$, is estimated by application of an IIR filter, in (Equation 12).

$$\bar{v}_{B,n} = (1-f_{B,B}) \cdot \bar{v}_{B,n-1} + f_{B,B} \cdot v_{B,n} = _{IIR}(v_{B,n}, 1-f_{B,B}, f_{B,B}) \quad \text{(Equation 12)}$$

The complex voltage 124, $v_{C,n}$, is equal to the difference of the biased complex voltage and its mean, in (Equation 13).

$$v_{C,n} = v_{B,n} - \bar{v}_{B,n} \quad \text{(Equation 13)}$$

4.1.2 The Complex Current Process

The Complex Current process 204, $_{COMPLEX\ CURRENT}$, converts the three-phase current 146 to an unbiased complex representation 126 as a function of rated current 162, in (Equation 14).

$$i_{C,n} = _{COMPLEX\ CURRENT}(\vec{i}_{P,n}, i_0) \quad \text{(Equation 14)}$$

$i_{C,n}$ Complex Current 126.
$\vec{i}_{P,n}$ Three-Phase Current 146.
$i_0$ Rated Current 162.

The current signals are acquired in the form of sampled three-phase sequences, with one phase or dimension per source line. The complex representations 126 are synthesized through application of simple linear transformations. Complex conversion can be equivalent, reversible, lossless, mathematically convenient, and/or practically advantageous, relative to three-phase representations.

Current definition is absolute, and complex current conversion is implicitly defined in terms of a line-neutral source reference.

A biased complex current, $i_{B,n}$, is synthesized through linear transformation using the complex synthesis matrix, $\vec{X}_C$, and complex synthesis vector, $\vec{u}_C$, in (Equation 15).

The complex current 126 is normalized with respect to rated current 162, $i_0$.

$$i_{B,n} = \frac{\vec{u}_C}{i_0} \cdot (\vec{X}_C \cdot \vec{i}_{P,n}) = \frac{\vec{u}_C}{i_0} \cdot \left(\vec{X}_C \cdot \begin{bmatrix} i_{P,0,n} \\ i_{P,1,n} \\ i_{P,2,n} \end{bmatrix}\right) \quad \text{(Equation 15)}$$

It is implicit that three-phase current 146 samples are sequential in phase, signed, and approximately zero mean after quantization by the ADC 154, and prior to complex conversion. Signed conversion consisting of simple subtraction can be utilized with some ADC architectures, though residual bias present, due to imprecise ADC reference voltages, noise, or actual DC signal content, should be removed.

An exponential decay filter is a $1^{st}$ order IIR filter with coefficients directly specified from the bias filter bandwidth, $f_{B,B}$, in (Equation 16).

$$f_{B,B} \approx \frac{0.01}{f_N} \quad \text{(Equation 16)}$$

A biased complex current mean, $\bar{i}_{B,n}$, is estimated by application of an IIR filter, in (Equation 17).

$$\bar{i}_{B,n} = (1-f_{B,B}) \cdot \bar{i}_{B,n-1} + f_{B,B} \cdot i_{B,n} = _{IIR}(i_{B,n}, 1-f_{B,B}, f_{B,B}) \quad \text{(Equation 17)}$$

The complex current 126, $i_{C,n}$, is equal to the difference of the biased complex current and its mean, in (Equation 18).

$$i_{C,n} = i_{B,n} - \bar{i}_{B,n} \quad \text{(Equation 18)}$$

4.2.0 The Signal Extraction Process

The Signal Extraction process 120 filters the complex voltage signal 124 and the complex current signal 126 and produces a data collection including a complex fundamental voltage 128, a complex fundamental current 130 and a complex residual current 132, a complex input power 134, an instantaneous fundamental frequency 136, and an approximate slip 138.

Figure 3:
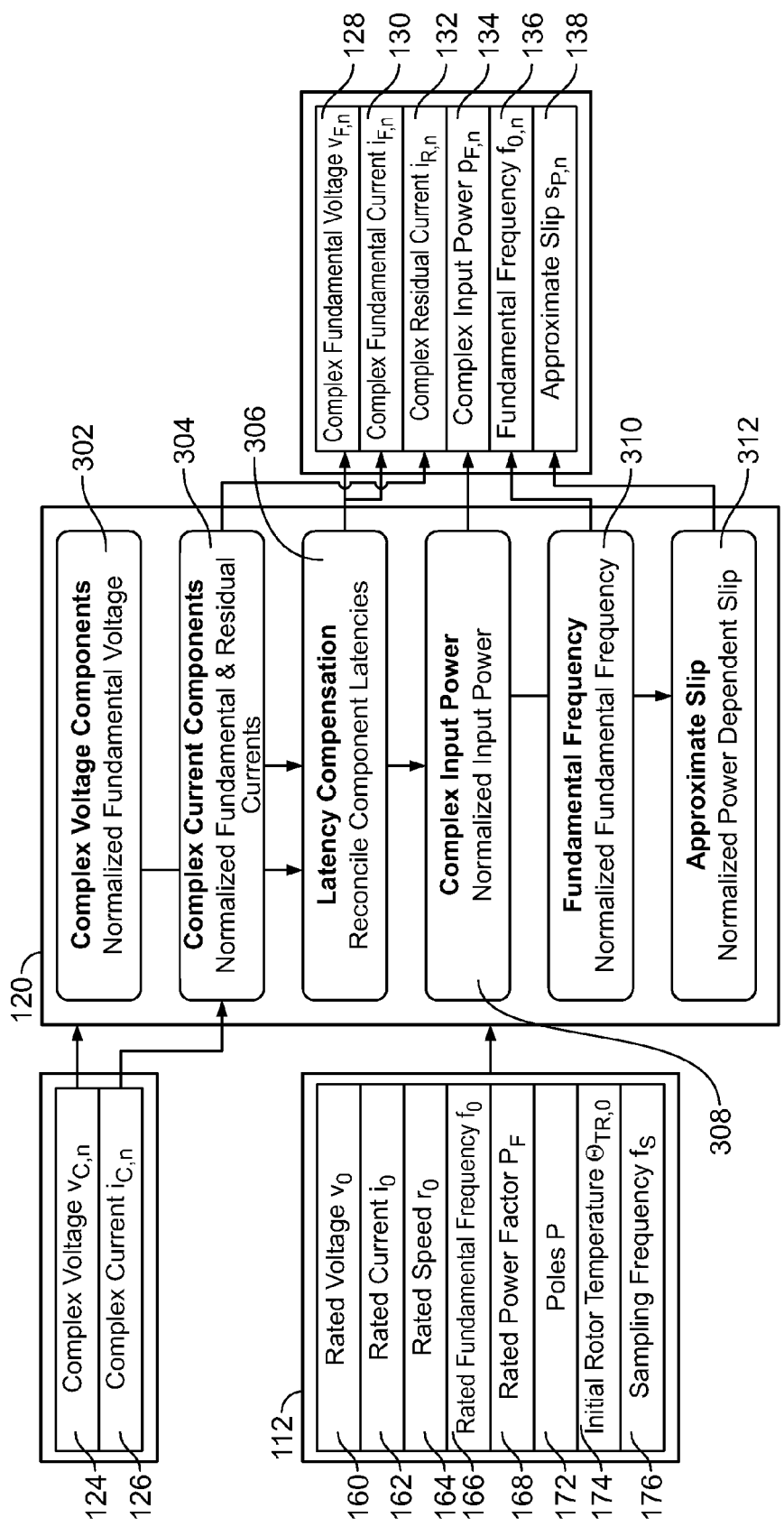
FIG. 3 is a data flow diagram of a Signal Extraction Process of FIG. 1.

Referring to FIG. 3, the Signal Extraction process 120 consists of a Complex Voltage Components process 302, a Complex Current Components process 304, a Latency Compensation process 306, a Complex Input Power process 308, a Fundamental Frequency process 310 and an Approximate Slip process 312.

4.2.1 The Complex Voltage Components Process

The Complex Voltage Components process 302, *COMPLEX VOLTAGE COMPONENTS*, extracts an estimate of the complex fundamental voltage 128 as a function of the complex voltage 124, the rated fundamental frequency 166 and the sampling frequency 176, in (Equation 19).

$$v_{F,n} = \text{COMPLEX VOLTAGE COMPONENTS}(v_{C,n}, f_0, f_S) \quad \text{(Equation 19)}$$

$v_{F,n}$ Complex Fundamental Voltage 128.
$v_{C,n}$ Complex Voltage 124.
$f_0$ Rated Fundamental Frequency 166.
$f_S$ Sampling Frequency 176.

The complex fundamental voltage 128 is a complex exponential component of the complex voltage 124 proximate to the normalized rated fundamental frequency. The complex fundamental voltage 128 can be estimated by any suitable filter such as, for example, through application of a static band pass filter or a Complex Single Frequency (CSF) adaptive filter.

CSF filters have inherent superior performance, relative to static band pass filter topologies, due to the ability to dynamically predict or match the magnitude and phase of a complex exponential component of interest in a primary signal. CSF filters are computationally simple, and flexible, as they are readily tunable to any frequency of interest.

CSF filters consist of a Voltage Controlled Oscillator (VCO) and a means of complex coefficient adaptation, which are combined to support synthesis of complex incident, reference and error signals, with respect to an external complex primary signal. The CSF filter is described in detail below with respect to FIG. 23. In a quasi-stationary environment, relative to the response of the filter, an optimum complex coefficient value can be found to minimize the resulting error signal, in a least squares sense, resulting in synthesis of a reference signal that approximates a component of interest in the primary signal.

Convergence, the time required to find the optimum complex coefficient, is inversely proportional to the coefficient adaptation rate 412, $\mu_W$. Misadjustment, the estimation noise introduced by the adaptive process, is proportional to the coefficient adaptation rate 412. Faster convergence results in increased estimation noise. The nominal coefficient adaptation rate 412 is 1.0e−3.

Momentum is a nonlinear technique applied to improve convergence time, or the effort expended to find the optimum complex coefficient value, with potential implications on stability and misadjustment. Coefficient momentum 414, $\alpha_W$, accelerates complex coefficient change along a consistent trajectory. The nominal coefficient momentum 414 is zero.

The complex fundamental voltage 128, $v_{F,n}$, is extracted from a CSF filter with the complex voltage 124 assigned to the complex primary signal 2304, and a synthesis frequency 2302 equal to the normalized rated fundamental frequency 166, in (Equation 20).

$$v_{F,n} = \text{CSF}\left(v_{C,n}, \frac{f_0}{f_N}, \mu_W, \alpha_W\right) \quad \text{(Equation 20)}$$

The complex fundamental voltage 128 is assigned from the complex reference signal 2308, and the complex error signal 2306 is not retained.

4.2.2 The Complex Current Components Process

The Complex Current Components process 304, *COMPLEX CURRENT COMPONENTS*, extracts estimates of the complex fundamental current 130 and the complex residual current 132 as a function of the complex current 126, the rated fundamental frequency 166 and the sampling frequency 176, in (Equation 21).

$$\odot i_{F,n}, i_{R,n}] = \text{COMPLEX CURRENT COMPONENTS}(i_{C,n}, f_0, f_S) \quad \text{(Equation 21)}$$

$i_{F,n}$ Complex Fundamental Current 130.
$i_{R,n}$ Complex Residual Current 132.
$i_{C,n}$ Complex Current 126.
$f_0$ Rated Fundamental Frequency 166.
$f_S$ Sampling Frequency 176.

The complex fundamental current 130, a complex exponential component of complex current 126 proximate to the normalized rated fundamental frequency, is estimated by any suitable means such as, for example, through application of static band pass filters or a CSF adaptive filter. The complex residual current 132 is the remainder, or difference of the complex current 126 and the complex fundamental current 130.

The complex fundamental current 130, $i_{F,n}$, and the complex residual current 132, $i_{R,n}$, are extracted from the CSF filter with complex current 126 assigned to the complex primary signal 2304, and synthesis frequency 2302 equal to the normalized rated fundamental frequency, in (Equation 22). As described with respect to the Complex Voltage Components process 302, the nominal coefficient adaptation rate 412, $\mu_W$, is 1.0e−3 and the nominal coefficient momentum 414, $\alpha_W$, is zero.

$$[i_{F,n}, i_{R,n}] = \text{CSF}\left(i_{C,n}, \frac{f_0}{f_N}, \mu_W, \alpha_W\right) \quad \text{(Equation 22)}$$

Complex fundamental current 130 is assigned from the complex reference signal 2308, and complex residual current 132 is assigned from the complex error signal 2306.

4.2.3 The Latency Compensation Process

Figure 4:
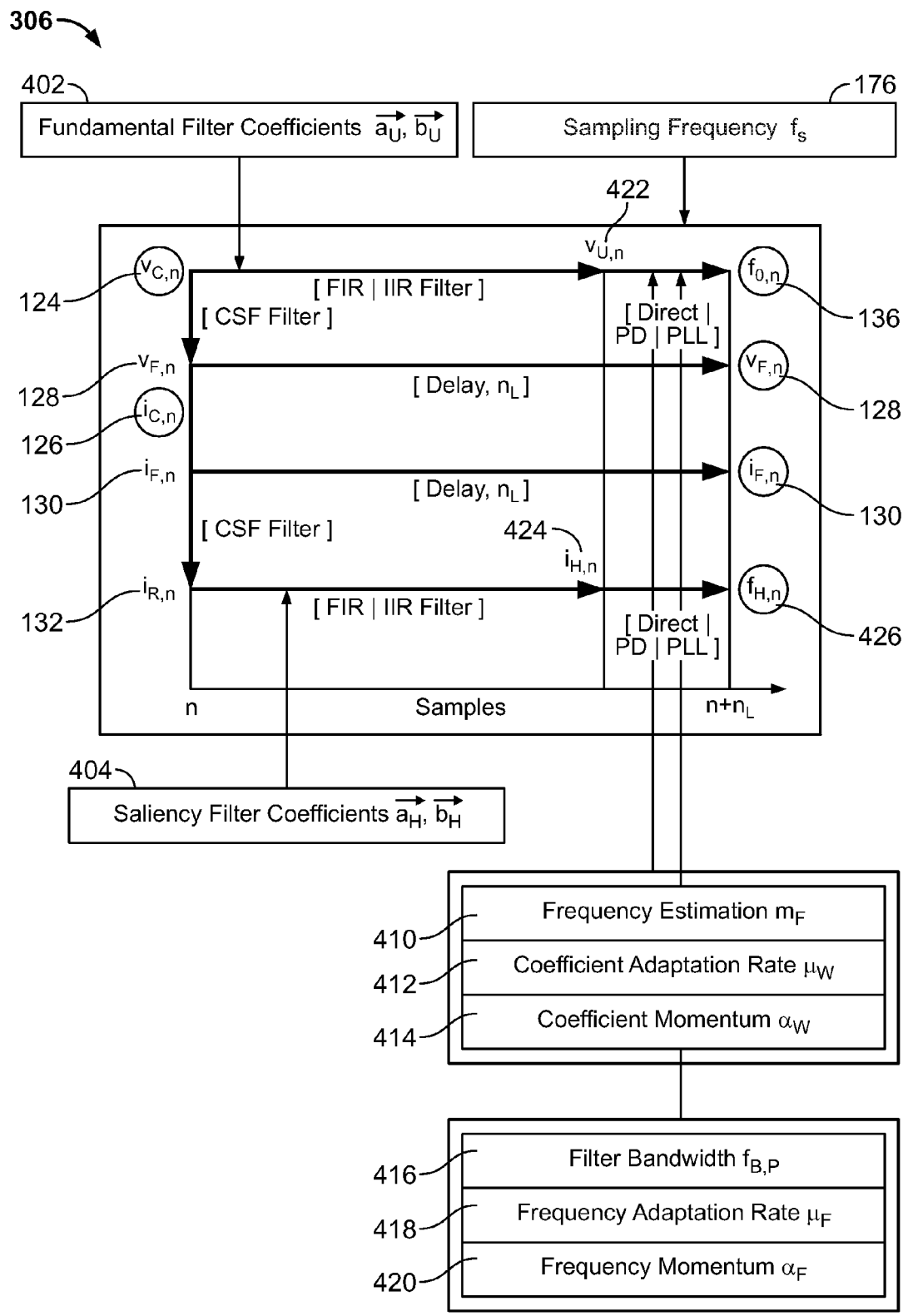
FIG. 4 is a diagram of a Latency Compensation Process of FIG. 3.

Referring to FIG. 4, the Latency Compensation process 306, *LATENCY COMPENSATION*, reconciles the latencies associated with the complex fundamental voltage 128 and the complex fundamental current 130 signals, ensuring temporal alignment among all signals on which subsequent multiple dependencies exist, in (Equation 23).

$$[v_{F,n}, i_{F,n}] = \text{LATENCY COMPENSATION}(v_{F,n}, i_{F,n}, f_S) \quad \text{(Equation 23)}$$

$v_{F,n}$ Complex Fundamental Voltage 128.
$i_{F,n}$ Complex Fundamental Current 130.
$v_{F,n}$ Complex Fundamental Voltage 128.
$i_{F,n}$ Complex Fundamental Current 130.
$f_S$ Sampling Frequency 176.

The complex fundamental voltage 128 and the complex fundamental current 130 are delayed to support temporal synchronization with other signals. The input and output symbols for these signals remain unchanged for notational convenience, though subsequent references imply the latency compensated versions.

Independent processing paths incur an associated penalty, or latency, due to the specific set of architectures and methods which define a path. Compound signals are defined in terms of multiple signals extracted from different dependent processing paths. The latency of each dependent processing path is reconciled such that the effective latency of each dependent signal is equal. The Latency Compensation process 306 aligns dependent signals in time prior to evaluation of a compound signal.

The Latency Compensation process 306 can be accomplished by evaluating the aggregate delays associated with various dependent signal processing paths, identifying the slowest, or longest latency path, and defining appropriate additional latencies required for each of the remaining dependent paths so that the latencies are equal. The Latency Compensation process 306 appends a specific causal delay to each dependent signal processing path as desired, resulting in an equivalent effective latency for all dependent paths.

The Latency Compensation process 306 is clarified by analysis of the relative inter-path latencies resulting from estimation of the fundamental frequency 136, the complex fundamental voltage 128, the complex fundamental current 130, and a saliency frequency 426 (discussed below with respect to FIG. 8), as a function of the complex voltage 124 and the complex current 126.

Though fundamental frequency 136 and saliency frequency 426 have not yet been formally presented, it is sufficient to limit the current description to the definition of signal dependencies and relative latencies, so that the requirements and means for latency compensation can be clearly understood.

The timing diagram of FIG. 4 illustrates the production of various signals, and their associated latencies, in the framework of a temporal map. The abscissa is in units of samples, with an arbitrary epoch at sample n, and a range of $n_L$ samples. The range corresponds to the worst-case latency in any processing path.

The processing paths are identified with bold directional lines between enumerated variables. The processing paths traverse vertically, indicating that negligible latency is incurred in production of the variable, or horizontally, indicating significant latency.

The architectures associated with processing paths are specified in closed braces. Dependencies which effect latency, including the sampling frequency 176, adaptive parameters, and filter coefficients 402 and 404, are associated with specific architectures by light vertical directional lines. The adaptive parameters include, for example, a frequency estimation 410, the coefficient adaptation rate 412, the coefficient momentum 414, a filter bandwidth 416, a frequency adaptation rate 418, and a frequency momentum 420. The filter coefficients include, for example, saliency filter coefficients 404 and fundamental filter coefficients 402.

Processing paths originate with the complex voltage 124 and the complex current 126, and terminate with the fundamental frequency 136, the complex fundamental voltage 128, the complex fundamental current 130, and the saliency frequency 426. The epoch and terminus signals are enclosed in circles.

The intermediate signals embedded in the timing diagram of FIG. 4 need not be delayed and reconciled with terminus signals. The latency should be reconciled when two or more independent signal paths are combined to produce a new signal. Through judicious application of the Latency Compensation process 306 just-in-time, we can limit the scope of the compensation to adding independent delays to the complex fundamental voltage 128 and complex fundamental current 130 signal paths. No additional latency compensation is needed.

Four processing paths are defined, specifying the production of the fundamental frequency 136, the complex fundamental voltage 128, the complex fundamental current 130, and the saliency frequency 426. The fundamental frequency 136 and the saliency frequency 426 processing paths can be defined to be equivalent with respect to latency. The complex fundamental voltage 128 and the complex fundamental current 130 processing paths are synchronized to frequency estimation processing paths by latency compensation, consisting of independent static delays.

The fundamental frequency 136, $f_{0,n}$, is estimated from the complex voltage 124. According to some aspects, the complex voltage 124 produces a complex baseband voltage 422 by applying a VCO and a FIR or an IIR filter (described in detail with respect to FIG. 21). The VCO latency is negligible, though the filter latency can be significant. One of several alternative frequency estimation architectures can be applied to extract the fundamental frequency 136 from the complex baseband voltage 422.

The FIR or IIR Filter latency is dependent on the fundamental filter coefficients 402 and the sampling frequency 176, and represents group delay. The frequency estimation latency is highly dependent on the specific architecture, the adaptive coefficients and the sampling frequency 176. Alternative methods of iterative frequency estimation include, for example, Direct, Phase Discriminator (PD), and Phase Locked Loop (PLL) analysis. The PD and the PLL architectures are described below with respect to FIG. 24 and FIG. 25, respectively.

The complex fundamental voltage 128, $v_{F,n}$, is estimated from the complex voltage 124. A CSF filter can be used to extract the complex fundamental voltage 128 from complex voltage 124. The CSF filter latency is negligible, neglecting convergence and bandwidth limitations, as it is an adaptive predictor. A causal integer delay, $n_L$, produces the latency compensated complex fundamental voltage 128 from the uncompensated signal.

The complex fundamental current 130, $i_{F,n}$, is estimated from the complex current 126. A CSF filter can be used to extract the complex fundamental current 130 and the complex residual current 132, from the complex current 126. Again, the CSF filter latency is negligible, neglecting convergence and bandwidth limitations, as it is an adaptive predictor. A causal integer delay, $n_L$, produces the latency compensated complex fundamental current 130 from the uncompensated signal.

The saliency frequency 426, $f_{H,n}$, is estimated from the complex current 126. According to some aspects, a CSF filter is used to extract the complex fundamental current 130 and the complex residual current 132, from the complex current 126. The CSF filter latency is negligible, neglecting convergence and bandwidth limitations, as it is an adaptive predictor. The complex residual current 132 produces the complex baseband current 424 by applying a VCO and FIR or IIR filter. The VCO latency is negligible, though filter latency is significant. One of several alternative frequency estimation architectures can be applied to extract saliency frequency from complex baseband current 424.

The FIR or IIR Filter latency is dependent on the saliency filter coefficients 404 and the sampling frequency 176, and represents group delay. Frequency estimation latency is highly dependent on specific architecture, adaptive coefficients and sampling frequency. Alternative methods of iterative frequency estimation include, for example, Direct, PD, and PLL analysis.

To reduce redundant efforts to define the specific causal integer delay to facilitate latency compensation 306 in similar systems, latency coefficients are introduced to support delay definition as a function of the frequency estimation architecture and the sampling frequency 176.

The latency compensation coefficients provided implicitly depend on certain assumptions regarding the design of a specific system. CSF filter adaptive parameters for the Complex Voltage Component 302 and the Complex Current Component 304 extraction should be identical, and equal to the default parameters that will be described below with respect to FIG. 23. The fundamental frequency 136 and the saliency frequency 426 estimation architectures, constants, and adaptive parameters should be identical, and equal to the default PD or PLL parameters that will be described with respect to FIG. 24 and FIG. 25, respectively. The fundamental filter coefficients 402 and the saliency filter coefficients 404 should specify FIR filters with filter order, M, equal to ¼ the sampling frequency 176.

It is contemplated that alternative IIR filter architectures or alternative FIR filter orders can be utilized to accomplish the latency compensation process 306. Accordingly, the latency compensation delay specified in the following description can be modified to account for the change in filter group delay resulting from these alternative embodiments.

A designer is provided with a number of options to support flexible design in a myriad of environments with differing processor or memory resources. Independent of flexibility in the algorithm, resulting designs and implementations are likely to demonstrate considerable diversity. Therefore, it is desirable to verify that the latency compensation for a specific implementation is correct.

The latency coefficients, $\vec{c}_{L,m}$, are specified from analysis of supported fundamental frequency 136 and saliency harmonic frequency estimation 426 methods, in (Equation 24).

$$\vec{c}_{L,m} = \begin{cases} [-163 \ 0.0850] & m_F = DIRECT \\ [60 \ \ \ 0.0872] & m_F = PD \\ [190 \ \ 0.0864] & m_F = PLL \end{cases} \quad \text{(Equation 24)}$$

The latency coefficients describe a $1^{st}$ order polynomial and are defined in ascending order, with respect to spatial index $_m$. The zero order coefficient, $c_{L,0}$, expresses a constant latency offset. The first order coefficient, $c_{L,1}$, is a function of the sampling frequency 176, and expresses a dynamic latency rate.

A latency compensation delay, $n_L$, is the delay, rounded to the nearest integer, expressed as a polynomial product of the latency coefficients and the sampling frequency 176, in units of samples, in (Equation 25).

$$n_L = \lfloor c_{L,0} + c_{L,1} \cdot f_S \rfloor \quad \text{(Equation 25)}$$

The complex fundamental voltage 128, $v_{F,n}$, is delayed by the latency compensation delay samples, in (Equation 26).

$$v_{F,n} = v_{F,n-n_L} = DELAY(v_{F,n}, n_L) \quad \text{(Equation 26)}$$

The complex fundamental current 130, $i_{F,n}$, is delayed by latency compensation samples, in (Equation 27).

$$i_{F,n} = i_{F,n-n_L} = DELAY(i_{F,n}, n_L) \quad \text{(Equation 27)}$$

The complex fundamental voltage 128 and the complex fundamental current 130 are delayed to support any temporal synchronization with other signals. The input and output symbols for these signals remain unchanged for notational convenience, though subsequent references imply the latency compensated versions.

4.2.4 The Complex Input Power Process

The Complex Input Power process 308, $_{COMPLEX\ INPUT\ POWER}$, extracts an estimate of the complex input power 134 as a function of the complex fundamental voltage 128, the complex fundamental current 130 and the rated power factor 168, in (Equation 28).

$$p_{F,n} = _{COMPLEX\ INPUT\ POWER}(v_{F,n}, i_{F,n}, P_F) \quad \text{(Equation 28)}$$

$p_{F,n}$ Complex Input power 134.
$v_{F,n}$ Complex Fundamental Voltage 128.
$i_{F,n}$ Complex Fundamental Current 130.
$P_F$ Rated Power Factor 168.

The complex input power 134, $p_{F,n}$, is normalized to rated input power, as the scaled product of the complex fundamental voltage 128 and the conjugate of the complex fundamental current 130, in (Equation 29).

$$p_{F,n} = \frac{3^{0.5} \cdot v_{F,n} \cdot i^*_{F,n}}{2 \cdot P_F} \quad \text{(Equation 29)}$$

Figure 5:
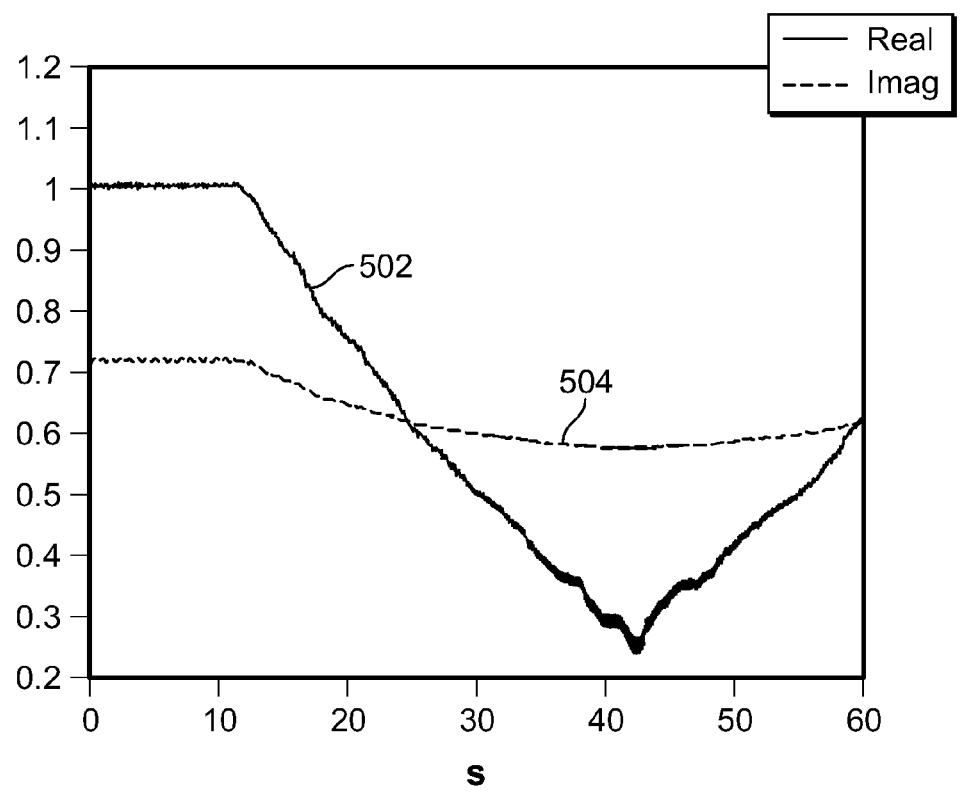
FIG. 5 is a chart depicting the complex input power estimation for a 15 HP, 6 pole motor operating in rated voltage of 460 V and dynamic current conditions of 10.0-18.5 A, for a period of 60.0 seconds, at a sampling frequency of 10 kHz.

Referring to FIG. 5, the complex input power 134 estimation is illustrated for a 15 HP, 6 pole motor 150 operating in rated voltage 160 of 460 V and dynamic current conditions of 10.0-18.5 A, for a period of 60.0 seconds, at a sampling frequency 176 of 10 kHz. The normalized real input power is identified as 502 and the imaginary input power is identified as 504. The motor 150 was operated in near rated conditions, or approximately unity normalized real input power, at the epoch of the signal, and the load 152 was gradually decreased and increased to traverse the observable below rated range of operation.

4.2.5 The Fundamental Frequency Process

Figure 6:
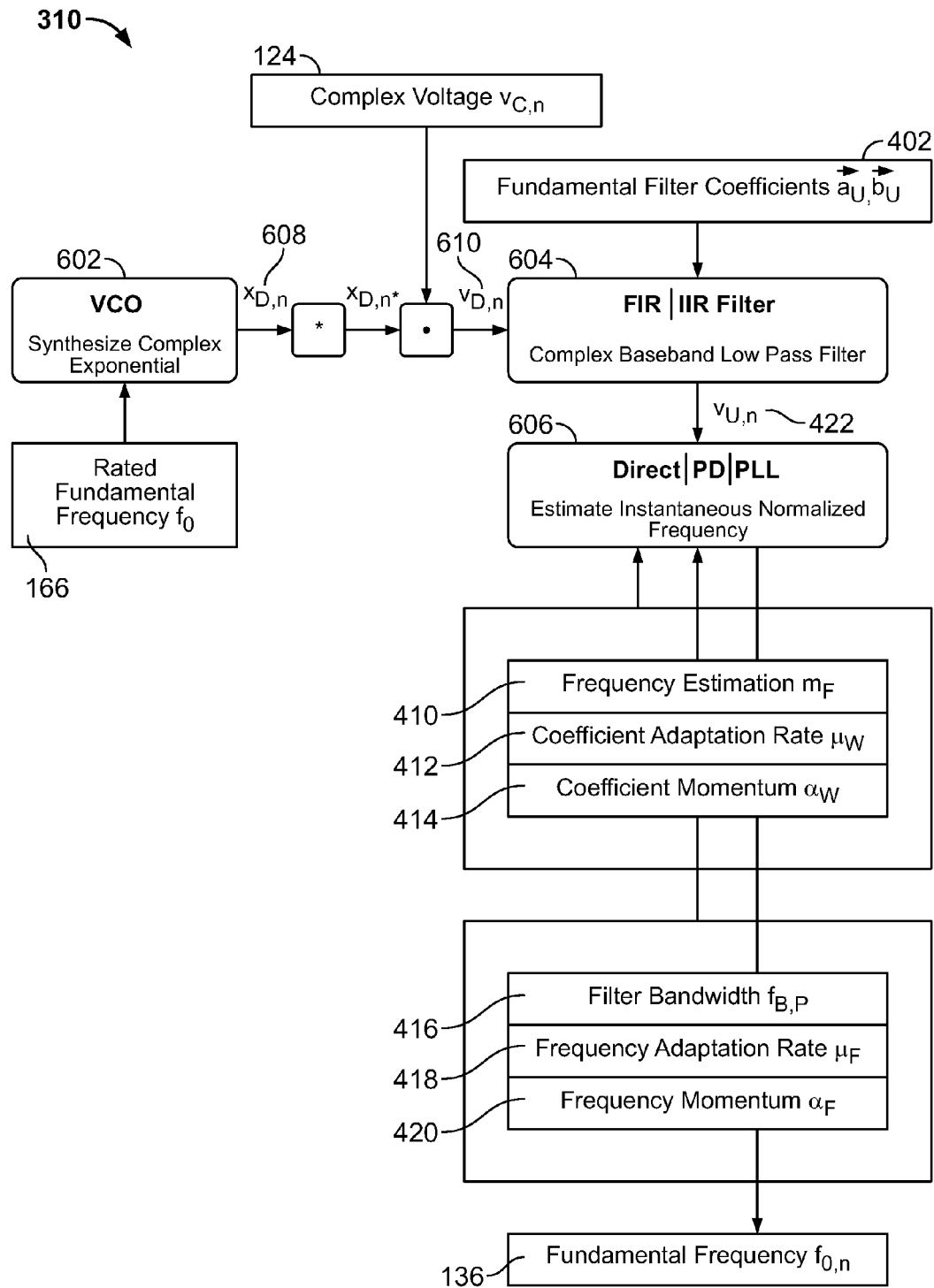
FIG. 6 is a flow chart diagram of an architecture for estimating a fundamental frequency according to some aspects of the implementations.

Referring to FIG. 6, the Fundamental Frequency process 310, $_{FUNDAMENTAL\ FREQUENCY}$, extracts an instantaneous estimate of fundamental frequency 136 as a function of the complex voltage 124, the rated fundamental frequency 166 and the sampling frequency 176, in (Equation 30).

$$f_{0,n} = _{FUNDAMENTAL\ FREQUENCY}(v_{C,n}, f_0, f_S) \quad \text{(Equation 30)}$$

$f_{0,n}$ Fundamental Frequency 136.
$v_{C,n}$ Complex Voltage 124.
$f_0$ Rated Fundamental Frequency.
$f_S$ Sampling Frequency.

The fundamental frequency 136 is dynamic, due to variation in the supply voltage 148 and the load 152. Though a nominal rated fundamental frequency 166 is available, a more accurate instantaneous fundamental frequency 136 estimate can be obtained. The complex voltage 124 is selected as a preferred source for analysis, as it has a relatively high signal to noise ratio, in terms of the complex fundamental voltage 128 and the complex residual voltage components; however, it is contemplated that any other suitable source can be selected to obtain an estimate of the fundamental frequency 136.

A demodulation process applies a VCO 602 to mix the rated fundamental frequency 166 in the complex voltage 124 to complex baseband, or a zero nominal frequency. An FIR or IIR filter 604 can be applied to band limit the mixed voltage 610, producing a complex baseband voltage 422. To complete the demodulation process, a residual frequency contained in the complex baseband voltage 422 is extracted, resulting in an accurate fundamental frequency 136 estimate.

According to alternative aspects, the fundamental frequency 136 can be estimated by any application of frequency domain or time domain methods, employing static or adaptive architectures, in parametric or non-parametric form, producing instantaneous or aggregate frequency estimates. For example, frequency domain methods of frequency estimation include the Fourier transform, Fast Fourier Transform (FFT), Power Spectral Density (PSD), Chirp Z Transform (CZT), Autoregressive (AR) model, Moving Average (MA) model, Autoregressive Moving Average (ARMA) model, Prony method, Pisarenko Harmonic Decomposition (PHD), Maximum Likelihood Method (MLM), Least Squares Spectral Analysis (LSSA), the Goertzel method, and the like. Non-limiting examples of time domain methods of frequency estimation include the Phase Locked Loop (PLL), Phase Discriminator (PD), discrete phase differentiation, and various methods of Frequency Modulation (FM) signal demodulation.

The frequency and time domain methods of frequency estimation can be instantaneous, representing transient dynamics in a source signal, or aggregate, representing a quasi-stationary weighted response over a finite period of observation. Various methods can appropriately be applied to produce iterative transient frequency estimations, while others are exclusively suitable for operation on a signal defined over a finite period of observation. The enumerated frequency estimation methods described with respect to any frequency quantity (e.g., fundamental frequency 136, saliency frequency 426, etc.) are inclusive and representative, not exclusive.

4.2.5.1 Obtaining The Complex Baseband Voltage

A complex incident signal 608, $X_{D,n}$, is synthesized by the VCO 602 at the normalized rated fundamental frequency, $f_0$, in (Equation 31).

$$x_{D,n} = v_{CO}\left(\frac{f_0}{f_N}\right) \quad \text{(Equation 31)}$$

A complex mixed voltage 610, $V_{D,n}$, is formed as the product of the conjugate of the complex incident signal 608 and the complex voltage 124, in (Equation 32).

$$v_{D,n} = v_{C,n} \cdot x^*_{D,n} \quad \text{(Equation 32)}$$

The fundamental filter coefficients 402, $\vec{a}_U$ and $\vec{b}_U$, are statically designed with a fundamental filter bandwidth, $f_{B,U}$, defined in terms of the normalized rated fundamental frequency, in (Equation 33).

$$f_{B,U} = 0.1 \cdot \frac{f_0}{f_N} \quad \text{(Equation 33)}$$

Suitable filters 604 include, for example, linear phase filters such as various FIR designs with memory depth equal to approximately ¼ second, and IIR Bessel filters with comparable performance. The filter architecture selection is dependent largely upon the computational and design complexity, and numerical stability.

A static filter design is practical, due to the small finite set of rated fundamental frequencies supported. The appropriate fundamental filter coefficients 402 can be selected from a predefined set and applied in a deterministic manner.

The fundamental filter coefficients 402 are applied to filter the complex mixed voltage 610, producing complex baseband voltage 422, $v_{U,n}$, in (Equation 34).

$$v_{U,n} = _{IIR}(v_{D,n}, \vec{a}_U, \vec{b}_U) \quad \text{(Equation 34)}$$

4.2.5.2 Estimating The Fundamental Frequency

A demodulation process removes the rated fundamental frequency 166, or the nominal fundamental frequency expected during motor operation in rated conditions, by mixing the complex voltage 124 by the conjugate of the complex exponential at the normalized rated fundamental frequency. The complex mixed voltage 610 can be band limited through application of a fundamental filter to isolate the remaining residual fundamental harmonic from interference sources, producing the complex baseband voltage 422. The demodulation process is completed by estimating the residual fundamental frequency in the complex baseband voltage 422. The fundamental frequency 136 is the sum of the normalized rated fundamental frequency and the residual fundamental frequency.

The fundamental frequency estimation methods are analogous to demodulation of an FM signal. The complex baseband voltage 422 is extracted through a process of carrier removal. The residual frequency estimation extracts the instantaneous frequency of the fundamental harmonic, relative to the normalized rated fundamental frequency, or carrier. Fundamental frequency 136 is expressed as the sum of the carrier frequency and residual frequency.

Alternative methods such as, for example, Direct, PD, and PLL methods 410, $m_F$, of estimating fundamental frequency 136 provide the flexibility to increase precision at the expense of computational complexity and frequency tracking rate, expanding the practical applicability of the solution.

4.2.5.2.1 The Direct Method of Estimating Fundamental Frequency

The direct estimation of residual fundamental frequency is the discrete derivative of the complex baseband voltage phase.

A residual fundamental phase, $\phi_{U,n}$, is the normalized phase of the complex baseband voltage 422, estimated through application of a contiguous arctangent function, in (Equation 35).

$$\varphi_{U,n} = _{TAN^{-1}}\left(\frac{IMAG(v_{U,n})}{REAL(v_{U,n})}\right) \cdot \frac{1}{\pi} + \quad \text{(Equation 35)}$$
$$0.5 \cdot (1 - _{SIGN}(REAL(v_{U,n}))) \cdot _{SIGN}(IMAG(v_{U,n}))$$

A normalized phase is extracted by an inverse tangent, $_{TAN^{-1}}$, applied to the ratio of imaginary and real complex components, scaled by the inverse of $\pi$ to normalize the result, and adjusted to reconcile the quadrant of operation. An arctangent method can be practically defined in terms of polynomial approximation, indexed table, or some combined method.

A residual fundamental frequency, $f_{R,n}$, is the discrete derivative of the residual fundamental phase, bounded by a practical range, in (Equation 36).

$$f_{R,n} = \frac{d}{dn}(\varphi_{U,n}) \approx \quad \text{(Equation 36)}$$

$$\left. {}_{MAX(MIN(\varphi_{U,n} - \varphi_{U,n-1}, f_{R,M}), -f_{R,M})}\right|_{f_{R,M}=5.0e-3\cdot\frac{f_0}{f_N}}$$

The fundamental frequency 136, $f_{0,n}$, is the sum of the normalized rated fundamental frequency and the residual fundamental frequency, in (Equation 37).

$$f_{0,n} = \frac{f_0}{f_N} + f_{R,n} \approx \frac{f_0}{f_N} + {}_{MAX(MIN(\varphi_{U,n} - \varphi_{U,n-1}, f_{R,M})}, \quad \text{(Equation 37)}$$

$$\left. -f_{R,M})\right|_{f_{R,M}=5.0e-3\cdot\frac{f_0}{f_N}}$$

The Direct method contiguous phase estimation and discrete differentiation are computationally simple, with negligible associated latency, and no introduced limitation in the frequency tracking rate, or reduction in signal bandwidth. The frequency tracking rate is the rate, in units of normalized frequency per second, at which the fundamental frequency 136 changes, a function of supply 148 and aggregate load 152 dynamics.

The Direct method memory depth is unity, resulting in faster tracking at the expense of increased estimation noise. Latency represents the cumulative computational delay, which is reconciled by shifting results to align them temporally with the source signals employed to produce them.

The Direct method frequency estimates are equivalent to the superposition of independent estimates of all complex baseband voltage 422 frequency components, over the fundamental filter bandwidth. The Direct method forms an aggregate and biased estimate of the fundamental frequency 136. Practically, the fundamental filter bandwidth can contain significant interference which can result in unacceptable performance in many environments.

4.2.5.2.2 The PD Method of Estimating Fundamental Frequency

A PD is an adaptive filter which estimates the residual frequency of the complex baseband voltage 422 through a process of input normalization, and adaptation of a complex coefficient which reconciles the phase difference between sequential normalized samples, encoding the instantaneous frequency in the phase of the complex coefficient. PD architecture is described in detail with respect to FIG. 24.

The complex error is minimized when the complex coefficient rotates the delayed complex incident signal in phase to compensate for the phase difference between sequential normalized samples. Frequency is defined as phase difference with respect to time.

The instantaneous frequency of the complex baseband voltage 422 is encoded in the phase of the complex coefficient. No capability exists to discriminate on the basis of frequency between complex exponential components in the complex baseband voltage 422. An aggregate instantaneous frequency estimate is extracted from the superposition of components present in the signal.

The PD method offers improved accuracy, relative to the Direct method, due to the noise reduction inherent in the memory depth associated with the adaptive complex coefficient. However, the improved accuracy comes at a cost of a modest increase in latency, and a minimal reduction in the frequency tracking rate. Latency represents the cumulative computational delay, which is reconciled by shifting results to align them temporally with the source signals employed to produce them.

PD convergence, misadjustment, frequency tracking rate, and bandwidth are dependent upon the selection of the adaptive parameters, which may be judiciously defined to optimally support a specific environment. A nominal coefficient adaptation rate 412 and a nominal coefficient momentum 414 are 2.0e-3 and 1.5e-1, respectively.

The residual fundamental frequency, $f_{R,n}$, is estimated from the application of a PD to the complex baseband voltage 422, bounded by a practical range, in (Equation 38).

$$f_{R,n} = \quad \text{(Equation 38)}$$

$$\left. {}_{MAX(MIN(PD(\nu_{U,n}, \mu_W, \alpha_W), f_{R,M}), -f_{R,M})}\right|_{f_{R,M}=5.0e-3\cdot\frac{f_0}{f_N}}$$

The fundamental frequency 136, $f_{0,n}$, is the sum of normalized rated fundamental frequency and the residual fundamental frequency, in (Equation 39).

$$f_{0,n} = \frac{f_0}{f_N} + f_{R,n} = \frac{f_0}{f_N} + {}_{MAX} (MIN(PD(\nu_{U,n}, \mu_W, \alpha_W), f_{R,M}), \quad \text{(Equation 39)}$$

$$\left. -f_{R,M})\right|_{f_{R,M}=5.0e-3\cdot\frac{f_0}{f_N}}$$

4.2.5.2.3 The PLL Method of Estimating Fundamental Frequency

A Phase Locked Loop (PLL) is a closed loop adaptive filter optimally suited to accurately estimate an instantaneous frequency in a dynamic environment with significant in-band interference. Adaptive frequency synthesis and interference rejection support the identification and tracking of a complex exponential component of interest in a complex primary signal. PLL architecture is described in detail below with respect to FIG. 25.

A PLL consists of a VCO 602, a mixer, an IIR filter 2100, a PD 2400, and a means of frequency adaptation 2508. The VCO 602 synthesizes a complex exponential signal at an instantaneous frequency of interest. The product of the conjugate of the complex exponential signal and the complex primary signal is band limited with the IIR filter, resulting in a complex baseband signal 2502. The complex baseband is a convenient representation of a complex signal with zero nominal frequency. The residual frequency, or estimation error, of the complex baseband signal is estimated by the PD 2400, and employed in adaptation of the synthesis frequency 2506. The residual fundamental frequency estimated by the PD 2400 is used to iteratively adapt the VCO synthesis frequency 2506, forcing the complex exponential signal to remain at a nominal zero frequency, centered in the complex baseband.

The PLL method offers improved accuracy, relative to the Direct method and the PD method, due to the noise reduction inherent in the memory depth of the integrated PD and iterative adaptation of the synthesis frequency, and the optional application of an IIR filter to reduce in-band interference. However, the improved accuracy comes at a further cost of a minimal increase in latency, and a minimal reduction in the frequency tracking rate, relative to the PD method.

A PLL filter bandwidth 2504, $f_{B,P}$, can be defined according to the nature of the complex baseband voltage 422 environment. The bandwidth can be increased, in return for significant reduction in latency and improved frequency tracking rate, at the cost of increased aggregate frequency estimation error. Unity bandwidth selection, which can be appropriate in environments with limited in-band interference, effectively excises the PLL IIR filter 2100, eliminating latency contributions by the filter and maximizing frequency tracking rate. Nominal PLL filter bandwidth 2504 is 1.0.

The PLL convergence, misadjustment, frequency tracking rate, and bandwidth are dependent upon selection of the adaptive parameters, which can be judiciously defined to optimally support a specific environment. The nominal coefficient adaptation rate 412 and the nominal coefficient momentum 414 are 5.0e-3 and zero, respectively. The nominal frequency adaptation rate 418 and the nominal frequency momentum 420 are 2.0e-3 and 3.5e-1, respectively.

The residual fundamental frequency, $f_{R,n}$, is estimated from the application of a PLL to the complex baseband voltage 422, initialized to the expected residual fundamental frequency and selected PLL filter bandwidth, bounded by a practical range, in (Equation 40).

$$f_{R,n} = \\ MAX(_{MIN}(PLL(v_{U,n}, f_{R,0}, f_{B,H}, \mu_W, \alpha_W, \mu_F, \alpha_F), f_{R,M}), \\ -f_{R,M})|_{f_{R,M}=5.0e-3 \cdot \frac{f_0}{f_N}}$$ (Equation 40)

An initial PLL frequency, $f_{R,0}$, is the expected residual fundamental frequency, or zero, as the complex incident signal is synthesized at the normalized rated fundamental frequency, in (Equation 41).

$$f_{R,0} = 0$$ (Equation 41)

The fundamental frequency 136, $f_{0,n}$, is the sum of the normalized rated fundamental frequency and the residual fundamental frequency, in (Equation 42).

$$f_{0,n} = f_D + f_{R,n} = \\ f_D + MAX(_{MIN}(PLL(v_{U,n}, f_{R,0}, f_{B,P}, \mu_W, \alpha_W, \mu_F, \alpha_F), \\ f_{R,M}), -f_{R,M})|_{f_{R,M}=5.0e-3 \cdot \frac{f_0}{f_N}}$$ (Equation 42)

The process of fundamental frequency estimation is continuous and iterative over a period of uninterrupted motor operation. Initialization and convergence occurs subsequent to each motor start.

Figure 7:
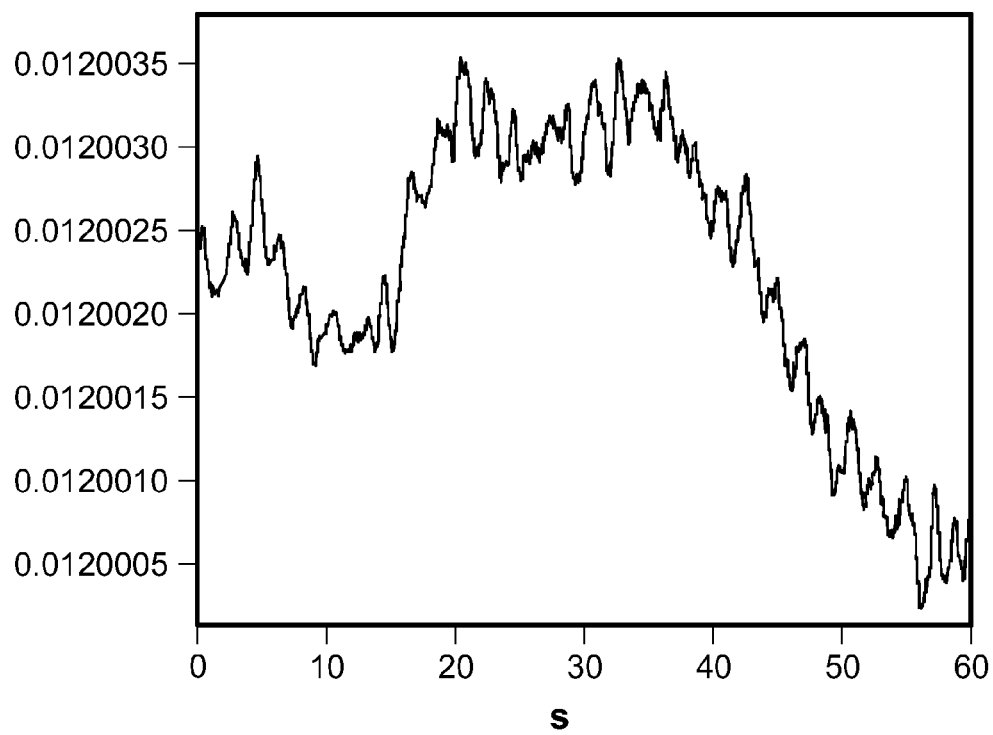
FIG. 7 is a chart depicting the normalized fundamental frequency estimation for a 15 HP, 6 pole motor operating in near rated conditions, for a period of 60.0 seconds, at a sampling frequency of 10 kHz.

Referring to FIG. 7, a normalized fundamental frequency estimation employing the PLL method is illustrated, for a 15 HP, 6 pole motor operating in near rated conditions, for a period of 60.0 seconds, at a sampling frequency of 10 kHz.

The frequency and amplitude of variations observable in the fundamental frequency 136 can be considered typical for a mains supply. The range of normalized frequency variation over the period of observation is approximately 3.3e-6, corresponding to an absolute frequency range of 0.0165 Hz, relative to the rated fundamental frequency 166 of 60.0 Hz.

4.2.6 The Approximate Slip Process

The Approximate Slip process 312, $_{APPROXIMATE\ SLIP}$, extracts an approximation of the approximate slip 138 as a function of the complex input power 134, the rated speed 164 and the rotor temperature, in (Equation 43).

$$s_{P,n} = _{APPROXIMATE\ SLIP}(p_{F,n}, r_0, P, \Theta_{TR,n})$$ (Equation 43)

$s_{P,n}$ Approximate Slip 138.
$p_{F,n}$ Complex Input Power 134.
$r_0$ Rated Speed 164.
$\Theta_{TR,n}$ Rotor Temperature. ($\Theta_{TR,0}$).

An approximate slip 138 is the product of a rated slip and the normalized real input power. Rotor temperature compensation can be employed to improve approximate slip estimation 312, if a reasonably accurate rotor temperature estimate is available. Approximate slip 138 is not as accurate as slip estimation based on harmonic analysis (discussed below with respect to FIGS. 8-9 and 13), though it is simple and independent of rotor slot quantity 142.

The rated slip, $s_{0,n}$, is the nominal slip expected during motor operation in rated voltage and rated current conditions, in (Equation 44).

$$s_{0,n} = 1 - \frac{r_0 \cdot P}{120 \cdot f_{0,n} \cdot f_N} \approx 1 - \frac{r_0 \cdot P}{120 \cdot f_0}$$ (Equation 44)

Slip demonstrates a temperature dependence which is generally not negligible, and it is implicit that the rated operation is defined corresponding to a specific rotor temperature. The precise rotor temperature associated with rated operation is typically not specified by the manufacturer, though experimental analysis reveals an approximately linear relationship between slip and rotor temperature.

A plurality of temperature coefficients, $c_{T,m,n}$, defining rotor temperature compensation, are defined from analysis of data from several representative motors 150 in various thermal conditions, in (Equation 45).

$$c_{T,m,n} = [-1.95e-3 \ _{MAX}(_{MIN}(2.75e-3 \cdot \Theta_{TR,n} + 0.805, 1.0), \\ 0.805)]$$ (Equation 45)

The temperature coefficients describe a $1^{st}$ order polynomial and are defined in ascending order, with respect to spatial index $_m$. The zero order coefficient, $c_{T,0,n}$, expresses a constant slip offset. The first order coefficient, $c_{T,1,n}$, is a function of rotor temperature, and expresses a dynamic slip gain. The slip gain is restricted by specific limits.

An evaluation of temperature coefficients is based on the rotor temperature, $\Theta_{TR,n}$, which can be obtained from a temperature estimate independently provided by a thermal model, or a priori knowledge. If the temporal index is proximate to the initial epoch of motor operation, the initial rotor temperature 174, $\Theta_{TR,0}$, can be assumed. If rotor temperature estimation is not possible, the rated thermal operation can be assumed by maximizing the first order temperature coefficient.

The approximate slip 138, $s_{P,n}$, is the product of the real component of complex input power 134 and the rated slip, with polynomial rotor temperature compensation, in (Equation 46).

$$s_{P,n} = _{MAX}(_{MIN}(c_{T,m,0} + C_{T,m,1} \cdot (_{REAL}(p_{F,n}) \cdot s_{0,n}), 3 \cdot s_0), 0)$$ (Equation 46)

According to alternative aspects, the approximate slip 138 can be determined by other suitable methods including, but not limited to, extracting an estimate of an eccentricity frequency associated with an eccentricity harmonic.

4.3 The Mechanical Process

Figure 8:
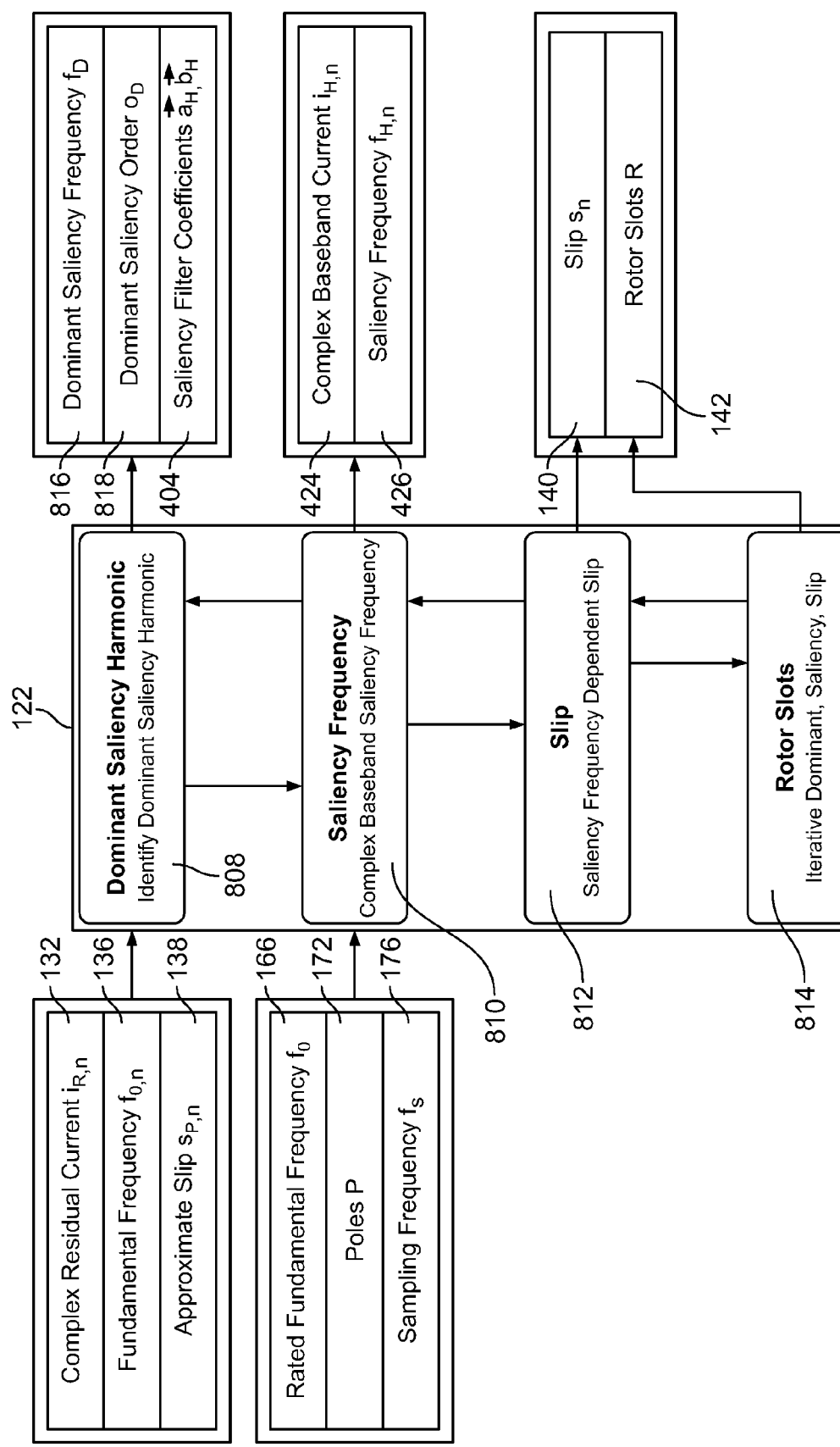
FIG. 8 is a data flow diagram of a Mechanical Analysis of FIG. 1.

Referring to FIG. 8, the Mechanical Analysis process 122 defines the rotor slots quantity 142, and extracts robust, accurate, transient estimates of slip 140. The Mechanical Analysis process 122 consists of a Dominant Saliency Harmonic process 808, a Saliency Frequency process 810, a Slip process 812, and/or a Rotor Slots Estimation process 814.

Figure 9:
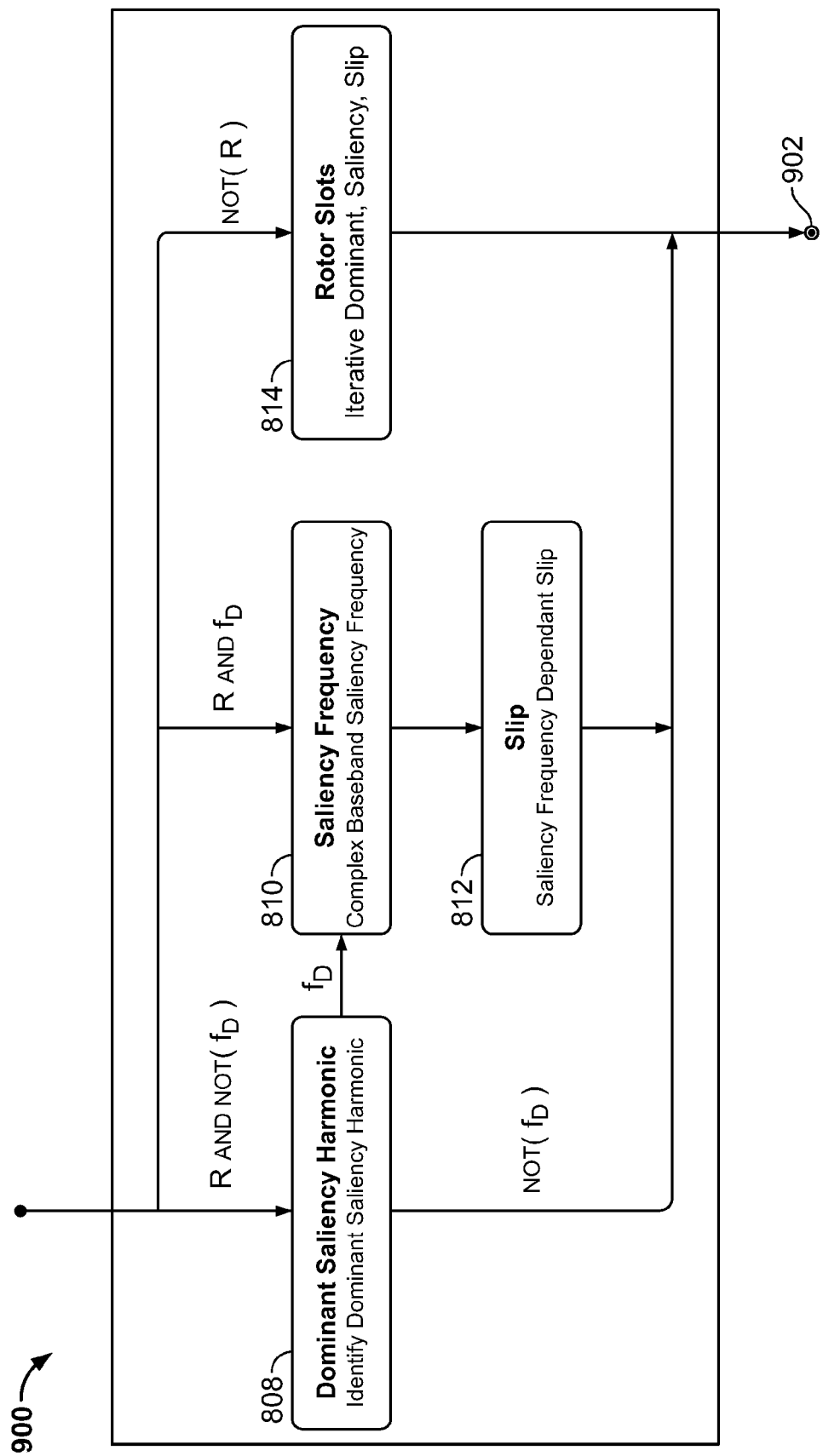
FIG. 9 is a control flow diagram of a Mechanical Analysis of FIG. 8.

Referring to FIG. 9, a control flow 900 for the mechanical analysis process 122 is illustrated, where the nature of the relationships between entities and processes are defined in terms of order and conditions of operation.

The order of operation is explicitly defined by arrows, indicating the direction of transition, from source to destination, consisting of actors or processes. Transitions can be absolute, defined by arrows without text enumeration, or conditional, defined by arrows with text defining specifically under what conditions the transition is supported. Text enumeration consists of logical statements, which can include some combination of operators including $_{AND}$, $_{OR}$, and $_{NOT}$, and data symbols.

Collections are delimited by encapsulating rectangles, containing collections of actors defined by rectangles, and processes defined by rounded rectangles. The epoch of control at a particular level of abstraction is represented by a filled circle at the origin of the initial transition. The source of the epoch transition is undefined, and not relevant. The terminus transaction 902 is represented by a filled circle encapsulated in an unfilled circle of larger diameter at the end of the final transaction. Precisely one epoch and one terminus transition 902 are defined per control flow.

Epoch of control flow transitions to one of three processes, depending upon whether the rotor slots quantity 142 and/or a dominant saliency frequency 816 are known.

The Dominant Saliency Harmonic process 808 is selected if the rotor slots quantity 142 is known and the dominant saliency frequency 816 is unknown. The Dominant Saliency Harmonic process 808 transitions to the Saliency Frequency process 810, if the dominant saliency frequency 816 is known, and otherwise transitions to the terminus of control flow 902.

The Saliency Frequency process 810 is selected if the rotor slots quantity 142 and the dominant saliency frequency 816 are known. The Saliency Frequency process 810 transitions to the Slip process 812. The Slip process 812 transitions to the terminus of the control flow 902.

The Rotor Slots Estimation process 814 is selected if the rotor slots quantity 142 is unknown. The Rotor Slots Estimation process 814 transitions to the terminus of the control flow 902.

4.3.1 The Dominant Saliency Harmonic Process

Figure 10A:
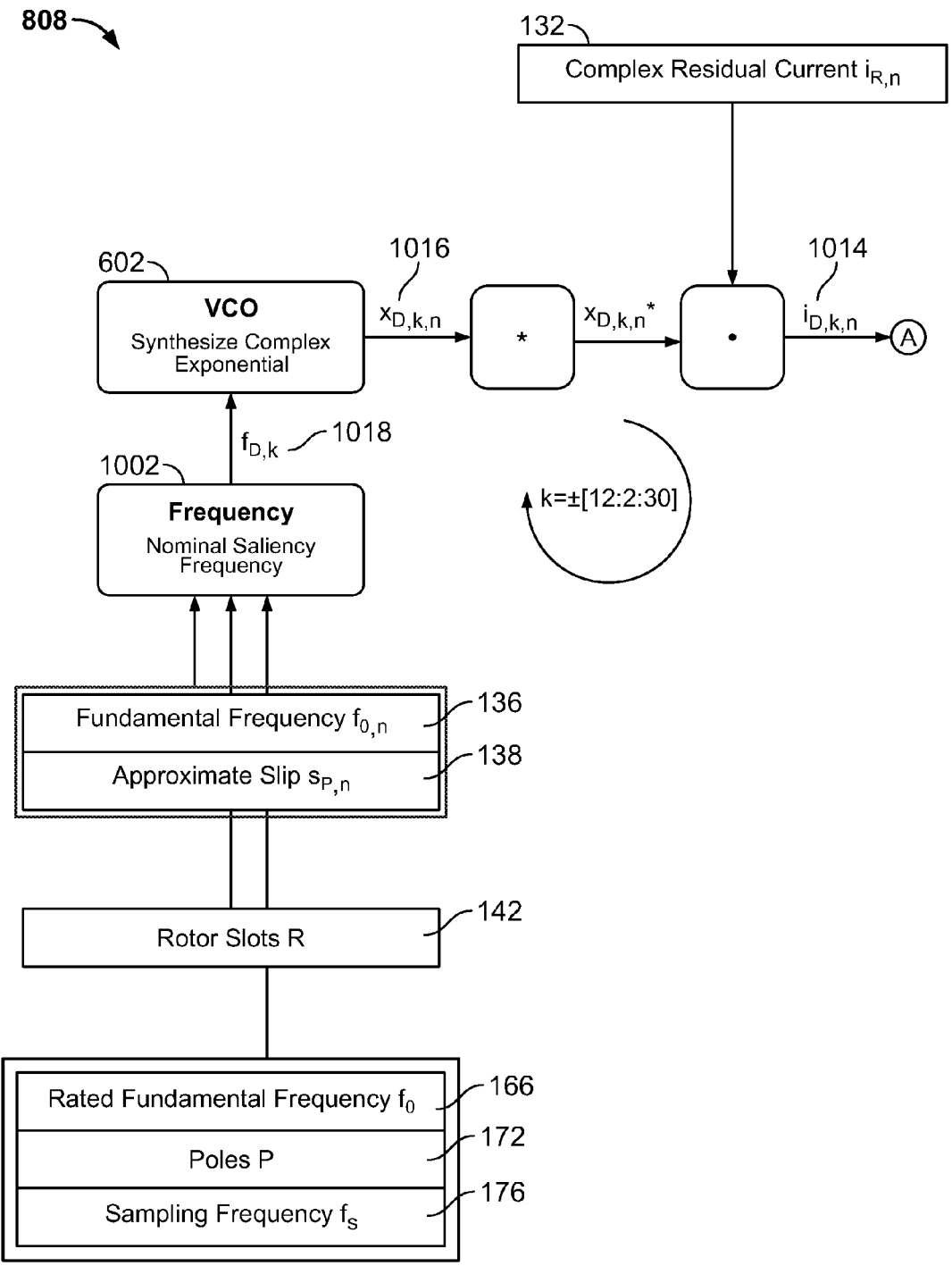
FIGS. 10a and 10b collectively are a flow chart diagram of an architecture for identifying a dominant saliency harmonic.
Figure 10B:
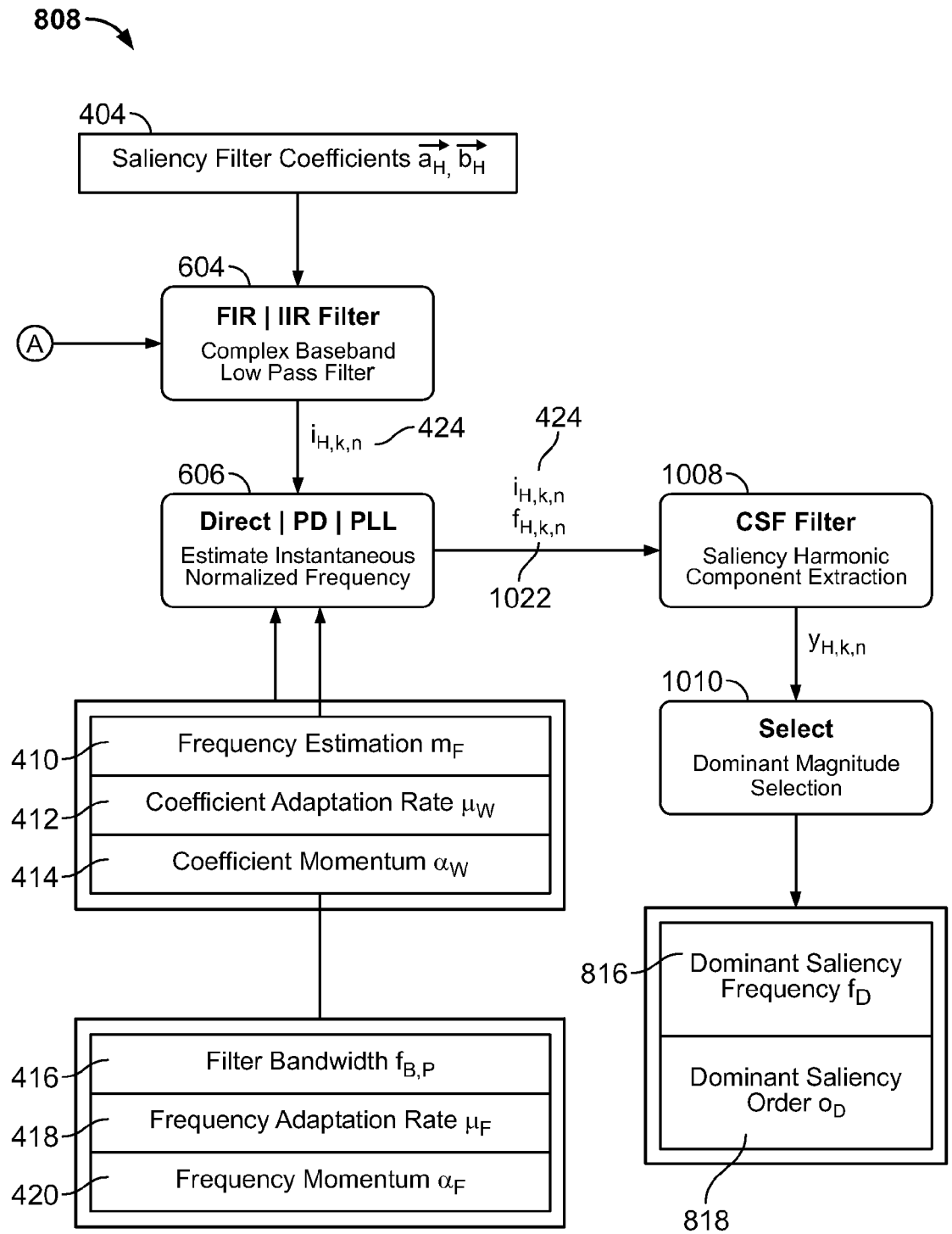

Referring to FIGS. 10A and 10B, the Dominant Saliency Harmonic process 808, $_{DOMINANT\ SALIENCY\ HARMONIC}$, identifies the dominant saliency frequency 816, a dominant saliency order 818 and saliency filter coefficients 404 as a function of the complex residual current 132, the fundamental frequency 136, the approximate slip 138, the rotor slots 142 and the poles 172, in (Equation 47).

$$[f_D, o_D, \vec{a}_H, \vec{b}_H] = _{DOMINANT\ SALIENCY\ HARMONIC}(i_{R,n}, f_{0,n}, s_{P,n}, R, P) \quad \text{(Equation 47)}$$

$f_D$ Dominant Saliency Frequency 816.
$o_D$ Dominant Saliency Order 818.
$\vec{a}_H, \vec{b}_H$ Saliency Filter Coefficients 404.
$i_{R,n}$ Complex Residual Current 132.
$f_{0,n}$ Fundamental Frequency 136.
$s_{P,n}$ Approximate Slip 138.
R Rotor Slots 142.
P Poles 172.

Saliency harmonics present in the complex residual current 132 are identified and evaluated to define the highest quality observable, or dominant saliency harmonic 816. The magnitude and relative proximate noise levels of a saliency harmonic vary with motor geometry and load conditions. Bandwidth constraints imposed by limiting the sampling frequency to a minimally sufficient practical rate reduce the set of observable saliency harmonics.

A set of frequency bands are defined, centered on even integral multiples of the fundamental frequency 136, with bandwidth equal to twice the fundamental frequency 136. It is possible for a saliency harmonic to be observed in each frequency band in precisely one instance, or not at all. A unique saliency harmonic order is also defined for each frequency band, as a function of frequency index, or integral fundamental frequency multiplier corresponding to the center of the band, and motor geometry.

The dominant saliency frequency 816 is defined as the frequency of the highest quality observable saliency harmonic during motor operation in rated conditions. The dominant saliency order 818 corresponds to the band in which the dominant saliency harmonic exists. A dominant saliency range is the bandwidth of a saliency harmonic over some specific practical range of operating conditions, which is useful in defining the coefficients of a band limiting filter used to reduce interference in saliency frequency estimation.

The dominant saliency harmonic can be identified through the application of a temporal analysis method, iterating over a limited subset of frequency bands of interest. The process consists of demodulating each candidate saliency harmonic to extract a candidate saliency frequency. Each candidate saliency frequency is analyzed to determine whether the corresponding candidate saliency harmonic should be excluded from further consideration. The remaining candidate saliency harmonics are identified as saliency harmonics having corresponding saliency frequencies 1022. The magnitude of each saliency harmonic is compared to select the dominant saliency harmonic. Identification of the dominant saliency harmonic results in retention of the dominant saliency frequency 816 and the dominant saliency order 818, and synthesis and retention of the saliency filter coefficients 404.

Complex conjugate symmetry does not apply, as the complex residual current 132 is not symmetric, and no a priori knowledge is available to infer a probability of identification of the dominant saliency harmonic, with respect to a frequency band. The resulting method is one of exhaustive search, excluding only bands known to contain significant supply or load related interference sources.

A demodulation process applies a VCO 602 to mix a nominal saliency frequency of interest 1018 in the complex residual current 132 to a complex baseband, or a zero nominal frequency. A nominal saliency frequency 1018 corresponds to the expected saliency frequency during motor operation in rated conditions. The mixed current 1014 is band limited by, for example, a FIR or an IIR filter 604 to produce a complex baseband current 424. To complete the demodulation process, a residual frequency contained in the complex baseband current 424 is extracted, resulting in an accurate saliency frequency estimate 1022. Suitable methods of iterative frequency estimation include, for example, Direct, PD, and PLL analysis.

Several of the bands may not contain an observable saliency harmonic, and the frequency 426 extracted from the complex baseband current 424 can be considered invalid if it is not sufficiently proximate to the expected saliency frequency associated with a specific motor 150 and load 152 condition. The Selection process 1010 identifies the dominant saliency frequency 816 by applying, for example, a CSF filter 1008 to estimate the magnitude of each saliency harmonic.

Contiguous sequences of the complex residual current 132, the fundamental frequency 136, and the approximate slip 138 are evaluated to identify the dominant saliency harmonic, by iteratively processing the sequences over a range of frequency bands of interest. The process is repeated for each harmonic index, $_k$, for the same sequences over a defined range. The range of the sample sequence, $\vec{u}$, has an epoch, n, at which the approximate slip 138 exceeds a minimum threshold, and the length of the range, N, is approximately equal to 2.0 seconds, in (Equation 48).

$$\vec{u} = \{[n:n+N-1]:s_{P,n} \geq 0.6 \cdot s_0 |_{N \geq 2 \cdot f_s}\} \quad \text{(Equation 48)}$$

4.3.1.1 Obtaining the Complex Baseband Current

A nominal saliency order, $o_{D,k}$, is expressed as a function of the pole quantity 172, the rotor slot quantity 142, and a harmonic index k. The harmonic index has a range in ±[12:2:30], corresponding to the frequency bands occurring on negative and positive even integral multiples of the normalized rated fundamental frequency, in (Equation 49).

$$O_{D,k} = \left(|k| - \text{ROUND}\left(\frac{R}{0.5 \cdot P}\right)\right) + \quad \text{(Equation 49)}$$
$$\text{NOT}\left(\text{AND}\left(\left||k| - \text{ROUND}\left(\frac{R}{0.5 \cdot P}\right)\right|, 1\right)\right)\Big|_{k=\pm[12:2:30]}$$

A nominal saliency frequency 1018, $f_{D,k}$, associated with the harmonic index $_k$, is a product of the normalized rated fundamental frequency and a scale factor defined in terms of the rated slip, the pole quantity 172, the rotor slot quantity 142, and the nominal saliency order, in (Equation 50).

$$f_{D,k} = \text{SIGN}(k) \cdot \frac{f_0}{f_N} \cdot \left((1 - s_0) \cdot \left(\frac{R}{0.5 \cdot P}\right) + o_{D,k}\right)\Big|_{k=\pm[12:2:30]} \quad \text{(Equation 50)}$$

A complex incident signal 1016, $x_{D,k,n}$, is synthesized by the VCO 602 at a nominal saliency frequency 1018, $f_{D,k}$, in (Equation 51).

$$x_{D,k,n} = VCO(f_{D,k})|_{k=\pm[12:2:30]} \quad \text{(Equation 51)}$$

A complex mixed current 1014, $i_{D,k,n}$, is formed as the product of an instance of the conjugate of the complex incident signal 1016 and the complex residual current 132, in (Equation 52).

$$i_{D,k,n} = i_{R,n} \cdot x^*_{D,k,n}|_{k=\pm[12:2:30]} \quad \text{(Equation 52)}$$

The saliency filter coefficients 404, $\vec{a}_H$ and $\vec{b}_H$, are designed with a saliency filter bandwidth, $f_{B,H}$, equal to ½ the expected frequency range of a saliency harmonic operating over the range of normalized power in [0.0, 2.0], in (Equation 53).

$$f_{B,H} = \frac{f_0}{f_N} \cdot \frac{s_0 \cdot R}{0.5 \cdot P} \quad \text{(Equation 53)}$$

Suitable filters include, for example, linear phase filters such as various FIR designs with memory depth equal to approximately ¼ second, and IIR Bessel filters with comparable performance. The filter architecture selection is dependent largely upon processor and memory resources, design complexity, and numerical stability. IIR and FIR filter design techniques are diverse, well-known, and beyond the scope this disclosure.

A designer can elect to define static coefficient sets, or dynamically synthesize coefficients on demand. Static coefficient sets can be defined and analyzed a priori. IIR filters offer computational advantages and support compact coefficient set definitions. IIR filter stability and design for constant group delay are not trivial, but coefficients can be designed and verified offline. FIR filters are relatively simple to design statically or dynamically, by employing windowing techniques, and they demonstrate trivial stability. FIR filter coefficients are neither compact nor computationally efficient.

The Saliency filter coefficients 404 are applied to filter an instance of the complex mixed current 1014, producing a complex baseband current 424, $i_{H,k,n}$, in (Equation 54).

$$\vec{i}_{H,k,u} = IIR(\vec{i}_{D,k,u}, \vec{a}_H, \vec{b}_H)|_{k=\pm[12:2:30]} \quad \text{(Equation 54)}$$

4.3.1.2 Estimating the Saliency Frequency of Each Saliency Harmonic

A demodulation process removes the nominal saliency frequency 1018 by mixing the complex residual current 132 by the conjugate of the complex exponential signal at the nominal saliency frequency 1018. The complex mixed current 1014 is band limited through application of a saliency filter 604 to isolate the remaining residual saliency harmonic from interference sources, producing the complex baseband current 424. The demodulation process is completed by estimating the residual saliency frequency in the complex baseband current 424. Residual frequency estimation extracts the instantaneous frequency of the saliency harmonic, relative to a nominal saliency harmonic frequency 1018. The saliency frequency 1022 is the sum of the nominal saliency frequency 1018 and the residual saliency frequency.

Alternative methods 410, $m_F$, of estimating the saliency frequency 1022 include, but are not limited to, Direct, PD, and PLL methods. As previously described, these methods provide the flexibility to increase precision at the expense of computational complexity and frequency tracking rate, expanding the practical applicability of the solution. It is contemplated that any other suitable method of estimating the saliency frequency 1022 can be employed including those methods previously described with respect to estimation of the fundamental frequency 136.

4.3.1.2.1 The Direct Method of Estimating Each Saliency Frequency

A direct estimation of residual saliency frequency is the discrete derivative of the complex baseband current phase.

A residual saliency phase, $\phi_{H,k,n}$, is the normalized phase of the complex baseband current 424, estimated through application of a contiguous arctangent function, in (Equation 55).

$$\varphi_{H,k,n} = TAN^{-1}\left(\frac{IMAG(i_{H,k,n})}{REAL(i_{H,k,n})}\right) \cdot \frac{1}{\pi} + \quad \text{(Equation 55)}$$
$$0.5 \cdot (1 - \text{SIGN}(REAL(i_{H,k,n}))) \cdot \text{SIGN}(IMAG(i_{H,k,n}))|_{k=\pm[12:2:30]}$$

The normalized phase is extracted by an inverse tangent, $TAN^{-1}$, applied to the ratio of imaginary and real complex components, scaled by the inverse of π to normalize the result, and adjusted to reconcile the quadrant of operation. An arctangent method can be practically defined in terms of polynomial approximation, indexed table, or some combined method.

The residual saliency frequency, $f_{R,k,n}$, is the discrete derivative of the residual saliency phase, in (Equation 56).

$$f_{R,k,n} = \frac{d}{dn}(\varphi_{H,k,n}) \approx \varphi_{H,k,n} - \varphi_{H,k,n-1}\Big|_{k=\pm[12:2:30]} \quad \text{(Equation 56)}$$

The saliency frequency 1022, $f_{H,k,n}$, is the sum of the nominal saliency frequency 1018 and the residual saliency frequency, in (Equation 57).

$$f_{H,k,n} = f_{D,k} + f_{R,k,n} \approx f_{D,k} + \varphi_{H,k,n} - \varphi_{H,k,n-1}\big|_{k=\pm[12:2:30]} \quad \text{(Equation 57)}$$

The Direct method frequency estimates are equivalent to the superposition of independent estimates of all complex baseband current frequency components, over the saliency filter bandwidth. The Direct method forms an aggregate and biased estimate of the saliency frequency 1022. In an ideal environment, a saliency harmonic can dominate the frequency response of the complex baseband signal 424, resulting in a relatively unbiased frequency estimate. Practically, the saliency filter bandwidth generally contains significant interference which can result in unacceptable performance in many environments.

4.3.1.2.2 The PD Method of Estimating Each Saliency Frequency

As previously discussed, the PD method offers improved accuracy, relative to the Direct method, at a cost of a modest latency and a minimal reduction in the frequency tracking rate.

The residual saliency frequency, $f_{R,k,n}$, is estimated from the application of a PD to the complex baseband current 424, in (Equation 58).

$$f_{R,k,n} = PD(i_{H,k,n}, \mu_W, \alpha_W)\big|_{k=\pm[12:2:30]} \quad \text{(Equation 58)}$$

The saliency frequency 1022, $f_{H,k,n}$, is the sum of nominal saliency frequency 1018 and residual saliency frequency, in (Equation 59).

$$ff_{H,k,n} = f_{D,k} + f_{R,k,n} = f_{D,k} + PD(i_{H,k,n}, \mu_W, \alpha_W)\big|_{k=\pm[12:2:30]} \quad \text{(Equation 59)}$$

4.3.1.2.3 The PLL Method of Estimating Each Saliency Frequency

Similarly, the PLL method offers improved accuracy relative to the Direct and PD methods at a further cost of latency and the frequency tracking rate. The complex baseband current 424 is a convenient representation of a complex signal with zero nominal frequency. The residual frequency, or estimation error, of the complex baseband signal 424 is estimated by a PD, and employed in adaptation of the synthesis frequency. The residual saliency frequency estimated by the PD is used to iteratively adapt the VCO synthesis frequency, forcing the complex mixed signal to remain at a nominal zero frequency, centered in the complex baseband.

A PLL filter bandwidth 2504, $f_{B,P}$, can be defined according to the nature of the complex baseband current 424 environment. The bandwidth can be increased, in return for significant reduction in latency and improved frequency tracking rate, at the cost of increased aggregate frequency estimation error. Unity bandwidth selection, which can be appropriate in environments with limited in-band interference, effectively excises the PLL IIR filter 2100, eliminating latency contributions by the filter and maximizing frequency tracking rate. Nominal PLL filter bandwidth 2504 is 1.0.

The PLL convergence, misadjustment, frequency tracking rate, and bandwidth are dependent upon selection of the adaptive parameters, which can be judiciously defined to optimally support a specific environment. The nominal coefficient adaptation rate 412 and the nominal coefficient momentum 414 are 5.0e−3 and zero, respectively. The nominal frequency adaptation rate 418 and the nominal frequency momentum 420 are 2.0e−3 and 3.5e−1, respectively.

An expected saliency frequency, $f_{X,k,n}$, is the anticipated saliency frequency expressed as a function of approximate slip 138 and motor geometry, in (Equation 60).

$$f_{X,k,n} = SIGN(k) \cdot f_{0,n} \cdot \left( \frac{(1-s_{P,n}) \cdot}{\left(\frac{R}{0.5 \cdot P}\right)} + o_{D,k} \right)\Bigg|_{k=\pm[12:2:30]} \quad \text{(Equation 60)}$$

The residual saliency frequency, $f_{R,k,n}$, is estimated from the application of a PLL to the complex baseband current 424, initialized to the expected residual saliency frequency and selected PLL filter bandwidth, in (Equation 61).

$$f_{R,k,n} = PLL(i_{H,k,n}, f_{R,k,0}, f_{B,P}, \mu_W, \alpha_W, \mu_F, \alpha_F)\big|_{k=\pm[12:2:30]} \quad \text{(Equation 61)}$$

An initial PLL frequency, $f_{R,k,0}$, is the expected residual saliency frequency, or the difference of expected saliency frequency and nominal saliency frequency 1018, in (Equation 62).

$$f_{R,k,0} = f_{X,k,0} - f_{D,k}\big|_{k=\pm[12:2:30]} \quad \text{(Equation 62)}$$

The saliency frequency 1022, $f_{H,k,n}$, is the sum of nominal saliency frequency 1018 and residual saliency frequency, in (Equation 63).

$$f_{H,k,n} = f_{D,k} + f_{R,k,n} = f_{D,k} + PLL(i_{H,k,n}, f_{R,k,0}, f_{B,P}, \mu_W, \alpha_W, \mu_F, \alpha_F)\big|_{k=\pm[12:2:30]} \quad \text{(Equation 63)}$$

4.3.1.3 Identifying the Dominant Saliency Harmonic

If the residual saliency frequency at convergence, $f_{R,k}$, exceeds the bounds of the saliency filter bandwidth, the potential saliency frequency estimate corresponding to the harmonic index, $k$, is declared invalid and the frequency band is eliminated from subsequent evaluation, in (Equation 64).

$$f_{R,k} \underset{\lim m \to u_{N-1}}{=} \{|f_{R,k,m}| : |f_{R,k,m}| \leq f_{B,H}|_{k=\pm[12:2:30]}\} \quad \text{(Equation 64)}$$
$$N \geq 2 \cdot f_S$$

If the saliency frequency error at convergence, $e_{H,k}$ or absolute difference of the potential saliency frequency and the expected saliency frequency, exceeds a defined normalized frequency limit, the saliency frequency estimate corresponding to the harmonic index, $k$, is declared invalid and the frequency band is eliminated from subsequent evaluation, in (Equation 65).

$$e_{H,k} \underset{\lim m \to u_{N-1}}{=} \quad \text{(Equation 65)}$$
$$\left\{ |f_{H,k,m} - f_{X,k,m}| : |f_{H,k,m} - f_{X,k,m}| \leq 0.1 \cdot \frac{f_0}{f_H} \Bigg|_{\substack{k=\pm[12:2:30] \\ N \geq 2 \cdot f_S}} \right\}$$

The frequency bands are evaluated to select the dominant saliency harmonic from the remaining candidates. Subsequent to saliency frequency estimation and error criterion evaluation, the complex baseband current 424 is filtered, for example, using a CSF filter 1008 to extract a magnitude estimate 1010 of the saliency harmonic.

A CSF filter synthesis frequency, $f_{R,k}$, is the estimated residual saliency frequency, evaluated at a period to exceed that needed for convergence of the estimate, in (Equation 66).

$$f_{R,k} \lim_{m \to u_{N-1}} f_{R,k,m} \big|_{\substack{k=\pm[12:2:30] \\ N \geq 2 \cdot f_S}} \quad \text{(Equation 66)}$$

Adaptive parameters can be judiciously defined to optimally support a specific environment. The nominal coefficient adaptation rate 418 and the coefficient momentum 420 are 1.0e−3 and zero, respectively.

A saliency reference, $\vec{y}_{H,k,u}$, is the CSF reference signal, operating on the complex baseband current 424, or the extracted saliency harmonic at a specific harmonic index, in (Equation 67).

$$\vec{y}_{H,k,u} = CSF\left(\vec{i}_{H,k,u}, f_{R,k}, \mu_W, \alpha_W\right)\big|_{\substack{k=\pm[12:2:30] \\ N \geq 2 \cdot f_S}} \quad \text{(Equation 67)}$$

An exponential decay filter is a $1^{st}$ order IIR filter with coefficients directly specified from the exponential decay filter bandwidth, $f_{B,E}$, in (Equation 68).

$$f_{B,E} \approx \frac{f_0}{f_N} \quad \text{(Equation 68)}$$

A saliency magnitude, $y_{H,k}$, is estimated by application of an exponential decay IIR filter, in (Equation 69).

$$y_{H,k} \lim_{m \to u_{N-1}} (1-f_{B,E}) \cdot |y_{H,k,m-1}| + f_{B,E} \cdot |y_{H,k,m}| = \quad \text{(Equation 69)}$$
$$IIR(|y_{H,k,m}|, 1-f_{B,E}, f_{B,E})\big|_{\substack{k=\pm[12:2:30] \\ N \geq 2 \cdot f_S}}$$

The dominant saliency frequency 816, $f_D$, is the nominal saliency frequency 1018 corresponding to the harmonic index, $k$, associated with the maximum observed saliency magnitude, in (Equation 70).

$$f_D = f_{D,k} \big|_{\substack{k=\pm[12:2:30] \\ y_{H,k} \geq y_{H,j}, j \neq k}} \quad \text{(Equation 70)}$$

The dominant saliency order 818, $O_D$, is the nominal saliency order corresponding to the harmonic index, $k$, associated with the dominant saliency frequency 816, in (Equation 71).

$$o_D = o_{D,k} \big|_{\substack{k=\pm[12:2:30] \\ y_{H,k} \geq y_{H,j}, j \neq k}} \quad \text{(Equation 71)}$$

Figure 11:
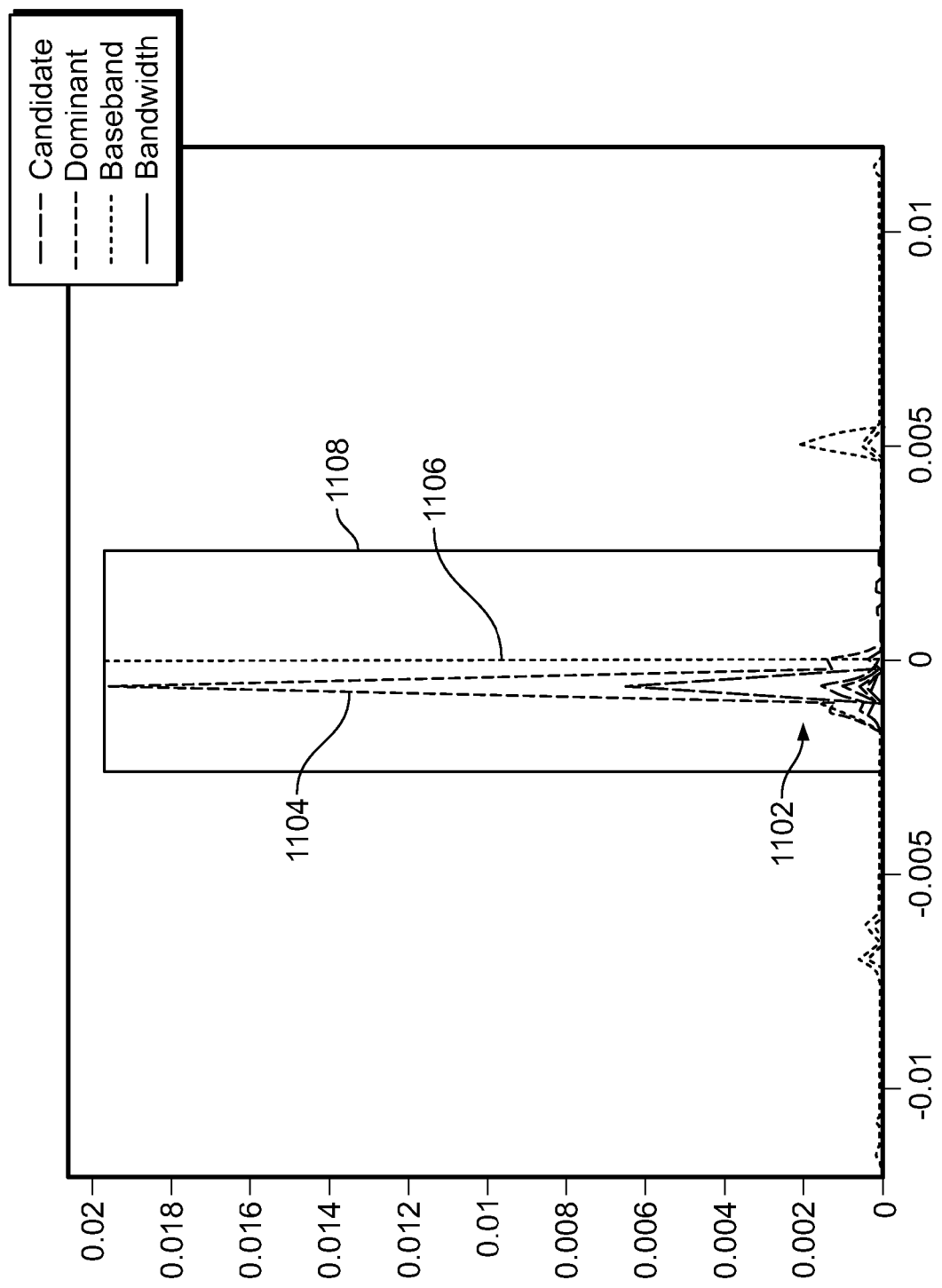
FIG. 11 is a chart depicting saliency harmonic frequency responses corresponding to a plurality of complex baseband currents of a motor.

In FIG. 11, the frequency response corresponding to each complex baseband current is illustrated, for a 20 HP, 4 pole, 40 rotor slots motor operating in near rated conditions, for a period of 1.0 second, at a sampling frequency of 10 kHz. The candidate frequency responses 1102 result from complex baseband currents that were produced by demodulating the saliency harmonic in the complex baseband current at each harmonic index, $k$. The dominant frequency response 1104 results from the selected complex baseband current, corresponding to the dominant saliency harmonic, which was identified at a harmonic index of 18.

FIG. 11 further depicts the complex baseband 1106 for relative comparison, and the bandwidth of the saliency filter. The dominant saliency frequency was identified at a normalized frequency of 0.22287, corresponding to 1114.3 Hz, or 18.572 times the rated fundamental frequency 166 of 60 Hz. The saliency filter bandwidth 1108 was defined over a normalized frequency range of ±2.57e−3, or ±12.8 Hz, relative to the complex baseband. Load power is slightly higher than rated power, as the residual saliency frequency is negative, corresponding to a higher modulation frequency than expected under nominal rated conditions, as expressed by the dominant saliency frequency.

The selection of the highest quality observable saliency harmonic maximizes the signal-noise ratio of the signal of interest. The rejection of potential interference sources, depicted in unfiltered demodulated traces, is apparent.

Out-of-band interference sources can be eliminated by expressing the saliency filter bandwidth as a function of motor geometry to correspond to the expected range of operating conditions. Advantageously, this dynamic motor-specific interference rejection supports simplified saliency frequency estimation, and improved estimation accuracy.

4.3.2 The Saliency Frequency Process

Figure 13:
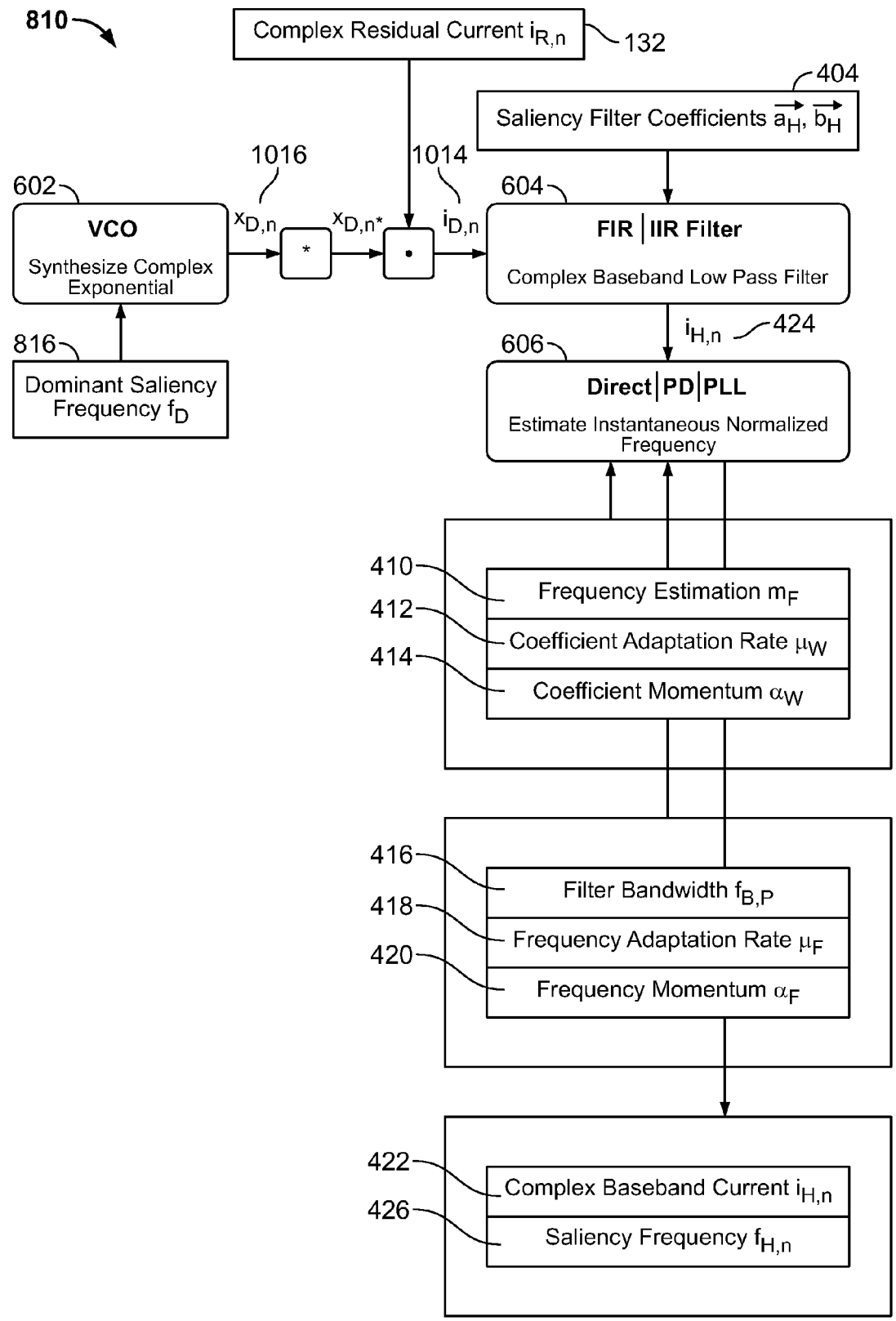
FIG. 13 is a flow chart diagram of an architecture for estimating a saliency frequency according to some aspects.

Referring to FIG. 13, the Saliency Frequency process 810, $SALIENCY\ FREQUENCY$, estimates the saliency frequency 426 of the dominant saliency harmonic, as a function of the complex residual current 132, the dominant saliency frequency 816, and the saliency filter coefficients 404, in (Equation 72).

$$f_{H,n} = SALIENCY\ FREQUENCY(i_{R,n}, f_D, \vec{a}_H, \vec{b}_H) \quad \text{(Equation 72)}$$

$f_{H,n}$ Saliency Frequency 426.
$i_{R,n}$ Complex Residual Current 132.
$f_D$ Dominant Saliency Frequency 816.
$\vec{a}_H, \vec{b}_H$ Saliency Filter Coefficients 404.

PLL initial frequency dependencies on fundamental frequency 136, approximate slip 138, dominant saliency order, rotor slots 142 and poles are not explicitly listed to improve the clarity of the description.

According to some aspects, the Saliency Frequency process 810 architecture is a simplified modification of the Dominant Saliency Harmonic process 808 architecture, consisting of the saliency frequency estimation functionality. Synthesis frequency is constant, not iterative, and equal to the dominant saliency frequency 816, and selection is unnecessary and omitted.

A demodulation process applies a VCO 602 to mix the dominant saliency frequency 816 in the complex residual current 132 to a complex baseband, or a zero nominal frequency. A FIR or an IIR filter 604 is applied to band limit the mixed current 1014, producing complex baseband current 424. To complete the demodulation process, the residual frequency contained in the complex baseband current 424 is extracted, resulting in an accurate saliency frequency estimate 426. Alternative methods of iterative frequency estimation include, for example, Direct, PD, and PLL analysis. Saliency frequency estimation is continuous and iterative over a period of uninterrupted motor operation. Initialization and convergence occurs subsequent to each motor start.

According to other aspects, any other suitable method for estimating the saliency frequency can be employed including any methods previously described for estimating any frequency.

4.3.2.1 Obtaining the Baseband Current

The complex incident signal 1016, $X_{D,n}$, is synthesized by the VCO 602 at the dominant saliency frequency 816, $f_D$, in (Equation 74).

$$x_{D,n} = VCO(f_D) \quad \text{(Equation 74)}$$

The complex mixed current 1014, $i_{D,n}$, is formed as the product of the conjugate of the complex incident signal and complex residual current 132, in (Equation 75).

$$i_{D,n} = i_{R,n} x^*_{D,n} \quad \text{(Equation 75)}$$

The saliency filter coefficients 404 are applied to filter the complex mixed current 1014, producing complex baseband current 424, $i_{H,n}$, in (Equation 76).

$$i_{H,n} = IIR(i_{D,n}, \vec{a}_H, \vec{b}_H) \quad \text{(Equation 76)}$$

4.3.2.2 Estimating the Saliency Frequency

As described above with respect to the Dominant Saliency Harmonic process 808, a demodulation process removes the dominant saliency frequency 816 by mixing the complex residual current 132 by the conjugate of the complex exponential signal at the dominant saliency frequency 816. The complex mixed current 1014 is band limited through application of a saliency filter 604 to isolate the remaining residual saliency harmonic from interference sources, producing the complex baseband current 424. Demodulation is completed by estimating the residual saliency frequency in the complex baseband current 424. The saliency frequency 426 is the sum of the dominant saliency frequency 816 and the residual saliency frequency.

The saliency frequency 426 can be estimated by any suitable method including, but not limited to, Direct, PD, and PLL alternative methods. The Direct, PD, and PLL methods are implemented as previously described above with respect to the Dominant Saliency Harmonic process 808 and Equations 55-63, except saliency frequency synthesis is constant and equal to the dominant saliency frequency instead of iterative over selected potential frequencies.

4.3.2.2.1 The Direct Method of Estimating the Saliency Frequency

Thus, the residual saliency phase, $\phi_{H,n}$, is the normalized phase of the complex baseband current 424, estimated through application of a contiguous arctangent function, in (Equation 77).

$$\varphi_{H,k,n} = TAN^{-1}\left(\frac{IMAG(i_{H,k,n})}{REAL(i_{H,k,n})}\right) \cdot \frac{1}{\pi} + \quad \text{(Equation 77)}$$
$$0.5 \cdot (1 - SIGN(REAL(i_{H,k,n}))) \cdot SIGN(IMAG(i_{H,k,n}))|_{k=\pm[1\,2\,2\,30]}$$

The residual saliency frequency, $f_{R,n}$, is the discrete derivative of the residual saliency phase, in (Equation 78).

$$f_{R,n} = \frac{d}{dn}(\varphi_{H,n}) \approx \varphi_{H,n} - \varphi_{H,n-1} \quad \text{(Equation 78)}$$

The saliency frequency 426, $f_{H,n}$, is the sum of dominant saliency frequency 816 and residual saliency frequency, in (Equation 79).

$$f_{H,n} = f_D + f_{R,n} = f_D + \frac{d}{dn}(\varphi_{H,n}) \approx f_D + \varphi_{H,n} - \varphi_{H,n-1} \quad \text{(Equation 79)}$$

4.3.2.2.2. The PD Method of Estimating the Saliency Frequency

The residual saliency frequency, $f_{R,n}$, is estimated from the application of a PD to the complex baseband current 424, in (Equation 80).

$$f_{R,n} = PD(i_{H,n}, \mu_W, \alpha_W) \quad \text{(Equation 80)}$$

Saliency frequency 426, $f_{H,n}$, is the sum of dominant saliency frequency and residual saliency frequency, in (Equation 81).

$$f_{H,n} = f_D + f_{R,n} = f_D + PD(i_{H,n}, \mu_W, \alpha_W) \quad \text{(Equation 81)}$$

4.3.2.2.3 The PLL Method of Estimating the Saliency Frequency

The nominal PLL filter bandwidth 2504, $f_{B,p}$, is 1.0. The nominal coefficient adaptation rate 412 and the coefficient momentum 414 are 5.0e−3 and zero, respectively. The nominal frequency adaptation rate 418 and the frequency momentum 420 are 2.0e−3 and 3.5e−1, respectively.

The expected saliency frequency, $f_{X,n}$, is the anticipated saliency frequency derived from approximate slip 138 and motor geometry, in (Equation 82).

$$f_{X,n} = SIGN(f_D) \cdot f_{0,n} \cdot \left[(1 - s_{P,n}) \cdot \left(\frac{R}{0.5 \cdot P}\right) + o_D\right] \quad \text{(Equation 82)}$$

The residual saliency frequency, $f_{R,n}$, is estimated from the application of a PLL to the complex baseband current 424, initialized to the expected residual saliency frequency and the selected PLL filter bandwidth, in (Equation 83).

$$f_{R,n} = PLL(i_{H,n}, f_{R,0}, f_{B,P}, \mu_W, \alpha_W, \mu_F, \alpha_F) \quad \text{(Equation 83)}$$

An initial PLL frequency, $f_{R,0}$, is the expected residual saliency frequency, or the difference of the expected saliency frequency and the dominant saliency frequency 816, in (Equation 84).

$$f_{R,0} = f_{X,0} - f_D \quad \text{(Equation 84)}$$

The saliency frequency 426, $f_{H,n}$, is the sum of dominant saliency frequency 816 and residual saliency frequency, in (Equation 85).

$$f_{H,n} = f_D + f_{R,n} = f_D + PLL(i_{H,n}, f_{R,0}, f_{B,P}, \mu_W, \alpha_W, \mu_F, \alpha_F) \quad \text{(Equation 85)}$$

Figure 12:
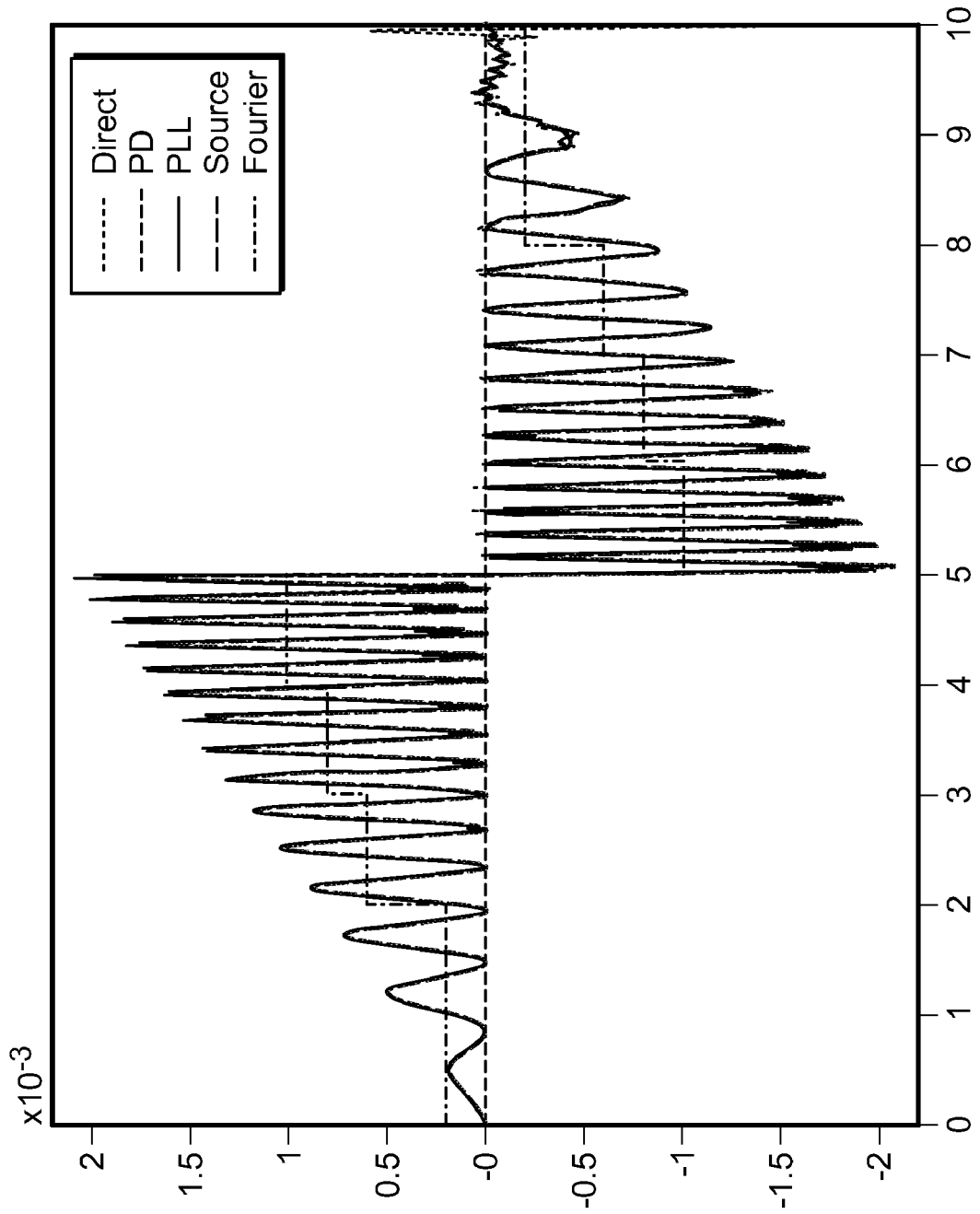
FIG. 12 is a chart depicting a transient residual saliency frequency estimation for a synthetic complex baseband current signal, for a period of 10.0 seconds, at a sampling frequency of 10 kHz.

Referring to FIG. 12, a transient residual saliency frequency estimation is illustrated for a synthetic complex baseband current 424 signal, for a period of 10.0 seconds, at a sampling frequency of 10 kHz.

A complex exponential signal was synthesized with a time-varying instantaneous frequency which increased in both amplitude and frequency with time over a period of 5 seconds, followed by a corresponding decrease in amplitude and frequency over a period of 5 seconds. Random uniform noise and several complex exponential interference sources were introduced with increasing amplitude 5 seconds into the sequence, such that the noise power increased as the signal power decreased, resulting in a final signal-noise ratio of −40 dB.

The signal modulation is FM, though amplitude variation is defined which mimics the observed increase in saliency harmonic amplitude as a function of load 152, or input power. The synthetic residual saliency harmonic frequency is indicative of environments with modulated saliency harmonics, commonly observed in diverse loads 152 including, for example, compressors or regenerative drives.

The synthetic residual saliency frequency of the source signal and the results of the residual saliency frequency estimation performed using the Direct, the PD, and the PLL methods are indicated by dashed lines according to the legend of FIG. 12. A Fourier estimation, performed over contiguous one second periods of observation, is also shown as a solid line. The latencies associated with the estimation methods are reconciled to support direct comparison.

The PD and PLL methods demonstrate superior accuracy relative to the Direct method, especially in the presence of interference. The Fourier method is unable to observe the transient behavior in the signal, as it is decidedly not stationary over the period of observation. The Fourier transient response can only be improved at the expense of frequency resolution, though the method is incapable of simultaneously demonstrating both the transient response and accuracy demonstrated by the alternative transient estimation methods.

Figure 14:
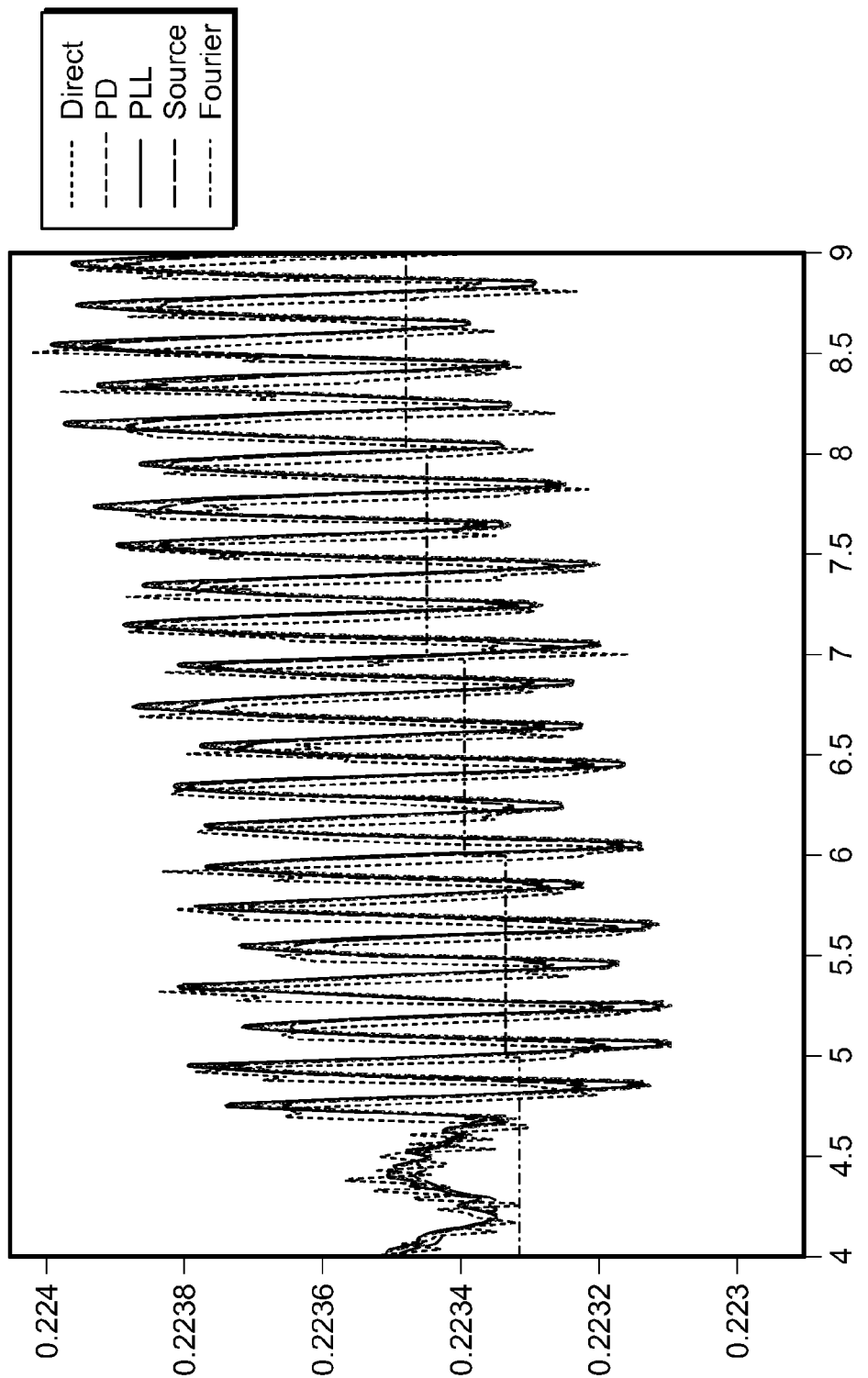
FIG. 14 is a chart depicting saliency frequency estimations, according to various aspects, for a motor operating in discontinuous load conditions.

Referring to FIG. 14, a saliency frequency estimation is illustrated, for a 20 HP, 4 pole, 40 rotor slots motor operating in discontinuous load conditions, for a period of 5.0 seconds, at a sampling frequency of 10 kHz. The Programmable Logic Control (PLC) of the load 152 was performed at a resolution of 20 ms. Linear step changes in load, a regenerative DC drive, were specified to occur at 2.5 second intervals.

The saliency frequency derived from an analog tachometer sensor, the results of frequency estimation performed using Direct, PD, and PLL methods, and the Fourier estimation, performed over contiguous one second periods of observation, are indicated according to the legend of FIG. 14. The latencies associated with the estimation methods are reconciled to support direct comparison.

The Fourier saliency harmonic frequency estimation clearly depicts a pattern generally corresponding to the discontinuous load conditions specified in PLC. It is apparent from the frequency extracted from the analog tachometer sensor that a significant modulation of the saliency harmonic exists, yet remains undetected by the Fourier method.

The saliency harmonic modulation has a frequency range of approximately 2 Hz, and varies over that range at a modulation rate of over 3 Hz. The PLL saliency harmonic frequency estimation method generally performs well in systems with frequency modulation rates exceeding 15 Hz, with superior accuracy relative to PD and Direct methods. In many environments, the PD method accuracy can be comparable to the PLL method, while providing a higher frequency tracking rate.

The PLL, PD and Direct methods demonstrate superior transient response and estimation accuracy, though a moderate increase in estimation noise is evident in the Direct method.

4.3.3 The Slip Process

The Slip process 812, SLIP, estimates slip 140 as a function of the saliency frequency 426, the dominant saliency order 818, the fundamental frequency 136, the rotor slots 142 and the poles 172, in (Equation 86).

$$s_n = SLIP(f_{H,n}, o_D, f_{0,n}, R, P)$$ (Equation 86)

$s_n$ Slip 140.
$f_{H,n}$ Saliency Frequency 426.
$o_D$ Dominant Saliency Order 818.
$f_{0,n}$ Fundamental Frequency 136.
R Rotor Slots 142.
P Poles 172.

The Slip process 812 can be directly expressed though a reorganization of the saliency frequency equation, based on availability of accurate saliency frequency 426 and fundamental frequency 136 estimation. The saliency frequency 426 is estimated from the dominant saliency harmonic, and is dependent upon the corresponding dominant saliency order 818.

The saliency harmonic and the fundamental frequency 136 estimation paths are examined to reconcile differences in latency resulting from asymmetric processing paths. The latencies are principally contributed by the filter operations, and can readily be estimated; however, delays associated with adaptive elements are dependent upon adaptive parameters and call for additional analysis or experimental quantification.

The estimated slip 140, $s_n$, is expressed as a function of the ratio of the saliency frequency 426 and the fundamental frequency 136, the dominant saliency order 818, the pole quantity 172, and the rotor slot quantity 142, bounded by a practical range, in (Equation 87).

$$s_n = MAX\left(MIN\left(1 - \left(\frac{|f_{H,n}|}{f_{0,n}} - o_D\right) \cdot \left(\frac{0.5 \cdot P}{R}\right), 3 \cdot s_0\right), 0\right)$$ (Equation 87)

Compensation for dynamic fundamental frequency 136 has proven to be desirable in the synthesis of a robust transient estimates of slip 140.

Figure 15:
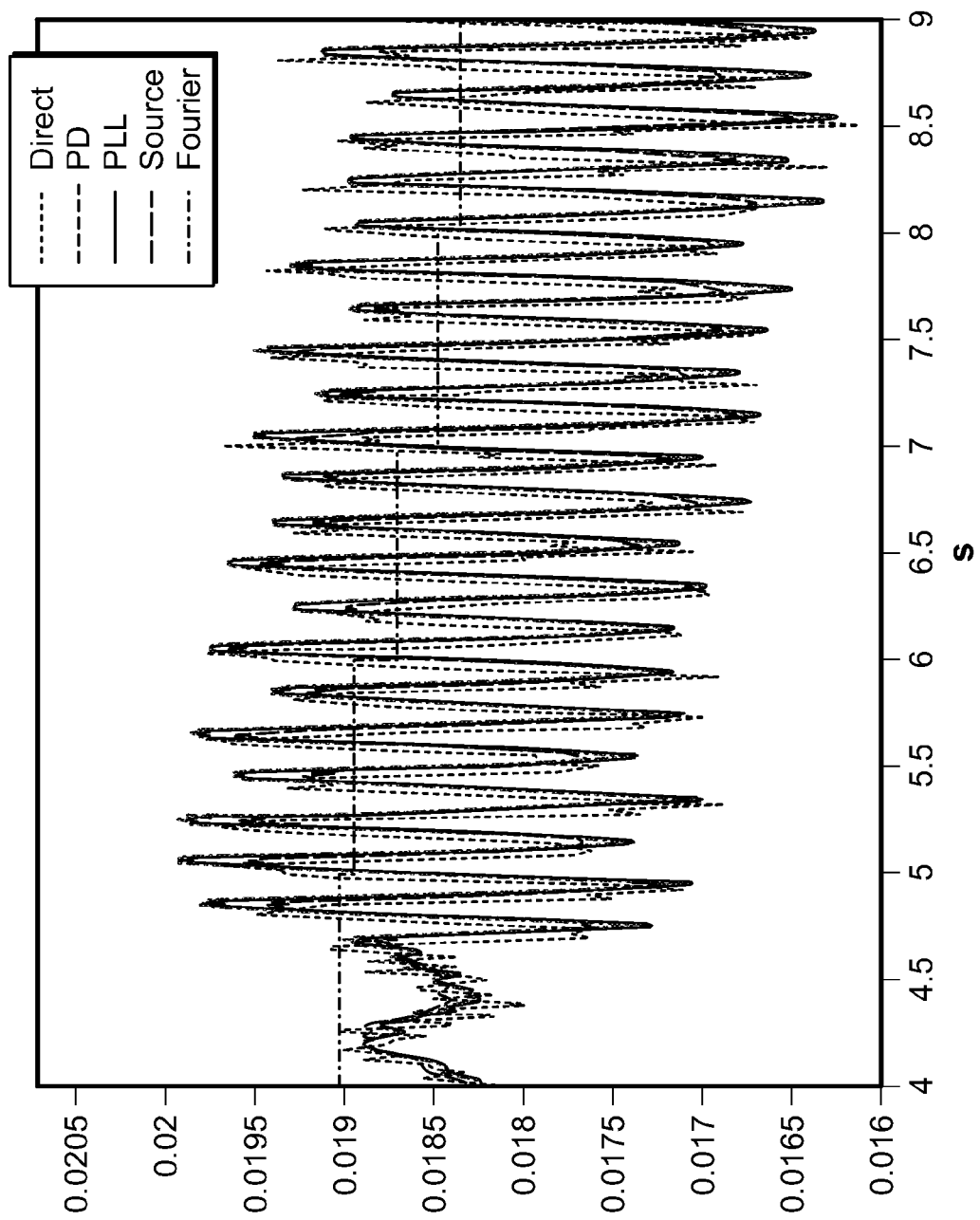
FIG. 15 is a chart depicting slip estimations, estimated according to various aspects, for a motor operating in discontinuous load conditions.

Referring to FIG. 15, an estimate of slip 140 is illustrated, for a 20 HP, 4 pole, 40 rotor slots motor operating in discontinuous load conditions, for a period of 5.0 seconds, at a sampling frequency of 10 kHz. The PLC of the load 152 was performed at a resolution of 20 ms. Linear step changes in the load 152, a regenerative DC drive, were specified to occur at 2.5 second intervals.

The slip derived from an analog tachometer sensor, the results of slip estimation performed using Direct, PD, and PLL methods, and the Fourier estimation, performed over contiguous one second periods of observation, are indicated according to the legend of FIG. 15. The latencies associated with the estimation methods are reconciled to support direct comparison.

The saliency frequency modulation apparent in frequency estimation is similarly reflected in slip 140. The PLL, the PD and the Direct methods demonstrate a superior transient response and estimation accuracy, though a moderate increase in estimation noise is evident in the Direct method. The analog sensor is calibrated for rated conditions, and measurements are considered relative. While the frequency response of the sensor is sufficient to accurately represent the transient structure of the slip 140, it is likely that the PLL, the PD and the Direct transient slip estimation methods demonstrate relatively higher precision than the sensor, over a broad range of operating conditions.

4.3.4 The Rotor Slots Estimation Process

Referring to FIG. 8, the Rotor Slots process 814, ROTOR SLOTS, estimates the rotor slots quantity 142, the dominant saliency frequency 816, the dominant saliency order 818, and the saliency filter coefficients 404, as a function of the complex residual current 132, the fundamental frequency 136, the approximate slip 138, and the poles 172, in (Equation 88).

$$[R, f_D, o_D, \vec{a}_H, \vec{b}_H] = ROTOR\ SLOTS(i_{R,n}, f_{0,n}, s_{P,n}, P)$$ (Equation 88)

R Rotor Slots 142.
$f_D$ Dominant Saliency Frequency 816.
$o_D$ Dominant Saliency Order 818.
$\vec{a}_H, \vec{b}_H$ Saliency Filter Coefficients 404.
$i_{R,n}$ Complex Residual Current 132.
$f_{0,n}$ Fundamental Frequency 136.
$s_{P,n}$ Approximate Slip 138.
P Poles 172.

The Rotor Slot process 814 extracts an estimate of static rotor slot quantity 142. The rotor slots quantity 142 can be determined by motor manufacturer data, a direct examination of the motor, or an analysis of electrical signals and motor parameters. Electrical analysis provides the most practical solution for rotor slots estimation, as manufacturer data is not readily available for all motors 150, and direct observation is intrusive, complex, and time-consuming.

The process of Rotor Slot estimation 814 is highly dependent upon the processes and architectures defined in the Approximate Slip process 312, the Dominant Saliency Harmonic process 808, the Saliency Frequency process 810, and the Slip process 812 or alternative processes employed to determine the approximate slip 138, the dominant saliency frequency 816, the estimated slip 140, or any other relevant quantities. The approximate slip 138 provides a reasonably accurate approximation of the actual slip, which serves as a reference signal that is independent of motor geometry and harmonic analysis. The dominant saliency harmonic identification, though dependent on rotor slots 142, is iteratively performed over a practical range of rotor slots. The saliency frequency 426 is estimated from the dominant saliency harmonic corresponding to each rotor slots index. The estimated slip 140, directly estimated for each saliency frequency 426, is compared with the approximate slip 138 to form a performance surface, or an aggregate slip estimation error as a function of the rotor slots 142.

Rotor Slot estimation 814 is relatively complex, though it offers considerable opportunity for reuse, with respect to previously described processes and architectures, and can be simply and clearly defined in those terms. The rotor slots 142 describe a static quantity, based on motor geometry, which is evaluated until an estimate is identified with confidence. The Rotor Slots Estimation process 814 need not be bounded by hard real-time constraints, and can be practically designed to execute offline, on a suitable previously extracted complex residual current 132 sequence.

The rotor slots 142 are independently estimated from the complex residual current 132, the fundamental frequency 136 and the approximate slip 138 sequences corresponding to some diversity of load 152 or thermal conditions before identifying the rotor slots 142 with sufficient confidence to decline further analysis. In the event that a consensus rotor slot estimate is not identified, an optional probabilistic method is described to select the rotor slots 142 from a conflicting rotor slots set, based upon relative conditional probability.

Contiguous sequences of the complex residual current 132, the fundamental frequency 136, and the approximate slip 138 are evaluated to identify the rotor slots 142, by iteratively processing the sequences over a range of rotor slots of interest. The process is repeated for each rotor slots index, $_r$, for the same sequences over a defined range. The range of the sample sequence, $\vec{u}$, has an epoch, n, at which the approximate slip 138 exceeds a minimum threshold, and the length of the range, N, is approximately equal to 2.0 seconds, in (Equation 89).

$$\vec{u} = \{[n:n+N-1]: s_{P,n} \geq 0.6 \cdot s_0 |_{N \geq 2 \cdot f_s}\} \quad \text{(Equation 89)}$$

Figure 16:
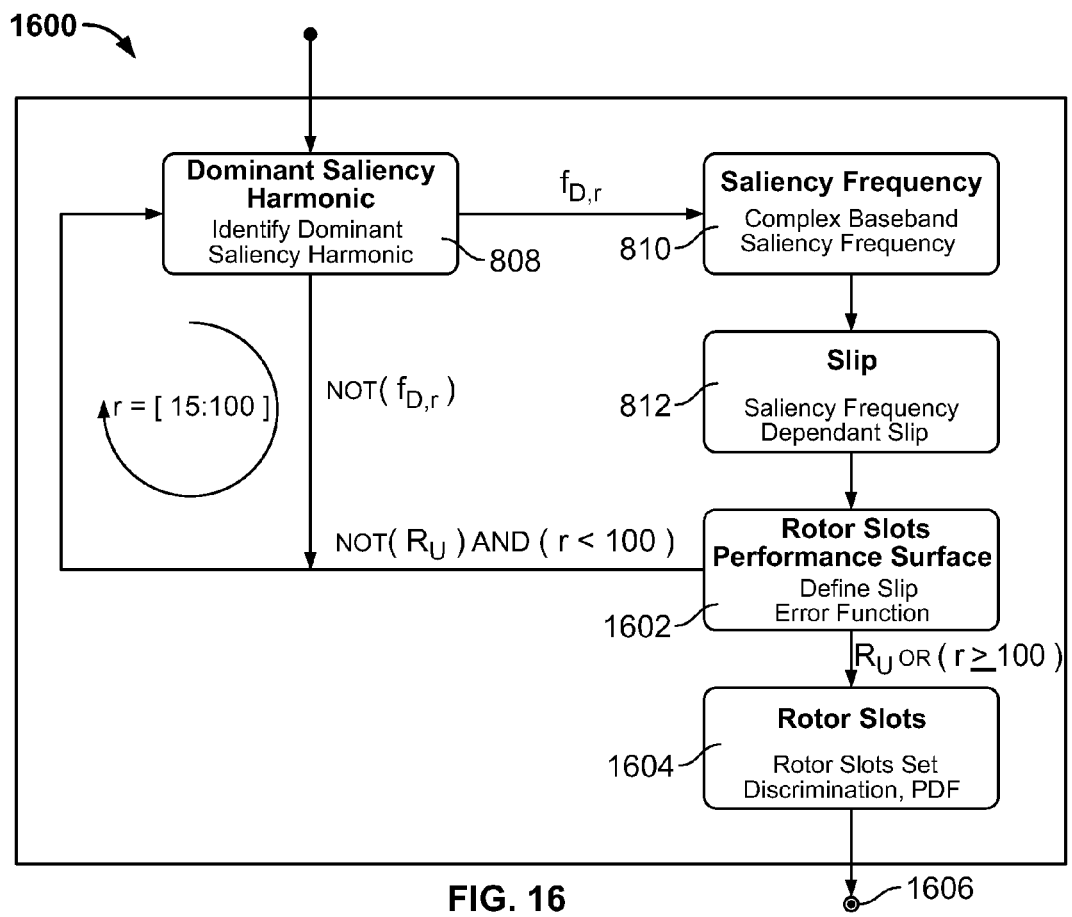
FIG. 16 is a control flow diagram of a Rotor Slots Process of FIG. 8 and FIG. 9.

Referring to FIG. 16, a control flow 1600 presents an alternative system view, where the nature of the relationships between entities and processes are defined in terms of order and conditions of operation. The order of operation is explicitly defined by arrows, indicating the direction of transition, from source to destination, consisting of actors or processes. Transitions can be absolute, defined by arrows without text enumeration, or conditional, defined by arrows with text defining specifically under what conditions the transition is supported. Text enumeration consists of logical statements, which can include some combination of operators including $_{AND}$, $_{OR}$, and $_{NOT}$, and data symbols.

Collections are delimited by rectangles, and processes are defined by rounded rectangles. The epoch of control at a particular level of abstraction is represented by a filled circle at the origin of the initial transition. The source of the epoch transition is undefined, and not relevant. The terminus transaction 1606 is represented by a filled circle encapsulated in an unfilled circle of larger diameter at the end of the final transaction. Precisely one epoch and one terminus transition are defined per control flow.

The epoch of control flow 1600 transitions to the Dominant Saliency Harmonic process 808. As previously discussed, the Dominant Saliency Harmonic process 808 identifies the dominant saliency frequency 816 and the dominant saliency order 818 from the complex residual current 132, the fundamental frequency 136, and the complex input power 134 signal segments over a specified range, with the assumption that the rotor slots 142 are known, and defined by rotor slots index, $_r$. If a dominant saliency harmonic is not identified, the rotor slots index is incremented, and the Dominant Saliency Harmonic process 808 retains control. If a dominant saliency harmonic is identified, the Dominant Saliency Harmonic process 808 transitions to the Saliency Frequency process 810.

The Saliency Frequency process 810 estimates the saliency frequency 426 from the complex residual current 132 segment, and the dominant saliency harmonic associated with a specific rotor slots index, and then transitions to the Slip process 812.

The Slip process 812 estimates an estimated slip 140 from the saliency frequency 426, and then transitions to a Rotor Slots Performance Surface process 1602.

The Rotor Slots Performance Surface process 1602 defines an error function from the difference of the approximate slip 138, derived from the normalized power, and the estimated slip 140, independently extracted from a harmonic analysis. Each execution of the Rotor Slots Performance Surface process 1602 produces a single error estimate, as a function of a specific rotor slot index. Over successive iterations, a performance surface is revealed, and a rotor slots estimate corresponding to a global minimum is extracted. If rotor slots 142 are not identified, and the rotor slots index is less than a practical maximum range, the rotor slots index is incremented, and the Rotor Slots Performance Surface process 1602 transitions to the Dominant Saliency Harmonic process 808. If rotor slots 142 are identified with sufficient confidence, the Rotor Slots Performance Surface process 1602 transitions to the Rotor Slots process 1604.

Rotor Slots process 1604 builds a set of independent rotor slots solutions extracted from the Rotor Slots Performance Surface process. The process is not iterative, and executes once per identified rotor slots estimate. When the set of rotor slots has sufficient density, the set is queried to determine a consensus rotor slots estimate. If no consensus rotor slots estimate is possible, or a single rotor slots estimate may not be extracted from the set of independent estimates with sufficient confidence, an optional probabilistic method is employed to extract a rotor slots estimate. Rotor Slots process 1604 transitions to the terminus of control flow.

It is contemplated that according to alternative aspects, any other suitable methods for determining the approximate slip 138, the saliency frequencies 426 of each rotor slot quantity, and the estimated slip 140 can be utilized. For example, approximate slip 138 can be approximated based on an extracted estimate of an eccentricity frequency associated with an eccentricity harmonic.

4.3.4.1.1 Rotor Slots—the Dominant Saliency Process

The Dominant Saliency Harmonic process 808 identifies the dominant saliency frequency 816, the dominant saliency order 818, and the saliency filter coefficients 404 as a function of complex residual current 132, the fundamental frequency 136, the approximate slip 138, the rotor slots index, $r$, and the poles 172, in (Equation 90).

$$[f_{D,r},o_{D,r},\vec{a}_{H,r},\vec{b}_{H,r}] = DOMINANT\,SALIENCY\,HARMONIC(\vec{i}_{R,u},f_{0,u},\vec{s}_{P,u},r,P)|_{r=[15:100]} \quad \text{(Equation 90)}$$

It is possible that a dominant saliency harmonic may not be identified. This condition occurs when no potential saliency frequency is identified which is sufficiently proximate to the expected saliency frequency to support verification. The cause of this condition is a particularly inappropriate rotor slots assumption which does not agree with the motor geometry. It is reasonable and expected that this condition will occasionally occur, as the rotor slots index iterates over a wide range of potential rotor slots solutions.

Saliency filter coefficients 404 requirements can be relaxed to accommodate practical limitations on available bandwidth and memory. The selection of the bandwidth of the complex baseband current signal 424 to correspond to the expected range of the saliency frequency 426 is dependent on rotor slots 142, and optimal in terms of reducing out-of-band interference prior to residual frequency estimation.

The saliency filter coefficients 404 can be statically or dynamically defined to support a downsampled rotor slots range, by defining coefficients corresponding to an integer stride of M rotor slots.

4.3.4.1.2 Rotor Slots—the Saliency Frequency Process

The Saliency Frequency process 810 estimates the saliency frequency 426 of the dominant saliency harmonic, as a function of the complex residual current 132, the dominant saliency frequency 816 and the saliency filter coefficients 404, in (Equation 91).

$$\vec{f}_{H,r,u} = SALIENCY\,FREQUENCY(\vec{i}_{R,u},f_{D,r},\vec{a}_{H,r},\vec{b}_{H,r})|_{r=[15:100]} \quad \text{(Equation 91)}$$

4.3.4.1.3 Rotor Slots—the Slip Process

The Slip process 812 estimates slip 140 as a function of the saliency frequency 426, the dominant saliency order 818, the fundamental frequency 136, the rotor slots index, $r$, and the poles 172, in (Equation 92).

$$\vec{s}_{r,u} = SLIP(\vec{f}_{H,r,u},o_{D,r},\vec{f}_{0,u},r,P)|_{r=[15:100]} \quad \text{(Equation 92)}$$

Slip estimation is directly expressed though a reorganization of the saliency frequency equation, based on availability of accurate saliency frequency and fundamental frequency estimation. Saliency frequency is estimated from the dominant saliency harmonic, and dependent upon the corresponding dominant saliency order. The Slip process 812 is described in section 4.3.3 above.

4.3.4.1.4 The Rotor Slots Performance Surface Process

The Rotor Slots Performance Surface process 1602 defines an error function from the difference of the approximate slip 138, derived from the normalized power, and the estimated slip 140, independently extracted from a harmonic analysis. Each execution of the Rotor Slots Performance Surface process 1602 produces a single error estimate, as a function of a specific rotor slot index, $r$. Over successive iterations, a performance surface is revealed, and a rotor slots estimate corresponding to a global minimum is extracted.

The rotor slots performance surface is a measure of a slip estimation error as a function of rotor slots, evaluated at integer rotor slot index, $r$, over a defined range. The rotor slots performance surface is nonlinear, and a concise differentiable representation for a specific motor is unavailable, so the surface is revealed through an iterative process of assuming a rotor slots definition, extracting the dominant saliency harmonic and the slip estimations 140 derived from the assumption, and quantifying the slip estimation error.

The abscissa of the rotor slots performance surface consists of a contiguous sequence of integer rotor slot indices. The ordinate of the rotor slots performance surface consists of the L1 error, or mean absolute difference, between the approximate slip 138, and the estimate of slip 140 extracted over the rotor slots index range. The approximate slip 138 is not precise, though it can be sufficiently accurate to provide a reference, independent of the rotor slots quantity and the slip 140.

The slip estimation error, $\vec{e}_{r,u}$, is the absolute difference of the slip approximation 138 and the slip 140, as a function of rotor slots index, over the sample sequence range, $\vec{u}$, in (Equation 93).

$$\vec{e}_{r,u} = |\vec{s}_{P,u} - \vec{s}_{r,u}|\,|_{r=[15:100]} \quad \text{(Equation 93)}$$

A sequence of the complex residual current 132 is selected and iteratively processed, over the rotor slots index range, to produce a slip estimation error signal. A single rotor slots performance surface is defined from the complex residual current sequence. A rotor slots performance surface can be queried to extract precisely one independent rotor slots estimate.

Figure 17:
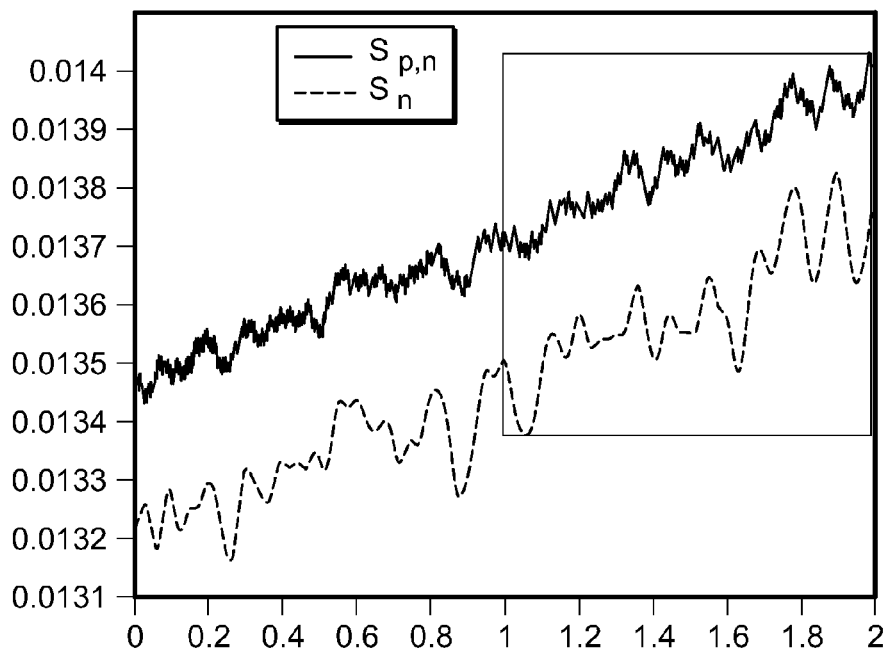
FIG. 17 is a chart depicting a slip error, estimated for a motor operating in continuously increasing, near rated, load conditions.

Referring to FIG. 17, the slip error estimation is illustrated, for a 15 HP, 6 pole, 44 rotor slots motor operating in continuously increasing, near rated, load conditions, for a period of 2.0 seconds, at a sampling frequency of 10 kHz. The slip approximation 138 is shown as a solid line and the slip 140, derived from the saliency frequency 426 at the dominant saliency harmonic using a PLL, is shown as a dashed line. FIG. 17 depicts the results of slip 140 from the complex residual current 132, the fundamental frequency 136, and the slip approximation 138 defined over a single contiguous segment for a rotor slots index equal to 44, which corresponds to the actual rotor slots quantity for this specific motor 150. Though the slip 140 is more precise than approximate slip 138, the temporal alignment resulting from latency compensation is discernable.

The region of interest, in terms of rotor slots performance surface definition, is delimited by a rectangle, corresponding to the last 1.0 second of the 2.0 second approximate slip 138, and estimate slip 140 signals. The slip estimation error signal is defined as the absolute difference of the approximate slip 138 and the estimate slip 140, though it is relevant only over the delimited region, which allows the estimate to avoid convergence and filter edge effects. Precisely one rotor slots performance estimate at a single rotor slots index is produced from the slip estimation error shown.

The estimate of the rotor slots performance surface corresponding to the rotor slots index, 44, is equal to the mean absolute difference, or L1 error, between the approximate slip 138 and the estimate slip 140, over the delimited region of interest.

The rotor slots performance surface, $\zeta_{R,r}$, is defined iteratively over a rotor slot index range as the mean L1 slip estimation error over a bounded post convergence period of observation with 1.0 second duration, in (Equation 94).

$$\zeta_{R,r} = \frac{2}{N} \cdot \sum_{m=u_N/2}^{m=u_N-1} e_{r,m} \Bigg|_{\substack{r=[15:100] \\ N \geq 2 \cdot f_S}}$$ (Equation 94)

The rotor slots 142 are estimated by determining the global minimum of the rotor slots performance surface, evaluated over a practical rotor slots index range. It is possible to reduce the range of rotor slots evaluated, if the identification of a local minimum is persistent over a sufficient rotor slots range to be considered a probable global minimum. The rotor slots range reduction is computationally advantageous.

The rotor slots, $R_u$, is equal to the rotor slots index, $_m$, such that the rotor slots performance surface evaluated at this rotor slots index is the global minimum of the surface over a rotor slot index range, in (Equation 95).

$$R_u = \{_m : \zeta_{R,m} = _{MIN}(\zeta_R)|_{r=[15:MIN(m+P\cdot 6,100)]}\}$$ (Equation 95)

The rotor slots index range is defined from 15 rotor slots to the minimum of either 100 rotor slots, or the last rotor slots performance surface local minimum, when traversed in increasing rotor slots index order, plus six times the poles 172 of the motor 150. When evaluating the rotor slots performance surface sequentially, evaluation can be terminated prior to the end of the rotor slots index range if a specific local minimum is sufficiently persistent to declare it a global minimum.

Figure 18:
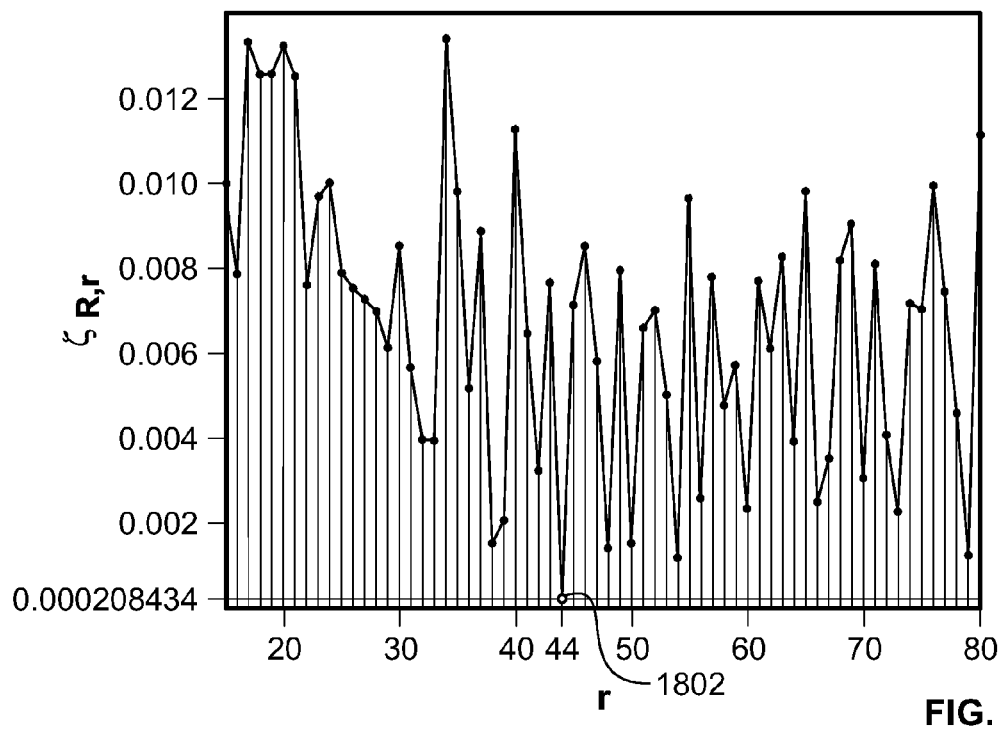
FIG. 18 is a chart depicting a rotor slots performance surface for a motor operating in continuously increasing, near rated, load conditions.

Referring to FIG. 18, the rotor slots performance surface is illustrated, for a 15 HP, 6 pole, 44 rotor slots motor operating in continuously increasing, near rated, load conditions, for a period of 2.0 seconds, at a sampling frequency of 10 kHz.

The abscissa of the rotor slots performance surface is delimited by vertical lines. The ordinate of the rotor slots performance surface is evaluated over an integer rotor slots index range in [15, 80]. The rotor slots performance surface estimates are specified by filled circles. Line segments project the linear interpolation of the rotor slots performance surface between the rotor slots indices, to illustrate the nonlinear nature of the surface. The rotor slots performance surface local minimum 1802 is found at a rotor slots index of 44 with a slip estimation error of approximately 2.0e−4. As the local minimum 1802 is persistent over the range of rotor slots index in [15,44+6*P], or [15, 80], a global minimum is declared and the performance surface is not evaluated over the remaining rotor slots index range.

The rotor slots estimate of 44 rotor slots is correct for this specific motor 150, based on the complex residual current 132, the fundamental frequency 136 and the approximate slip 138 sequences consumed in production of the specific rotor slots performance surface.

4.3.4.1.5 The Rotor Slots Process

The rotor slots performance surfaces can vary based on the load and thermal conditions associated with the complex residual current 132, the fundamental frequency 136 and the approximate slip 138 sequences used to produce them. To ensure robust rotor slots estimation, several rotor slots estimates are produced from independent rotor slots performance surfaces formed under diverse load and thermal conditions.

There is no assumption that the load 152 can be controlled, yet it can certainly be observed. The rotor slots performance surfaces should be formed under various load conditions that are proximate to rated, as the approximate slip 138 and the slip estimate 140 are calibrated to rated operation. Thermal diversity can be ensured by forming rotor slots performance surfaces over periodic intervals of time.

It is contemplated that any method of selecting appropriate sample sequences to produce the independent rotor slots estimates can be employed; however, it is suggested that the normalized real input power can be constrained to the range [0.6, 1.4]. If the input power does not vary significantly, thermal diversity can suffice to generate the independent estimates by selecting sequences at intervals of approximately 1.0 hours in a continuously operating motor 150. In the event that observable motor operation does not afford the opportunity to adhere to these goals, they can be relaxed as desired to accommodate practical rotor slots estimation.

A set of rotor slots estimates, $\mathfrak{R}$, is iteratively formed as the union of independent rotor slots estimates, based on diverse load and thermal conditions, as observable, in (Equation 96).

$$\mathfrak{R} = \mathfrak{R} \cup R_u$$ (Equation 96)

A consensus rotor slots estimate can be extracted when the rotor slots set is sufficiently populated. If a consensus rotor slots estimate is not available, additional independent rotor slots estimates can be added to the set until a consensus is available, or until a defined rotor slots set population limit is reached.

The rotor slots 142, R, is defined as the consensus of the rotor slots set, such that a supermajority of the set members are equal to the mode of the set, or in lieu of convergence, a probabilistic Probability Density Function (PDF) method, in (Equation 97).

$$R = \begin{cases} MODE(\mathfrak{R}) \sum_R (R_u = MODE(\mathfrak{R})) \geq \frac{2 \cdot M}{3} \Big|_{M \geq 5} \\ \left\{ \begin{matrix} _m : PDF(P, p_{0,m}) = \\ MAX(PDF(P, p_0, \mathfrak{R})) \end{matrix} \right\} \sum_R (R_u = MODE(\mathfrak{R})) < \frac{2 \cdot M}{3} \Big|_{M \geq 9} \end{cases}$$ (Equation 97)

If the rotor slots set is fully populated and a consensus rotor slots estimate remains elusive, plurality or probabilistic methods can be employed to define a single rotor slots estimate from the rotor slots set.

The plurality method relaxes the consensus requirement from supermajority to a simple plurality of rotor slot set members to form a single rotor slots estimate. Advantageously, the plurality method is simple and does not call for significant additional resources.

The probabilistic method extracts a specific PDF from a three-dimensional matrix of stored PDFs indexed by the poles 172 and the normalized rated input power. The PDF, a discrete function of probability as a function of rotor slots index, is queried for members of the rotor slots set. The rotor slots estimate is equal to the rotor slots set member with the highest probability. The PDF matrix is synthesized offline from a motor database, though additional memory requirements may not be negligible.

Figure 20:
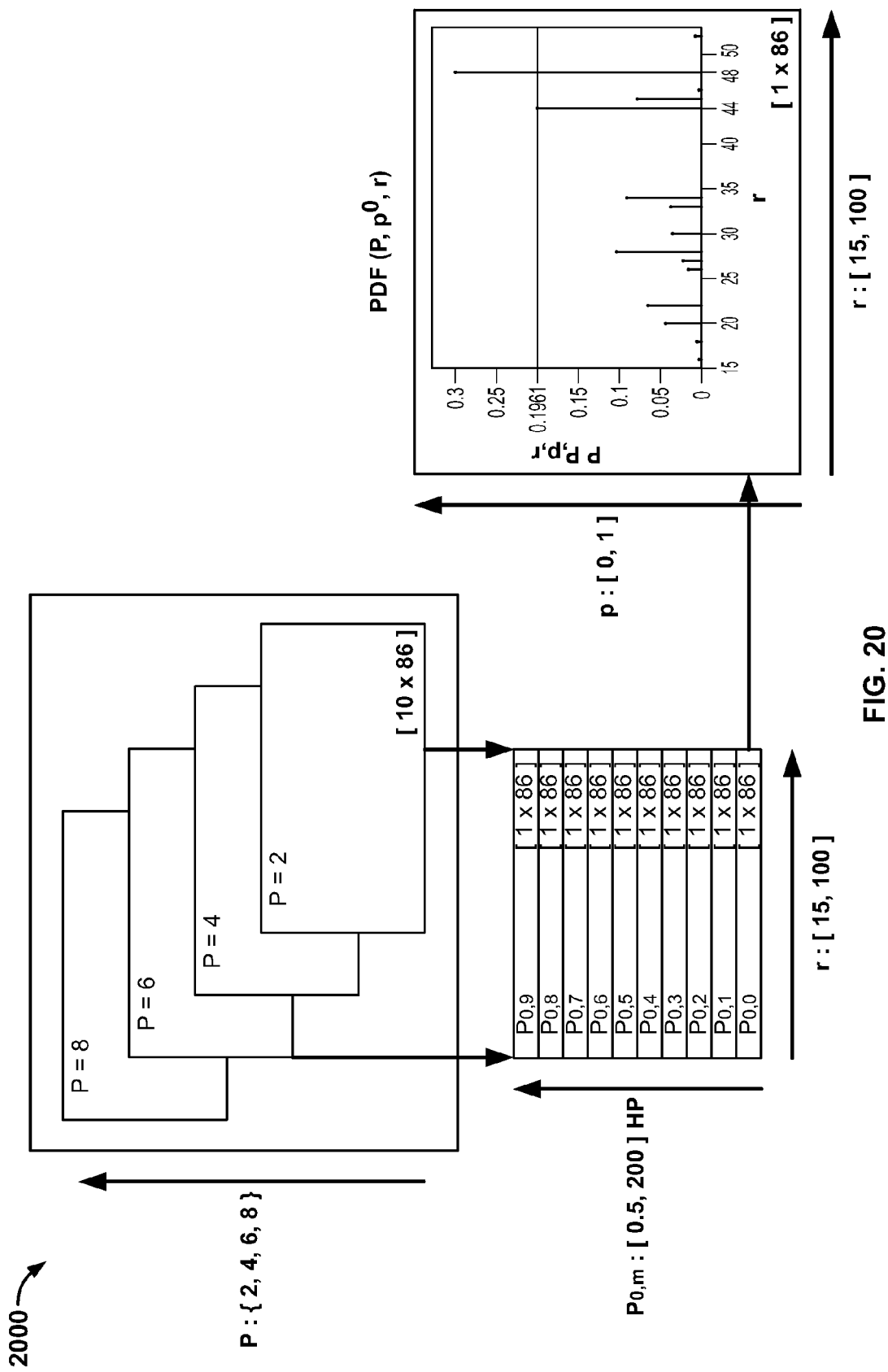
FIG. 20 is diagram of a Rotor Slots Probability Density Function architecture according to some aspects.

Referring to FIG. 20, the Rotor Slots PDF architecture is a three-dimensional matrix, indexed by poles, normalized rated input power, and rotor slots. As an illustration of a Rotor Slots PDF, FIG. 20 represents a motor database of 5568 motors that were analyzed to synthesize a PDF matrix 2000. The motors in the database were three-phase induction motors with 60 Hz fundamental frequency, poles in the set {2, 4, 6, 8, 10}, and rated input power in the range [0.5, 200] HP. The rated input power, the poles 172 and the rotor slots 142 were known for all motors 150. The motors 150 were separated into 5 groups, based on poles. The 10 pole group was eliminated from further consideration, due to insufficient population to support meaningful statistical inference.

Pole groups were independently analyzed to decompose each group into 10 power groups of similar rated input power. Grouping motors within each pole group with others of similar input power led to a definition of independent thresholds for each group. The rated input power for motors in a pole group was normalized to have a unity standard deviation and a zero mean. An agglomerative clustering algorithm was then applied to the motors in a pole group to iteratively collect self-similar motors, in terms of normalized input power, until 10 significant clusters were defined. The normalized power bands were extracted directly from the cluster boundaries, resulting in the definition of 4 pole groups of motors, each consisting of 10 groups of motors segregated by normalized rated input power.

An independent PDF was defined as the normalized histogram of rotor slots 142 for the motors 150 in each specific power group. A PDF matrix was created by forming the PDFs into a collection indexed by poles 172 and normalized rated input power bands.

Figure 19:
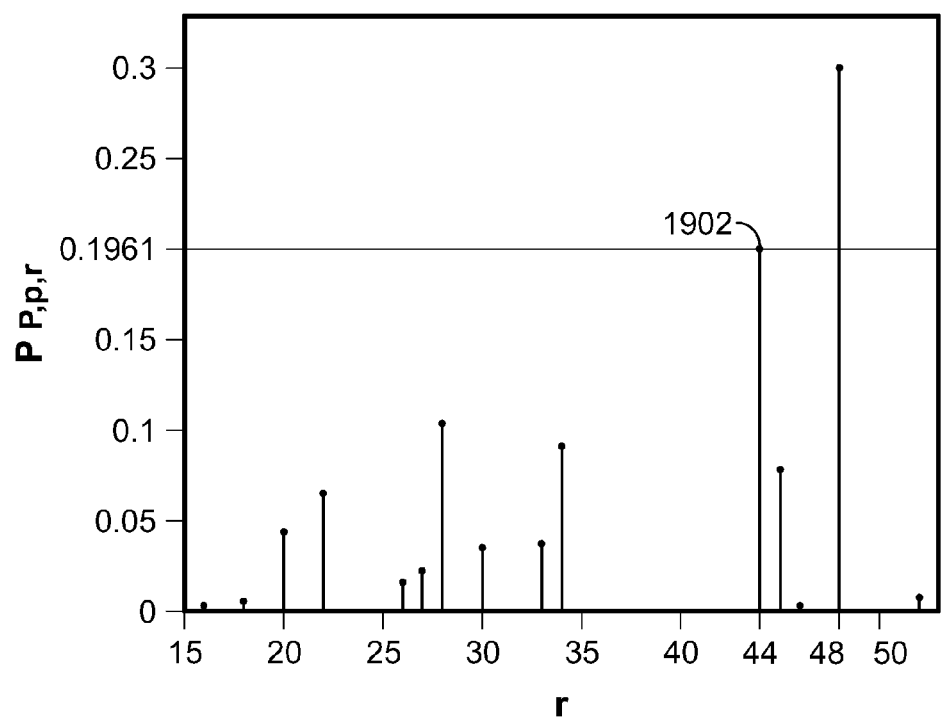
FIG. 19 is a chart of a Probability Density Function depicting the conditional probability that a motor has a particular rotor slots quantity.

Referring to FIG. 19, a PDF extraction is illustrated, for a 15 HP, 6 pole motor 150, as $_{PDF}(P, p_0\ r)$, which defines the conditional probability of a motor 150 with poles, P, and normalized rated input power, $p_0$, as a function of rotor slots index, $_r$.

The conditional probabilities for motors in this group are specified by black circles, terminating vertical lines. Zero probabilities are not shown. A consensus rotor slots estimate 1902 of 44 rotor slots would not result in a need to arbitrate potential conflicts in the rotor slots set. However, if a consensus rotor slot estimation is not available, the PDF is indexed for each member of the rotor slots set, and the member corresponding to the highest probability is assigned to the rotor slots estimate.

The PDF illustrated in FIG. 19 indicates that though 48 rotor slots are most probable for motors in this group, with a probability of 0.31, 44 rotor slots are also common, with a probability of 0.1961. However, in the event of a clear consensus rotor slot estimate, probability density is irrelevant.

5.0 Component Library

The Component Library includes practical definitions for the Infinite Impulse Response (IIR) Filter, the Voltage Controlled Oscillator (VCO), the Complex Single Frequency (CSF) Filter, the Phase Discriminator (PD), and the Phase Locked Loop (PLL).

The Component Library members support operation on complex inputs, and produce complex outputs, when it is meaningful and appropriate to do so, unless otherwise explicitly stated. Spatial subscript m is a dimensional index into a vector or ordered indexed set. The spatial subscript range is in [0, M], where M is the highest spatial index, or order, defined. A spatial index equal to zero corresponds to the first element, or lowest order, in the vector or indexed set. A spatial index equal to m+1 indicates the element corresponding to the next sequential position, or higher order.

Temporal subscript n is an index into a temporal sequence, which contains data quantized in time at regular intervals. Temporal sequences are generally unbounded and contiguous. A temporal index equal to zero corresponds to the first, or original, sample in the sequence. A temporal index equal to n+1 indicates the sample corresponding to the next sequential quantization time, or the sample in the immediate future.

The Component Library descriptions include a unique functional notation, specific to the component, which supports compact and unambiguous application. The notation consists of one or more outputs, a function name, in small capital letters, and a parenthesized, comma-delimited list of one or more inputs to the function. In the event of multiple outputs, braces are used to delimit the output set. Spatial or temporal sequences are highlighted in bold type, and scalars are in standard type.

5.1 The Infinite Impulse Response (IIR) Filter

Figure 21:
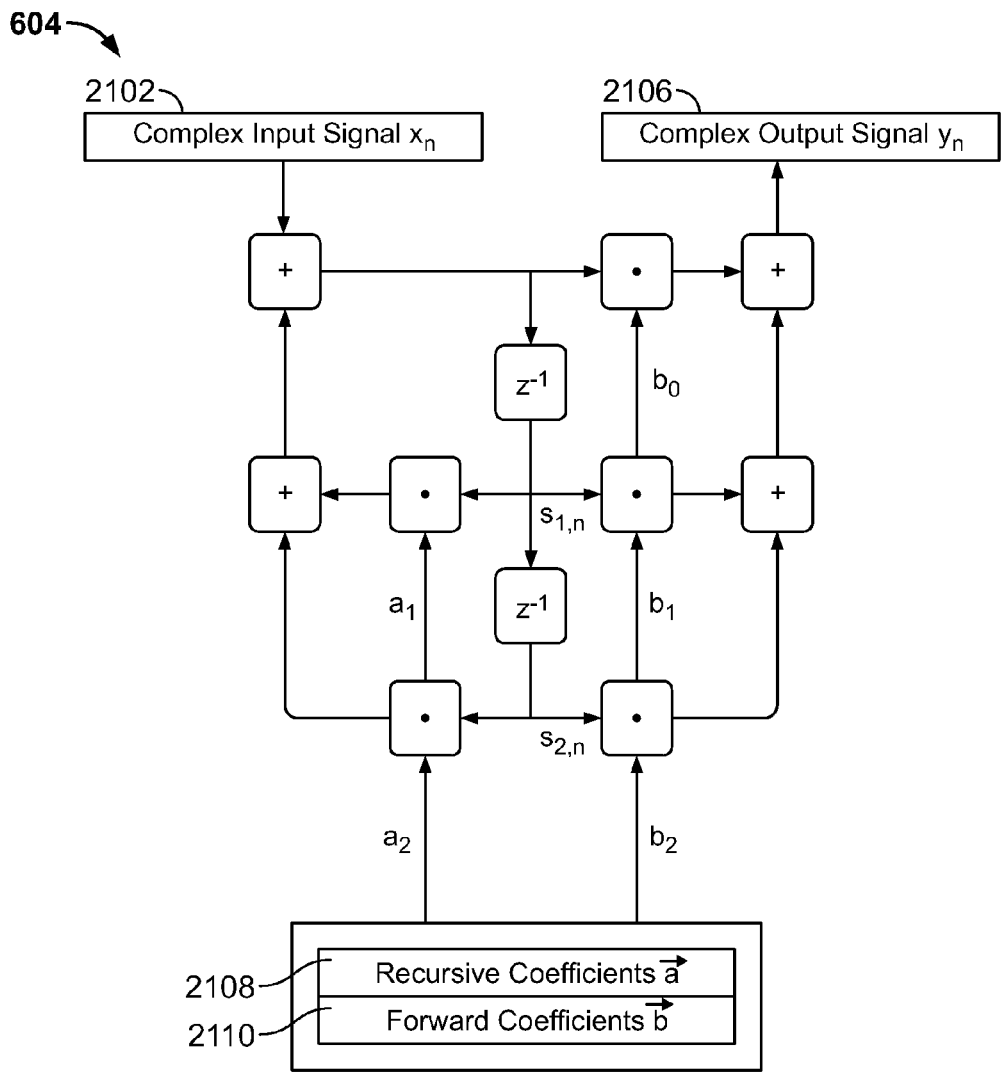
FIG. 21 is a flow chart diagram of an architecture for an infinite impulse response (IIR) filter according to some aspects.

Referring to FIG. 21, an IIR filter 604, $_{IIR}$, produces a complex output 2106 of a linear time-invariant system in as a function of a complex input signal 2102 and recursive coefficients 2108 and forward coefficients 2110, in (Equation 98).

$$\vec{y} =_{IIR}(\vec{x}, \vec{a}, \vec{b})$$ (Equation 98)

$\vec{y}$ Complex Output Signal 2106.
$\vec{x}$ Complex Input Signal 2102.
$\vec{a}$ Recursive Coefficients 2108.
$\vec{b}$ Forward Coefficients 2110.

The IIR filter operation is concisely defined in terms of a discrete Difference Equation (DE), in (Equation 99). The complex output signal 2106, $y_n$, is expressed by superposition, as the sum of products of previous complex outputs and the recursive coefficients 2108, and the sum of products of previous and present inputs, $x_n$, and forward coefficients 2110.

$$y_n = \sum_{m=1}^{M} a_m \cdot y_{n-m} + \sum_{m=0}^{M} b_m \cdot x_{n-m}$$ (Equation 99)

The transfer function, $H_z$, of the IIR filter 604 is directly obtained through application of the z-transform to the DE, and expressed as a function of the complex variable z, in (Equation 100). The sign convention defined in the transfer function is strictly consistent with the DE. The IIR filter coefficients synthesized from filter design applications are reconciled to accommodate the transfer function definition.

$$H_Z = \frac{Y_Z}{X_Z} = \frac{\sum_{m=0}^{M} b_m \cdot z^{-m}}{1 - \sum_{m=1}^{M} a_m \cdot z^{-m}}$$ (Equation 100)

The IIR filter order, M, is equal to the highest polynomial order of the DE. The coefficients are identified according to order by spatial index $_m$. The recursive coefficient spatial indices are defined in the range [1, M], as the present output, $y_n$, is not self-dependent. Forward coefficients indices are defined in the range [0, M]. It is possible and reasonable that the effective IIR filter order independently indicated from recursive and forward coefficients may not agree. An unbalanced IIR filter order can be reconciled by expanding the lowest order coefficients by appending coefficients equal to zero, such that the highest spatial index equals the filter order, M.

A Finite Impulse Response (FIR) filter can be considered a special case of IIR filter 604, without support for recursion. An FIR filter does not specify recursive coefficients 2108, and analysis of the resulting DE is simplified significantly, relative to IIR filters 604. FIR filter support is accommodated in precisely the same manner as unbalanced IIR filter order reconciliation, by defining recursive coefficients 2108 of length M with coefficients equal to zero.

The recursive and forward coefficients can be complex or real. An IIR filter 604 with a complex input signal 2102 and real coefficients produces a complex output signal 2106 by independently filtering the real and complex components of the input signal. This method effectively substitutes two real multiplies for each complex multiply required when complex coefficients are defined.

The Direct II architecture is commonly employed to implement or graphically describe IIR filter function, as illustrated in the 2nd order IIR filter, in FIG. 21. The Direct II architecture is derived from reorganization of the DE, and retains direct and unmodified application of recursive 2108 and forward 2110 coefficients.

State Variable Analysis (SVA) is a method commonly applied to analyze linear time-invariant systems. State variables, $s_{m,n}$, are introduced as convenient and efficient substitutions, eliminating the need to retain and operate on input and output temporal sequences, $x_n$ and $y_n$. State variable spatial indices are defined in the range [1, M]. SVA provides definitions for equations to solve complex output signal synthesis, and state variable update.

Complex output signal, $y_n$, is defined in terms of coefficients, $a_m$ and $b_m$, state variables, $s_{m,n}$, and complex input signal, $x_n$, in (Equation 101). State coefficients, $c_m$, are defined in terms of recursive 2108 and forward 2110 coefficients as a convenient substitution.

$$y_n = \sum_{m=1}^{M} (a_m \cdot b_0 + b_m) \cdot s_{m,n} + b_0 \cdot x_n = \sum_{m=1}^{M} c_m \cdot s_{m,n} + b_0 \cdot x_n \quad \text{(Equation 101)}$$

The state variable update specifies the next temporal iteration of the lowest order state variable, $s_{1,n+1}$, in terms of higher order state variables, $s_{m,n}$, recursive coefficients, $a_m$, and complex input signal, $x_n$, in (Equation 102). Higher order next state variables, $s_{m,n+1}$, are assigned by propagation through unit delays.

$$s_{m,n+1} = \begin{cases} \sum_{m=1}^{M} a_m \cdot s_{m,n} + x_n & m = 1 \\ s_{m-1,n} & m = [2, M] \end{cases} \quad \text{(Equation 102)}$$

5.2 The Voltage Controlled Oscillator (VCO)

Figure 22:
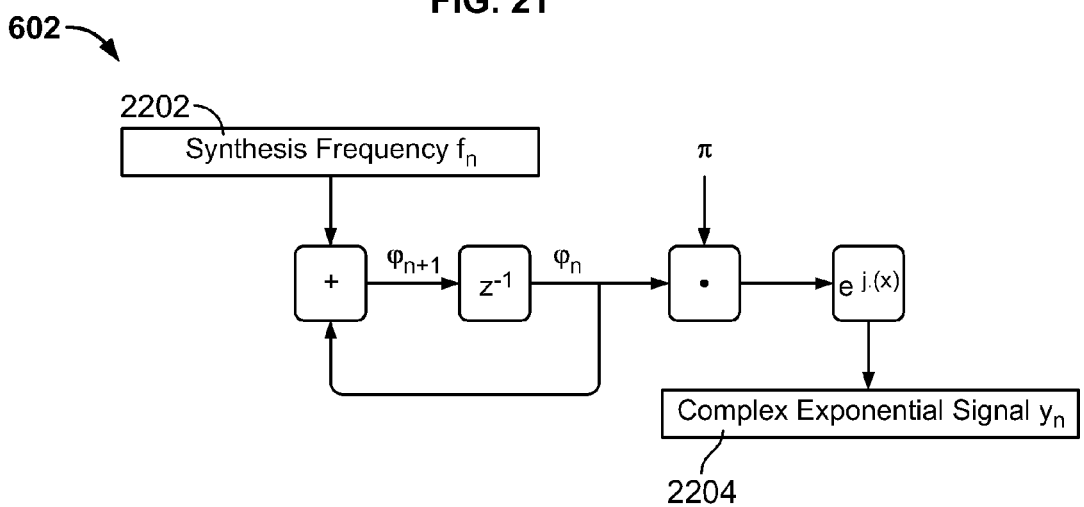
FIG. 22 is a flow chart diagram of an architecture for a Voltage Controlled Oscillator (VCO) according to some aspects.

Referring to FIG. 22, a VCO 602, $\nu_{CO}$, synthesizes a complex exponential signal 2204 as a function of a synthesis frequency 2202, in (Equation 103).

$$\vec{y} = \nu_{CO}(\vec{f}) \quad \text{(Equation 103)}$$

$\vec{y}$ Complex Exponential Signal 2204.

$\vec{f}$ Synthesis Frequency 2202.

A normalized frequency is equal to the absolute frequency divided by the Nyquist frequency, from (Equation 3). The synthesis frequency 2202 is integrated, scaled, and operated on by a complex exponential power operation, producing a contiguous phase complex exponential signal of unity magnitude. This process is analogous to direct FM modulation of an input equal to the synthesis frequency.

A normalized phase, $\phi_{n+1}$, integrates normalized present phase, $\phi_n$, and synthesis frequency 2202, $f_n$, in (Equation 104).

Phase is scaled by $\pi$ and operated on by a complex exponential power, supporting direct contiguous synthesis of a complex exponential signal 2204, $y_n$, in (Equation 105).

$$\phi_{n+1} = \phi_n + f_n \quad \text{(Equation 104)}$$

$$y_n = {}_{EXP}(j \cdot \pi \phi_n) = {}_{COS}(\pi \cdot \phi_n) + j \cdot {}_{SIN}(\pi \cdot \phi_n) \quad \text{(Equation 105)}$$

The initial phase, $\phi_0$, should be assigned a value equal to zero.

The phase is persistent across invocation boundaries, ensuring contiguous operation. Phase wrapping can be carried out to ensure that the phase remains constrained to a practical numerical range, in [−1, 1). The signed integer truncation, or floor, $_{FLOOR}$, of the ratio of phase and 2, is subtracted from the signed remainder, $_{REM}$, of the phase ratio, in (Equation 106).

$$\varphi_{n+1} = {}_{REM}\left(\frac{\varphi_{n+1}}{2}\right) - {}_{FLOOR}\left(\frac{\varphi_{n+1}}{2}\right) \quad \text{(Equation 106)}$$

The VCO complex exponential synthesis implementations are dependent on the desired frequency resolution, and available dynamic range, computational complexity and memory. A simple memory based method predefines a table containing complex exponential function sampled at N regular intervals over one period. A complex exponential 2204 is synthesized by defining an integer phase stride equal to the normalized synthesis frequency, scaled by the table length, and integrating a residual phase error equal to the remainder of the phase stride. The integrated phase error is applied to the stride and reconciled to force the error to remain less than unity in magnitude, ensuring that no frequency jitter is introduced due to the finite table length, or frequency resolution. The phase jitter is inversely proportional to the table length, or the frequency resolution.

Practical modifications to the VCO synthesis method include, but are not limited to, storage of only cosine or sine samples, and traversing the table with two phase indices, a cosine index, and a sine phase index which follows the cosine index with a delay precisely equal to N/4, or $\pi/2$ relative phase difference. The memory requirements can be further reduced at the expense of computational complexity by defining the table over a dyadic fraction of a period, and performing region-specific index adjustment and sign modification of the retrieved values.

5.3 The Complex Single Frequency (CSF) Filter

Figure 23:
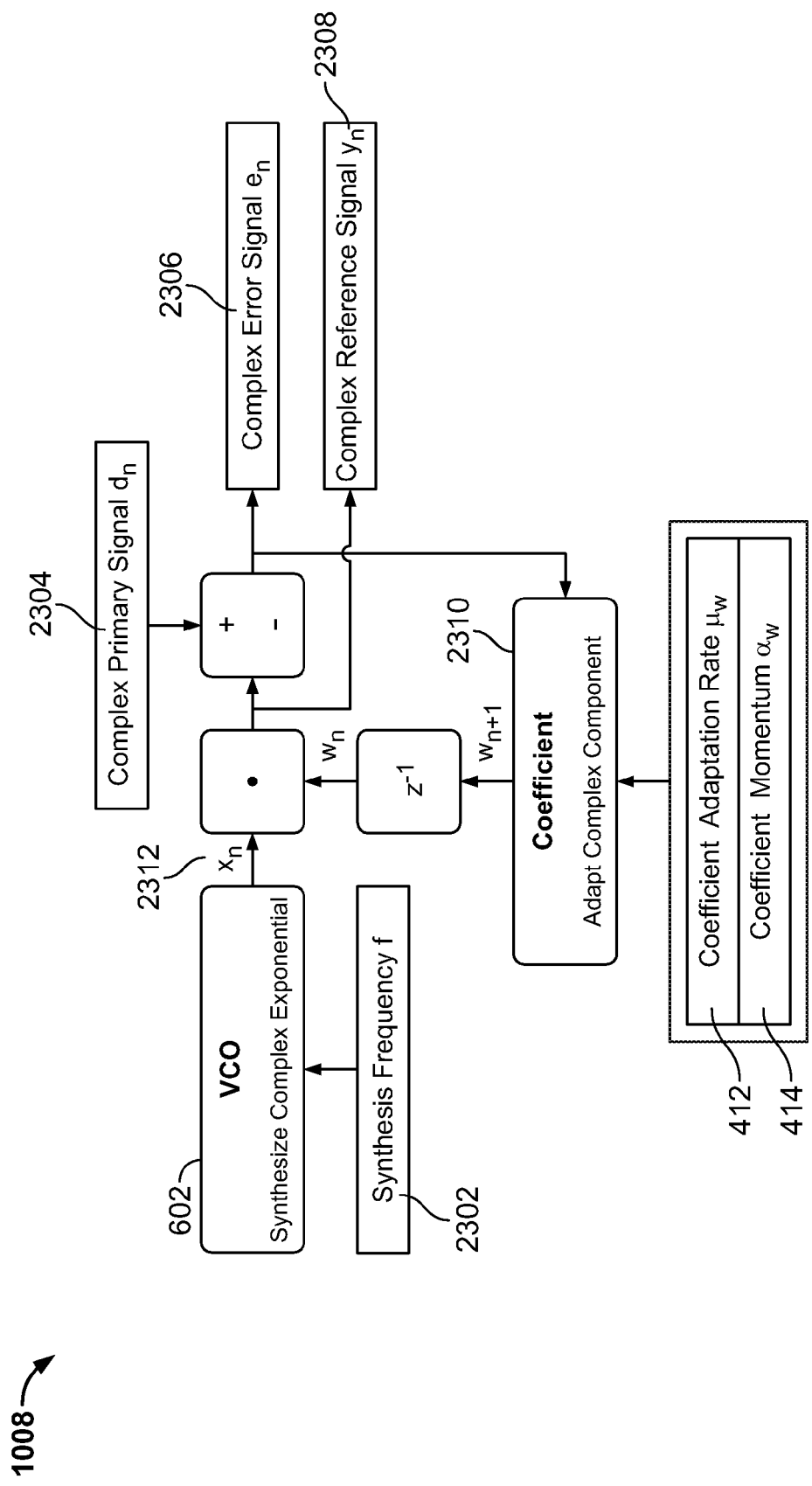
FIG. 23 is a flow chart diagram of an architecture for a Complex Single Frequency (CSF) filter according to some aspects.

Referring to FIG. 23, a CSF filter 1008, CSF, produces a complex reference 2308 and a complex error signals 2306 as a function of a complex primary signal 2304, a synthesis frequency 2302, a coefficient adaptation rate 412, and a coefficient momentum 414, in (Equation 107).

$$[\vec{y}, \vec{e}] = {}_{CSF}(\vec{d}, \vec{f}, \mu_W, \alpha_W) \quad \text{(Equation 107)}$$

$\vec{y}$ Complex Reference Signal 2308

$\vec{e}$ Complex Error Signal 2306

$\vec{d}$ Complex Primary Signal 2304

$\vec{f}$ Synthesis Frequency 2302

$\mu_W$ Coefficient Adaptation Rate 412 (1.0e−3)

$\alpha_W$ Coefficient Momentum 414 (0)

CSF filters 1008 are high quality adaptive band-reject and band-pass filters. Their inherently superior performance, relative to static filter topologies, is due to the ability to dynamically estimate, or match, the magnitude and phase of a complex exponential component at a specific frequency of interest in an external signal. The CSF filters 1008 are computationally simple, practical, and trivially tunable to any observable frequency of interest.

The CSF filter 1008 consists of a VCO 602, a complex coefficient, $w_n$, and a means of coefficient adaptation 2310. A complex incident signal 2312, a complex reference signal 2308, and a complex error signal 2306 are synthesized with respect to an external complex primary signal 2304.

Complex incident signal 2312, $x_n$, is synthesized by the VCO 602 at a constant normalized frequency 2302, f, in (Equation 108).

$$x_n = v_{CO}(f) \qquad \text{(Equation 108)}$$

The complex reference signal 2308, $y_n$, is formed as a product of the incident signal 2312 and the complex coefficient, $w_n$, in (Equation 109). The complex coefficient, $w_n$, effects a change of magnitude and phase in the incident signal 2312, supporting synthesis of a signal that is comparable in magnitude and coherent in phase with a complex exponential component of interest in the primary signal 2304. The complex reference signal 2308 forms a narrow band pass output, with respect to the synthesis frequency 2302.

$$y_n = x_n \cdot w_n \qquad \text{(Equation 109)}$$

The difference between the complex primary signal 2034, $d_n$, and the complex reference signal 2308 forms the complex error signal, $e_n$, which also serves as a residual, or remainder, signal, in (Equation 110). The complex error signal forms a narrow band reject output, with respect to the synthesis frequency.

$$e_n = d_n - y_n \qquad \text{(Equation 110)}$$

A performance surface is a measure of error as a function of coefficient space. The CSF filter performance surface is constrained to three dimensions, real and imaginary complex coefficient dimensions and estimation error.

In a quasi-stationary environment, relative to the response of the CSF filter 1008, an optimum complex coefficient value can be found to minimize the resulting complex error signal, in a least squares sense, resulting in synthesis of a complex reference signal 2308 that approximates a component of interest in the complex primary signal 2304. The optimum complex coefficient value corresponds to a global minimum of the performance surface. Practical complex primary signals 2304 are not stationary, resulting in an evolving performance surface, and the need to continuously evaluate the complex coefficient to minimize the estimation error.

A gradient descent is an iterative adaptive algorithm that estimates the gradient of a defined performance surface, with respect to the coefficient dimensions, and modifies the coefficients to traverse the performance surface in the opposite direction of the gradient estimate. If the performance surface is stationary for a sufficient period of time, the coefficients converge about global minimum of the surface.

A Least Mean Squares (LMS) is an efficient gradient descent method which iteratively estimates the gradient of the performance surface as a function of estimation error.

The performance surface, $\zeta_{W,n}$, is equal to the squared error, in (Equation 111).

$$\zeta_{W,n} = e_n^2 = e_n \cdot e_n^* \qquad \text{(Equation 111)}$$

The LMS gradient estimate, $\nabla_{W,n}$, is equal to the partial derivative of the performance surface, with respect to the complex coefficient, in (Equation 112).

$$\nabla_{W,n} = \frac{\partial \zeta_{W,n}}{\partial w} = -2 \cdot e_n \cdot x_n^* \qquad \text{(Equation 112)}$$

The complex coefficient difference, $\Delta_{W,n}$, is equal to the difference between sequential complex coefficient estimates, in (Equation 113).

$$\Delta_{W,n} = w_n - w_{n-1} \qquad \text{(Equation 113)}$$

The initial complex coefficient difference, $\Delta_{W,0}$, should be assigned a value equal to zero.

A convergence, the time to find the optimum complex coefficient, is inversely proportional to the coefficient adaptation rate 412, $\mu_w$. A misadjustment, the estimation noise introduced by the adaptive process, is proportional to the coefficient adaptation rate 412. Faster convergence results in increased estimation noise.

The bandwidth of the CSF filter 1008 is proportional to the coefficient adaptation rate 412. This observation has implications regarding the inherent frequency resolution of the filter, and the relation of the filter bandwidth to the range of frequency variation anticipated in the component of interest in the complex primary signal 2304.

In a stationary complex primary signal environment, where the synthesis frequency of the incident signal matches that of the instantaneous frequency of the complex primary signal component of interest, the complex coefficient converges about a single stationary point to minimize error about a static complex coefficient solution.

If the synthesis frequency 2302 does not precisely match that of the component of interest in the complex primary signal 2304, a static complex coefficient solution is not possible. The complex coefficient cannot converge to about a single stationary point to find a minimum error solution, as the reference and primary signals would drift apart due to small differences in their instantaneous frequencies.

If the frequency difference is small, relative to the CSF filter bandwidth, the complex coefficient will adapt to modulate the incident signal to shift the instantaneous frequency of the reference signal to match that of the complex primary signal component of interest. The complex coefficient is said to form a dynamic solution, when a static complex coefficient magnitude solution rotates about the origin at a frequency equal to the difference between the complex primary component and incident signal 2312.

Momentum is a nonlinear technique applied to improve convergence time, or the effort expended to find the optimum complex coefficient value, with potential implications on stability and misadjustment. A coefficient momentum 414, $\alpha_w$, is applied to scale the coefficient difference from the previous coefficient iteration, and add the product to the present iteration. The coefficient momentum 414 has a range in [0, 1).

The complex coefficient, $w_{n+1}$, is iteratively adapted relative to the present complex coefficient, $w_n$, by subtracting a scaled gradient estimate, and adding a momentum term, in (Equation 114).

$$w_{n+1} = w_n - \mu_W \nabla_{W,n} + \alpha_W \Delta_{W,n} \qquad \text{(Equation 114)}$$

The initial complex coefficient, $w_0$, should be assigned a value equal to a small complex random number.

The dynamic nature of the complex primary signal 2304 is of principal consideration in defining constant adaptive parameters. The coefficient adaptation rate 412 is bounded by the inverse of the largest eigenvalue of the system. The effect of momentum on stability is difficult to analyze due to its nonlinear nature, and implicit dependence on the coefficient adaptation rate.

5.4 The Phase Discriminator (PD)

Figure 24:
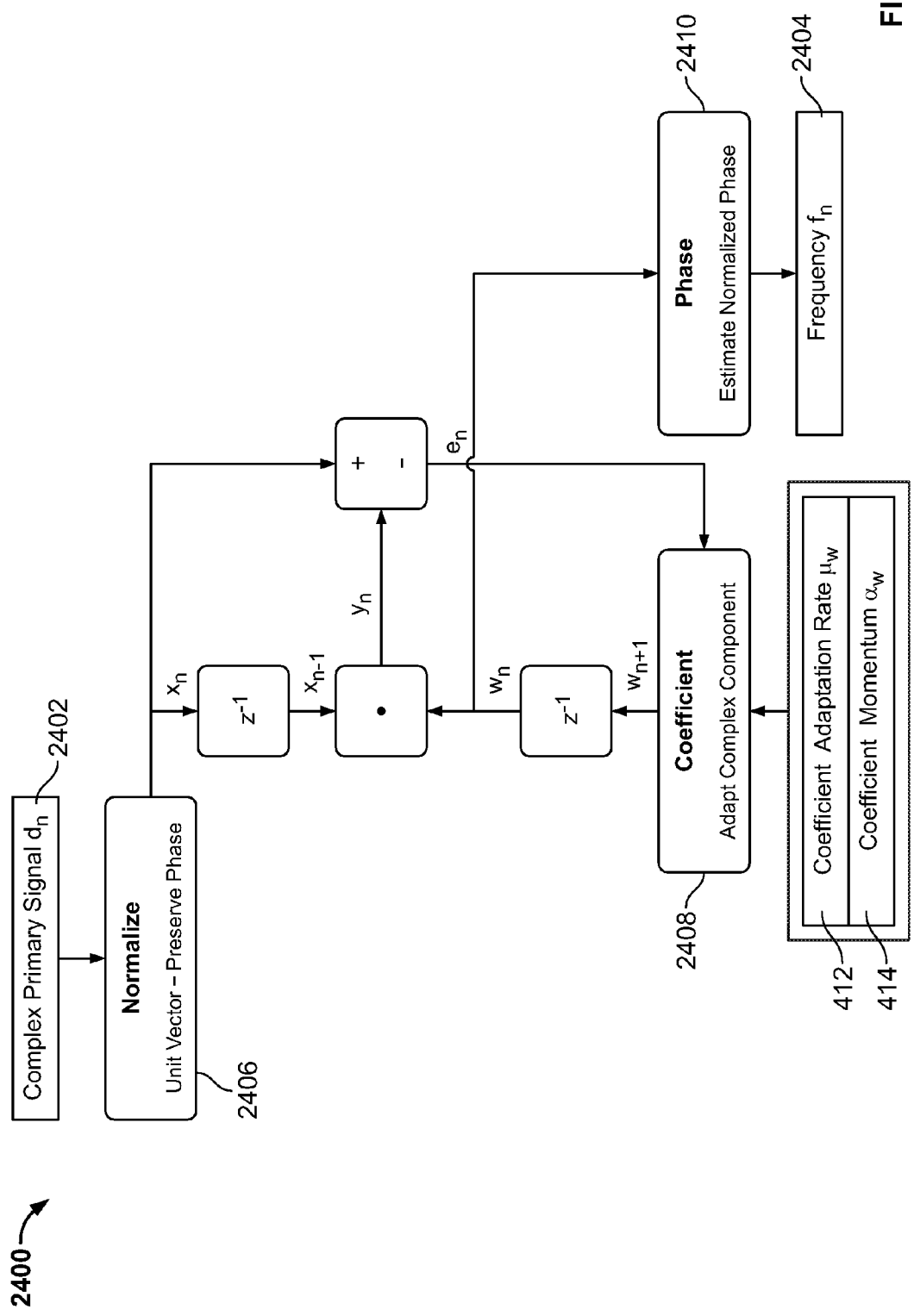
FIG. 24 is a flow chart diagram of an architecture for a Phase Discriminator (PD) according to some aspects.

Referring to FIG. 24, a PD 2400, $_{PD}$, produces a frequency estimate as a function of a complex primary signal 2402, a coefficient adaptation rate 412, and a coefficient momentum 414, in (Equation 115).

$$f=_{PD}(\vec{d},\mu_W,\alpha_W) \qquad \text{(Equation 115)}$$

f Frequency 2404.
$\vec{d}$ Complex Primary Signal 2402.
$\mu_W$ Coefficient Adaptation Rate 412. (2.0e−3).
$\alpha_W$ Coefficient Momentum 414. (1.5e−1).

A PD 2400 is an adaptive filter which estimates the instantaneous frequency 2404 of a primary signal 2402 through a process of input normalization, and adaptation of a complex coefficient which reconciles the phase difference between sequential normalized samples, encoding the instantaneous frequency in the phase of the complex coefficient.

The PD 2400 consists of unity normalization 2406, a complex coefficient, $w_n$, a means of coefficient adaptation 2408, and phase estimation 2410.

A complex incident signal, $x_n$, is formed as a normalized primary signal, equal to the ratio of the complex primary signal 2402 and its magnitude, in (Equation 116).

$$x_n = \frac{d_n}{|d_n|} \qquad \text{(Equation 116)}$$

Normalization 2406 of the complex primary signal 2402 preserves its phase, while diminishing the effect of magnitude variation in sequential samples. Division inherent in normalization 2406 can be practically mitigated though application of various inverse approximation algorithms including, but not limited to, Newton's method.

A complex reference signal, $y_n$, is formed as the product of the unity delayed complex incident signal, $x_{n-1}$, and a complex coefficient, $w_n$, in (Equation 117).

$$y_n = x_{n-1} \cdot w_n \qquad \text{(Equation 117)}$$

The difference between the complex incident signal, $x_n$, and complex reference signal, $y_n$, forms the complex error signal, $e_n$, in (Equation 118).

$$e_n = x_n - y_n = x_n - x_{n-1} \cdot w_n \qquad \text{(Equation 118)}$$

A performance surface is a measure of error as a function of coefficient space. The PD performance surface is constrained to three dimensions, real and imaginary complex coefficient dimensions and estimation error.

The performance surface, $\zeta_{W,n}$, is equal to the squared error, in (Equation 119).

$$\zeta_{W,n} = e_n^2 = e_n \cdot e_n^* \qquad \text{(Equation 119)}$$

The LMS gradient estimate, $\nabla_{W,n}$, is equal to the partial derivative of the performance surface, with respect to the complex coefficient, in (Equation 120).

$$\nabla_{W,n} = \frac{\partial \zeta_{W,n}}{\partial w} = -2 \cdot e_n \cdot x_{n-1}^* \qquad \text{(Equation 120)}$$

The complex coefficient difference, $\Delta_{W,n}$, is equal to the difference between sequential complex coefficient estimates, in (Equation 121).

$$\Delta_{W,n} = w_n - w_{n-1} \qquad \text{(Equation 121)}$$

The initial complex coefficient difference, $\Delta_{W,0}$, should be assigned a value equal to zero.

A convergence, the time to find the optimum complex coefficient, is inversely proportional to the coefficient adaptation rate, $\mu_W$. A misadjustment, the estimation noise introduced by the adaptive process, is proportional to the coefficient adaptation rate. Faster convergence results in increased estimation noise.

Momentum is a nonlinear technique applied to improve convergence time, or the effort expended to find the optimum complex coefficient value, with potential implications on stability and misadjustment. Coefficient momentum, $\alpha_W$, is applied to scale the coefficient difference from the previous coefficient iteration, and add the product to the present iteration. Coefficient momentum has a range in [0, 1).

The complex coefficient, $w_{n+1}$, is iteratively adapted relative to the present complex coefficient, $w_n$, by subtracting a scaled gradient estimate, and adding a momentum term, in (Equation 122).

$$w_{n+1} = w_n - \mu_W \nabla_{W,n} + \alpha_W \Delta_{W,n} \qquad \text{(Equation 122)}$$

The initial complex coefficient, $w_0$, should be assigned a value with unity magnitude and zero phase.

The complex reference signal is simply a unit delayed complex incident signal, scaled by a complex coefficient. As the complex incident signal and complex reference signal are normalized to unity magnitude, the complex error is minimized when the complex coefficient rotates the delayed complex incident signal in phase to compensate for the phase difference between sequential samples. The frequency is defined as phase difference with respect to time.

The instantaneous frequency 2404 of the complex primary signal 2402 is encoded in the phase of the complex coefficient. No capability exists to discriminate on the basis of frequency between complex exponential components in the complex primary signal 2402. An aggregate instantaneous frequency estimate is extracted from the complex primary signal 2402, formed from the superposition of components present in the signal.

The frequency 2404, $f_n$, of the complex primary signal 2402 is equal to the normalized phase of the complex coefficient, $\phi_{W,n}$, in (Equation 123).

$$f_n = \varphi_{W,n} = _{TAN}^{-1}\left(\frac{IMAG(w_n)}{REAL(w_n)}\right) \cdot \frac{1}{\pi} + \qquad \text{(Equation 123)}$$
$$0.5 \cdot (1 -_{SIGN}(REAL(w_n))) \cdot _{SIGN}(IMAG(w_n))$$

The normalized phase is extracted by an inverse tangent, $_{TAN}^{-1}$, applied to the ratio of imaginary and real complex coefficient components, scaled by the inverse of $\pi$ to normalize the result, and adjusted to reconcile the quadrant of operation.

The dynamic nature of the complex primary signal 2402 is of principle consideration in defining constant adaptive parameters. The coefficient adaptation rate 412 is bounded by the inverse of the largest eigenvalue of the system. The effect of momentum on stability is difficult to analyze due to its nonlinear nature, and implicit dependence on the coefficient adaptation rate.

5.5 The Phase Locked Loop (PLL)

Figure 25:
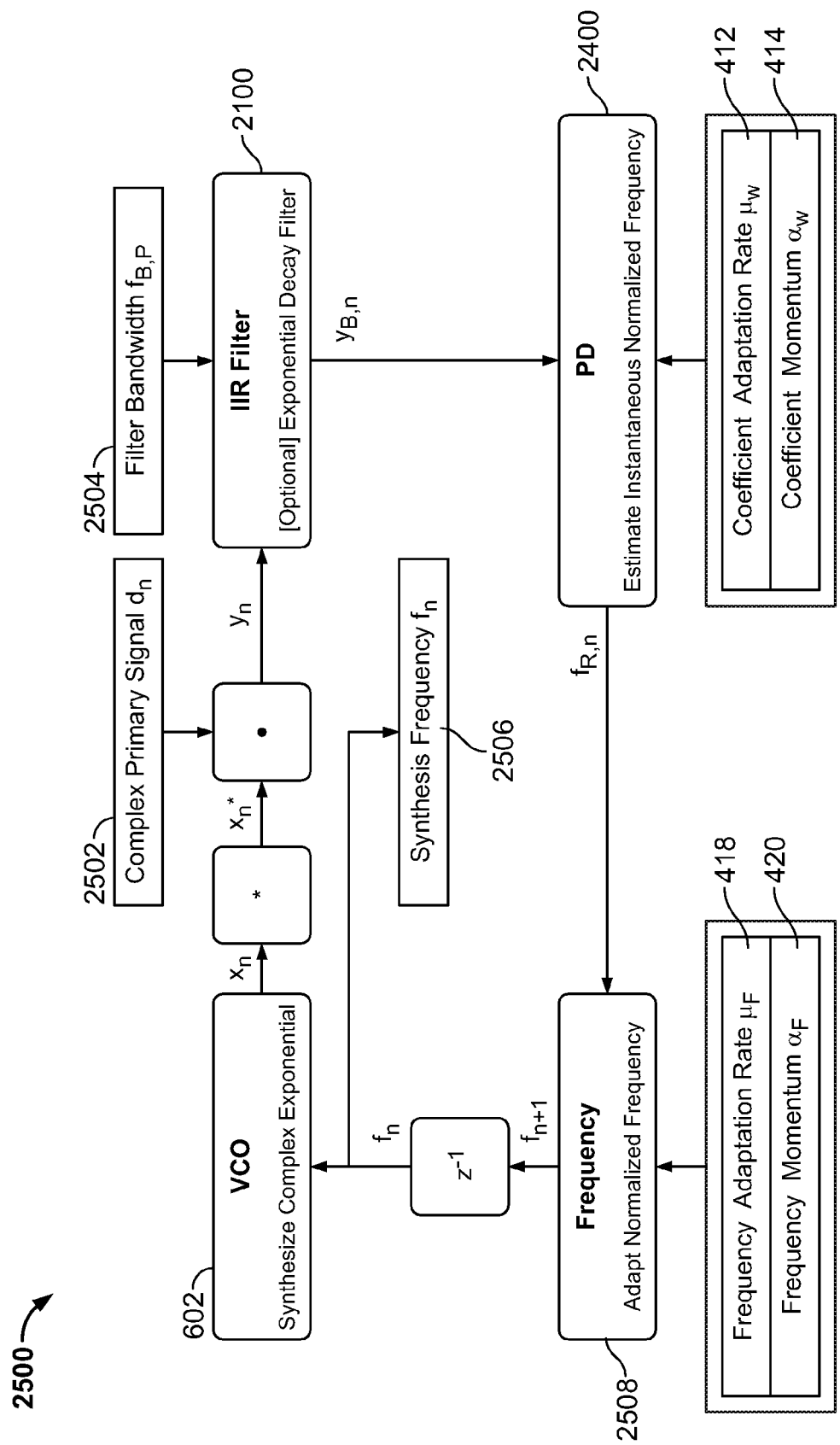
FIG. 25 is a flow chart diagram of an architecture for a Phase Locked Loop (PLL) according to some aspects.

Referring to FIG. 25, a PLL 2500, $_{PLL}$, produces a synthesis frequency estimate 2506 as a function of a complex primary signal 2502, an initial synthesis frequency, a filter bandwidth 2504, a coefficient adaptation rate 412, a coefficient momentum 414, a frequency adaptation rate 418, and a frequency momentum 420, in (Equation 124).

$$\vec{f} = _{PLL}(\vec{d}, f_1, f_{B,P}, \mu_W, \alpha_W, \mu_F, \alpha_F) \qquad \text{(Equation 124)}$$

$\vec{f}$ Synthesis Frequency 2506.
$\vec{d}$ Complex Primary Signal 2502.
$f_1$ Initial Synthesis Frequency.
$f_{B,P}$ Filter Bandwidth 2504. (1.0).
$\mu_W$ Coefficient Adaptation Rate 412. (5.0e−3).
$\alpha_W$ Coefficient Momentum 414. (0).
$\mu_F$ Frequency Adaptation Rate 418. (2.0e−3).
$\alpha_F$ Frequency Momentum 420. (3.5e−1).

The PLL 2500 is a closed loop adaptive filter optimally suited to accurately estimate instantaneous frequency in a dynamic environment with significant in-band interference. Adaptive frequency synthesis and interference rejection support the identification and tracking of a complex exponential component of interest in a complex primary signal.

The PLL 2500 consists of a VCO 602, a mixer, an IIR filter 2100, a PD 2400, and a means of frequency adaptation 2508. A VCO 602 synthesizes a complex exponential signal at an instantaneous frequency of interest. The product of the conjugate of the complex exponential signal and the complex primary signal is band limited with an IIR filter 2100, resulting in a complex baseband signal. The complex baseband is a convenient representation of a complex signal with zero nominal frequency. The residual frequency, or estimation error, of the complex baseband signal is estimated by a PD 2400, and employed in adaptation of the synthesis frequency 2508.

The complex incident signal, $x_n$, is synthesized by the VCO at a dynamic normalized frequency, $f_n$, in (Equation 125).

$$x_n = _{VCO}(f_n) \qquad \text{(Equation 125)}$$

The complex mixed signal, $y_n$, is formed as a product of the conjugate of the carrier signal and the primary signal, in (Equation 126).

$$y_n = x^*_n \cdot d_n \qquad \text{(Equation 126)}$$

Frequency tracking rate is the maximum rate at which the instantaneous frequency of the complex exponential component of interest in the complex primary signal 2502 can change, while the PLL 2500 contiguously tracks the component without a significant increase in estimation error, or residual frequency. If the rate of change of frequency in the component exceeds the tracking rate of the PLL, estimation error will not be reduced to a level sufficient to represent convergence.

The complex baseband signal, $y_{B,n}$, is equal to the complex mixed signal, band limited by application of an IIR filter 2100, in (Equation 127). The IIR filter 2100 reduces interference and improves the frequency estimation accuracy, at the expense of the frequency tracking rate and latency.

$$y_{B,n} = (1 - f_{B,P}) \cdot y_{B,n-1} + f_{B,P} \cdot y_n = _{IIR}(y_n, 1 - f_{B,P}, f_{B,P}) \qquad \text{(Equation 127)}$$

An exponential decay filter is a 1st order IIR filter 2100 with coefficients directly specified from the filter bandwidth 2504, $f_{B,P}$. The effective memory depth is inversely proportional to filter bandwidth 2504. The filter bandwidth 2504 can be increased, in return for significant reduction in the latency and improved frequency tracking rate, at the cost of increased aggregate frequency estimation error.

The filter bandwidth selection is proportional to the expected frequency range of the complex exponential signal of interest in the complex primary signal 2502. As the filter bandwidth 2504 and the tracking rate are inversely proportional, the dynamic nature of the component of interest is considered in assignment of filter bandwidth 2504. Unity bandwidth selection, which can be appropriate in environments with limited interference, effectively excises the IIR filter 2100, eliminating latency contributions by the filter and maximizing frequency tracking rate.

The residual frequency, $f_{R,n}$, of the complex baseband signal is estimated by the PD 2400, in (Equation 128).

$$f_{R,n} = _{PD}(y_{B,n}, \mu_W, \alpha_W) \qquad \text{(Equation 128)}$$

Residual frequency is the error basis for adaptation of the synthesis frequency 2508. PLL convergence is attained, in a stationary environment, when the synthesis frequency is equal to the instantaneous frequency of the complex exponential component of interest in the primary signal 2502, and the residual frequency is approximately zero, neglecting estimation noise introduced by the adaptive process.

A performance surface is a measure of error as a function of coefficient space. The PLL performance surface is constrained to two dimensions, synthesis frequency 2506 and estimation error.

Direct expression and differentiation of the performance surface as a function of synthesis frequency 2506 is indirectly dependent on the adaptive complex coefficient in the PD 2400. It is often convenient to directly express the gradient estimate as a simplified approximation, without formal definition of a differentiable performance surface.

The LMS gradient estimate, $\nabla_{F,n}$, is equal to the partial derivative of the performance surface, with respect to the estimation error, in (Equation 129). Residual frequency provides a convenient and sufficient approximation to the gradient.

$$\nabla_{F,n} = \frac{\partial \zeta_{F,n}}{\partial f} \approx -f_{R,n} \qquad \text{(Equation 129)}$$

The residual frequency difference, $\Delta_{F,n}$, is equal to the difference between sequential residual frequency estimates, in (Equation 130). The complex coefficient difference assignment is forced to zero when the sign of the difference changes, relative to the previous iteration.

$$\Delta_{F,n} = \begin{cases} 0 & \text{SIGN}(f_{R,n} - f_{R,n-1}) \neq \text{SIGN}(\Delta_{F,n-1}) \\ f_{R,n} - f_{R,n-1} & \text{SIGN}(f_{R,n} - f_{R,n-1}) = \text{SIGN}(\Delta_{F,n-1}) \end{cases} \qquad \text{(Equation 130)}$$

The initial residual frequency difference, $\Delta_{F,0}$, should be assigned a value equal to zero.

Convergence, the time to find the optimum synthesis frequency, is inversely proportional to the frequency adaptation rate, $\mu_F$. Misadjustment, the estimation noise introduced by the adaptive process, is proportional to the frequency adaptation rate. Faster convergence results in increased estimation noise.

Momentum is a nonlinear technique applied to improve convergence time, or the effort expended to find the optimum synthesis frequency value, with potential implications on stability and misadjustment. Frequency momentum, $\alpha_F$, is applied to scale the coefficient difference from the previous coefficient iteration, and add the product to the present iteration. Frequency momentum has a range in [0, 1).

The synthesis frequency, $f_{n+1}$, is iteratively adapted relative to the present synthesis frequency, $f_n$, by subtracting a scaled gradient estimate, and adding a momentum term, in (Equation 131).

$$f_{n+1} = f_n - \mu_F \cdot \nabla_{F,n} + \alpha_F \cdot \Delta_{F,n} \quad \text{(Equation 131)}$$

The initial synthesis frequency, $f_0$, should be assigned an application specific value. A priori knowledge of the approximate frequency of a complex exponential signal component of interest in the complex primary signal 2502 can be applied to improve convergence, and to ensure that the appropriate component is successfully locked, or isolated and tracked, by the PLL.

The dynamic nature of the complex primary signal is of principle consideration in defining constant adaptive parameters. The coefficient adaptation rate 412 and the frequency adaptation rate 418 are bounded by the inverse of the largest eigenvalues of their respective systems. The effect of momentum on stability is difficult to analyze due to its nonlinear nature, and implicit dependence on adaptation rate.

To ensure convergence, frequency should change slowly, relative to magnitude and phase estimations implicit in complex coefficient adaptation. Therefore, the frequency adaptation rate 418 can be less than the coefficient adaptation rate 412.

While the present invention has been described with reference to one or more particular embodiments, those skilled in the art will recognize that many changes can be made thereto without departing from the spirit and scope of the present invention. Each of these embodiments and obvious variations thereof is contemplated as falling within the spirit and scope of the claimed invention, which is set forth in the following claims.

What is claimed is:

1. A method of determining a slip estimate associated with an induction motor through analysis of voltage and current signals, the method comprising:
    determining a fundamental frequency from a representation of the voltage signal;
    determining a saliency frequency from a representation of the current signal;
    determining an estimation of a slip quantity according to a slip estimation function that includes the saliency frequency, a saliency order, the fundamental frequency, a quantity of rotor slots, and a quantity of poles of the motor; and
    storing the estimation of the slip quantity.

2. The method of claim 1, further comprising selecting a saliency harmonic associated with the saliency frequency.

3. The method of claim 1, wherein the determining the fundamental frequency includes filtering the representation of the voltage signal to reduce interference outside of a range of frequencies that includes a rated fundamental frequency associated with the motor.

4. A method of determining a slip estimate associated with a motor, the method comprising:
    determining a fundamental frequency from a representation of a voltage signal;
    determining a saliency frequency from a representation of a current signal;
    determining an estimation of a slip quantity according to a slip estimation function that includes the saliency frequency, a saliency order, the fundamental frequency, a quantity of rotor slots, and a quantity of poles of the motor; and
    storing the estimation of the slip quantity,
    wherein the representation of the voltage signal is a complex voltage signal, and wherein the determining the fundamental frequency includes:
    determining a complex incident signal including a complex exponential evaluated at a synthesis frequency related to a rated fundamental frequency associated with the motor;
    determining a complex mixed voltage according to a function that includes multiplying the complex voltage signal by a representation of the complex incident signal;
    determining a complex baseband voltage according to a function that includes filtering the complex mixed voltage;
    determining a residual fundamental frequency according to a function that at least approximates a derivative of a phase of the complex baseband voltage; and
    determining a function that includes the synthesis frequency and the residual fundamental frequency to produce the fundamental frequency.

5. The method of claim 4, wherein the function for determining the residual fundamental frequency includes an operation that at least approximates a representation of a derivative of a phase of the complex baseband voltage.

6. The method of claim 4, wherein the function for determining the residual fundamental frequency is carried out via a complex Phase Locked Loop (PLL) comprising:
    adaptively determining the residual fundamental frequency according to a function that includes the complex baseband voltage, wherein the complex baseband voltage is a complex primary signal of the PLL, and an initial synthesis frequency of the PLL by:
    determining a complex incident signal of the PLL including a complex exponential evaluated at a synthesis frequency of the PLL, according to a complex Voltage Controlled Oscillator (VCO) function;
    determining a complex mixed signal of the PLL according to a function that includes multiplying the complex primary signal of the PLL by the conjugate of the complex incident signal of the PLL;
    determining a complex baseband signal of the PLL according to a function that includes filtering the complex mixed signal of the PLL;
    determining a residual frequency of the PLL according to a function that at least approximates a representation of a derivative of a phase of the complex baseband signal of the PLL;
    modifying the synthesis frequency of the PLL according to a function that includes the synthesis frequency of the PLL and the residual frequency of the PLL; and
    determining a function that includes a representation of the synthesis frequency of the PLL to produce the residual fundamental frequency.

7. The method of claim 6, further comprising adding a representation of the rated fundamental frequency associated with the motor and the residual fundamental frequency to produce the fundamental frequency.

8. The method of claim 4, wherein the function for determining the residual fundamental frequency includes a complex Phase Discriminator (PD).

9. The method of claim 8, wherein the complex PD includes:
    determining a complex incident signal of the PD by normalizing each sample of the complex baseband signal such that the resulting sequence of complex samples of the complex incident signal has the same magnitude, wherein the complex incident signal of the PD retains the phase of the complex baseband signal;

equating a complex reference signal of the PD to the product of a delayed representation of the complex incident signal of the PD and a complex coefficient;

determining a complex error signal of the PD according to a function that includes the difference between the complex incident signal of the PD and the complex reference signal of the PD;

modifying the complex coefficient according to a function that includes the complex coefficient and the complex error signal of the PD, such that the complex error signal of the PD is adaptively minimized as the modified complex coefficient at least approximates a derivative of the complex incident signal of the PD; and defining the residual fundamental frequency according to a function that includes a phase of the complex coefficient.

10. The method of claim 1, further comprising determining an approximate slip according to an approximate slip function.

11. The method of claim 10, wherein the approximate slip function includes:

determining a normalized real input power according to an input power function that includes the representation of the voltage signal, the representation of the current signal, a rated fundamental frequency associated with the motor, and a rated input power associated with the motor;

determining a rated slip associated with the motor according to a function that includes a rated speed associated with the motor and the quantity of poles; and multiplying the normalized real input power and the rated slip associated with the motor.

12. The method of claim 11, wherein the input power function includes:

extracting, from a complex voltage of the representation of the voltage signal, a complex fundamental voltage such that a fundamental frequency component of the complex voltage is retained;

extracting, from a complex current of the representation of the current signal, a complex fundamental current such that a fundamental frequency component of the complex current is retained; and multiplying the complex fundamental voltage with the conjugate of the complex fundamental current.

13. The method of claim 11, further comprising temperature compensating the approximate slip according to a function that includes multiplying the approximate slip by a coefficient that is related to the temperature of the motor.

14. The method of claim 10, wherein the approximate slip function includes extracting an estimate of an eccentricity frequency associated with an eccentricity harmonic, wherein the determining the approximate slip is carried out according to a function that includes the eccentricity frequency, an eccentricity order, and the quantity of poles.

15. The method of claim 1, wherein the representation of the voltage signal is complex, and the representation of the current signal is complex.

16. The method of claim 1, wherein the determining the saliency frequency includes filtering the representation of the current signal to reduce interference outside of a range of frequencies that includes a nominal saliency frequency associated with the motor.

17. The method of claim 16, wherein the nominal saliency frequency is calculated according to a function that includes a rated fundamental frequency associated with the motor, a rated slip associated with the motor, a nominal saliency order, the quantity of rotor slots, and the quantity of poles.

18. A method of determining a slip estimate associated with a motor, the method comprising:

determining a fundamental frequency from a representation of a voltage signal;

determining a saliency frequency from a representation of a current signal;

determining an estimation of a slip quantity according to a slip estimation function that includes the saliency frequency, a saliency order, the fundamental frequency, a quantity of rotor slots, and a quantity of poles of the motor; and storing the estimation of the slip quantity, wherein the representation of the current signal is a complex current signal, and wherein the determining the saliency frequency includes:

determining a complex incident signal including a complex exponential evaluated at a synthesis frequency related to a nominal saliency frequency associated with the motor;

determining a complex mixed current according to a function that includes multiplying the complex current signal by a representation of the complex incident signal;

determining a complex baseband current according to a function that includes filtering the complex mixed current;

determining a residual saliency frequency according to a function that at least approximates a derivative of a phase of the complex baseband current; and determining a function that includes the synthesis frequency and the residual saliency frequency to produce the saliency frequency.

19. The method of claim 18, wherein the function for determining the residual saliency frequency includes an operation that at least approximates a representation of a derivative of a phase of the complex baseband current.

20. The method of claim 18, wherein the filtering the complex mixed current is carried out via a filter having a filter bandwidth that is defined according to a function that includes a rated fundamental frequency associated with the motor, a rated slip associated with the motor, the quantity of rotor slots, and the quantity of poles.

21. The method of claim 18, wherein the function for determining the residual saliency frequency is carried out via a complex Phase Locked Loop (PLL) comprising:

adaptively determining the residual saliency frequency according to a function that includes the complex baseband current, wherein the complex baseband current is a complex primary signal of the PLL, and an initial synthesis frequency of the PLL by:

determining a complex incident signal of the PLL including a complex exponential evaluated at a synthesis frequency of the PLL, according to a complex Voltage Controlled Oscillator (VCO) function, determining a complex mixed signal of the PLL according to a function that includes multiplying the complex primary signal of the PLL by the conjugate of the complex incident signal of the PLL, determining a complex baseband signal of the PLL according to a function that includes filtering the complex mixed signal of the PLL, determining a residual frequency of the PLL according to a function that at least approximates a representation of a derivative of a phase of the complex baseband signal of the PLL, and modifying the synthesis frequency of the PLL according to a function that includes the synthesis frequency of the PLL and the residual frequency of the PLL; and determining a function that includes a representation of the synthesis frequency of the PLL to produce the residual saliency frequency.

22. The method of claim 21, further comprising adding a representation of the nominal saliency frequency and the residual saliency frequency to produce the saliency frequency.

23. The method of claim 21, wherein the saliency order is a nominal saliency order and wherein the initial synthesis frequency of the PLL is defined according to a function that includes the nominal saliency frequency, a rated fundamental frequency associated with the motor, a slip associated with the motor, the nominal saliency order, the quantity of rotor slots, and the quantity of poles.

24. The method of claim 18, wherein the function for determining the residual saliency frequency includes a complex Phase Discriminator (PD).

25. The method of claim 24, wherein the complex PD includes:
   determining a complex incident signal of the PD by normalizing each sample of the complex baseband signal such that the resulting sequence of complex samples of the complex incident signal has the same magnitude, wherein the complex incident signal of the PD retains the phase of the complex baseband signal;
   equating a complex reference signal of the PD to the product of a delayed representation of the complex incident signal of the PD and a complex coefficient;
   determining a complex error signal of the PD according to a function that includes the difference between the complex incident signal of the PD and the complex reference signal of the PD;
   modifying the complex coefficient according to a function that includes the complex coefficient and the complex error signal of the PD, such that the complex error signal of the PD is adaptively minimized as the modified complex coefficient at least approximates a derivative of the complex incident signal of the PD; and
   defining the residual saliency frequency according to a function that includes a phase of the complex coefficient.

* * * * *